United States Patent
Maeda et al.

[11] Patent Number: 5,861,650
[45] Date of Patent: Jan. 19, 1999

[54] SEMICONDUCTOR DEVICE COMPRISING AN FPGA

[75] Inventors: Shigenobu Maeda; Shigeto Maegawa; Yasuo Yamaguchi, all of Hyogo, Japan

[73] Assignee: Mitsubishi Denki Kabushiki Kaisha, Tokyo, Japan

[21] Appl. No.: 857,130

[22] Filed: May 15, 1997

Related U.S. Application Data

[63] Continuation-in-part of Ser. No. 781,389, Jan. 13, 1997, abandoned.

[30] Foreign Application Priority Data

Aug. 9, 1996 [JP] Japan .................................. 8-211511
Jul. 25, 1997 [JP] Japan .................................. 9-040777

[51] Int. Cl.⁶ .............................................. H01L 29/72
[52] U.S. Cl. ......................... 257/315; 257/324; 257/325; 257/326; 257/488; 257/490; 257/630
[58] Field of Search .......................... 257/315, 324–326, 257/488, 490, 630

[56] References Cited

U.S. PATENT DOCUMENTS

| | | | |
|---|---|---|---|
| 5,005,066 | 4/1991 | Chen | 257/315 |
| 5,164,803 | 11/1992 | Ozaki et al. | 257/630 |
| 5,270,559 | 12/1993 | Yariv et al. | 257/315 |
| 5,290,723 | 3/1994 | Tani et al. | 257/315 |
| 5,591,999 | 1/1997 | Momodomi et al. | 257/315 |
| 5,672,892 | 9/1997 | Ogura et al. | 257/315 |
| 5,686,746 | 11/1997 | Iwasa | 257/630 |
| 5,687,118 | 11/1997 | Chang | 257/315 |

FOREIGN PATENT DOCUMENTS

| | | | |
|---|---|---|---|
| 4-280673 | 10/1992 | Japan | H01L 27/115 |
| 5-259272 | 10/1993 | Japan | H01L 21/76 |
| 7-202034 | 8/1995 | Japan | H01L 21/247 |

*Primary Examiner*—Edward Wojciechowicz
*Attorney, Agent, or Firm*—McDermott, Will & Emery

[57] ABSTRACT

The semiconductor device includes a silicon substrate, field effect transistors, a flash memory and a separating portion. A plurality of field effect transistors are formed on semiconductor substrate. A flash memory is formed on semiconductor substrate. Separating portion includes a separation electrode. Separating portion electrically separates the plurality of field effect transistors from each other. Separating portion is formed insulated on silicon substrate. Flash memory includes a floating gate electrode and a control gate electrode. Floating gate electrode is formed insulated on silicon substrate. Control gate electrode is formed insulated on floating gate electrode. Separation electrode and floating gate electrode have approximately the same thickness.

12 Claims, 44 Drawing Sheets

$T_{Flash} < T_{FS}$ $T_{Flash} < T_{FG-CG} < T_{FS-GA}$

5,861,650

SEMICONDUCTOR DEVICE COMPRISING AN FPGA

This application is a continuation in part of Application Ser. No. 08/781,389 filed Jan. 13, 1997 now abandoned.

BACKGROUND OF THE INVENTION

1. Field of the Invention

The present invention relates to a semiconductor device and a manufacturing method thereof. More specifically, the present invention relates to a semiconductor device which allows re-configuration of circuits freely by exchanging a program, and manufacturing method thereof.

2. Description of the Background Art

Recently, a semiconductor device called an FPGA (Field Programmable Gate Array) has been spread rapidly, which includes a gate array portion and a memory cell portion and allows re-configuration of circuitry freely by changing a program.

As a method for separating transistors in the gate array portion of the semiconductor device such as FPGA, use of an LOCOS (Local Oxidation of Silicon) oxide film is a first option.

FIG. 70 is a cross section showing a transistor separated by the conventional LOCOS oxide film. Referring to FIG. 70, an LOCOS oxide film 1002 is formed on a silicon substrate 1001. A gate electrode 1080 of polycrystalline silicon is formed on silicon substrate 1001 with a gate oxide film 1007 interposed. An interlayer insulating film 1004 is formed to cover silicon substrate 1001, LOCOS oxide film 1002 and gate electrode 1080. LOCOS oxide film 1002 electrically separates an impurity regions positioned on the front side from an impurity region position on the back side with respect to the sheet.

FIG. 71 is an enlarged cross section of the portion surrounded by a circle A in FIG. 70. Referring to FIG. 71, LOCOS oxide film 1002 expands in the step of oxidation. At this time, there is generated a strain in silicon substrate 1001, resulting in a crystal defect near an interface between LOCOS oxide film 1002 and silicon substrate 1001.

The crystal defect may be a cause of leak current generated in a depletion layer formed below the gate electrode 1080 when the transistor is in operation. This increases power consumption and causes malfunction of the transistor.

A method using an electrode for separation, that is, a so-called FS (Field Shield) separation method is a method of separation free of the above described problem. FIG. 72 is a cross section showing transistors separated by using electrodes for separation. Referring to FIG. 72, electrodes 1040 for separation are formed on silicon substrate 1001 with an oxide film 1003 interposed. On silicon substrate 1001, a gate electrode 1080 is formed with gate oxide film 1007 interposed. An interlayer insulating film 1004 is formed to cover separation electrode 1040, silicon substrate 1001 and gate electrode 1080. By applying a prescribed voltage to separation electrode 1040, the potential of silicon substrate 1001 below separation electrode 1040 is fixed, so that the impurity region positioned in front is electrically separated from the impurity region positioned in the back direction of the sheet, whereby the transistors are separated. The voltage applied to separation electrode 1040 is 0V in an NMOS (Negative Metal Oxide Semiconductor) transistor, and it is Vcc (power supply voltage) in a PMOS (Positive Metal Oxide Semiconductor).

In the method of separation using such a separation electrode, the substrate experiences less strain as compared with separation by the LOCOS oxide film. As a result, a semiconductor device with smaller leak current can be obtained. Here, in the memory cell portion of the FPGA described above, an SRAM (Static Random Access Memory), an anti-fuse, a flash memory or the like is used. Especially in an FPGA using a non-volatile memory cell transistor such as a flash memory in the memory cell portion, it is possible to rewrite the stored contents a number of times, and further, FPGA consumes less power and the stored content is retained even when power is turned off. Therefore, such an FPGA is considered promising.

However, in a semiconductor device in which the gate array portion is separated by the separating portion using a separation electrode and in which a non-volatile memory cell transistor is used in the memory cell portion, it is necessary to form the gate electrode in the gate array portion, the separation electrode for the separating portion, and the floating gate electrode and the control gate electrode in the memory cell portion, which requires complicated steps of manufacture.

Further, high speed operation is required of a transistor in the gate array portion, and therefore the threshold value must be kept low. Meanwhile, for the non-volatile memory cell transistors in the memory cell portion and for the separating portion, the threshold value must be kept high in order to reduce leak current. Especially in the separating portion, when there is generated a leak current and it is conducted to the ON state, the gate array malfunctions. Therefore, the threshold value must be kept especially high. However, such problems have not been addressed in the conventional semiconductor devices.

SUMMARY OF THE INVENTION

An object of the present invention is to provide a semiconductor device which includes a plurality of field effect transistors separated by a separation electrode and a non-volatile memory cell transistor which can be manufactured through simple steps.

Another object of the present invention is to provide a semiconductor device including field effect transistors separated by a separation electrode and constituting a gate array, and a non-volatile memory cell transistor, which can be manufactured through simple steps.

A still further object of the present invention is to provide a semiconductor device including a plurality of field effect transistors separated by a separation electrode and a non-volatile memory cell transistor, which can be manufactured through simple steps, and which allows easy writing and erasure of the non-volatile memory cell transistor.

A still further object of the present invention is to provide a semiconductor device which includes field effect transistors separated by a separation electrode and non-volatile memory cell transistors separated by another separation electrode, which can be manufactured through simple steps.

A still further object of the present invention is to provide a semiconductor device in which threshold value for a non-volatile memory cell transistor is higher than that for a field effect transistor and the threshold value at a separating portion is not lower than the threshold value for the non-volatile memory cell transistor, that is, a semiconductor device which includes a non-volatile memory cell transistor, and field effect transistors capable of high speed operation and surely separated at the separating portion.

A still further object of the present invention is to provide a semiconductor device including field effect transistors separated by a separation electrode and capable of high speed operation, and a non-volatile memory cell transistor operable at a low voltage with small leakage of charges from the floating gate electrode.

A still further object of the present invention is to provide a semiconductor device in which a field effect transistor is surely electrically separated from a non-volatile memory cell transistor.

A still further object of the present invention is to provide a semiconductor device in which a floating gate electrode of a non-volatile memory cell transistor has the same gate length as the gate length of a control gate electrode.

The semiconductor device in accordance with the present invention includes a semiconductor substrate, field effect transistors, a non-volatile memory cell transistor and a first separating portion. The plurality of field effect transistors are formed on the semiconductor substrate. The non-volatile memory cell transistor is formed on the semiconductor substrate. The first separating portion includes a first separation electrode formed insulated on the semiconductor substrate. The first separating portion electrically separates the plurality of field effect transistors from each other. The non-volatile memory cell transistor includes a floating gate electrode and a control gate electrode. The floating gate electrode is formed insulated on the semiconductor substrate. The control gate electrode is formed insulated on the floating gate electrode. The first separation electrode has a thickness approximately the same as that of the floating gate electrode.

In the semiconductor device of the present invention structured as described above, the first separation electrode and the floating gate electrode have approximately the same thickness, and hence the first separation electrode and the floating gate electrode can be formed through the same steps. Accordingly, a semiconductor device having a plurality of field effect transistors separated by the first separation electrode and a non-volatile memory cell transistor can be obtained through simple process steps.

Preferable implementations of the present invention includes the following examples (1) to (9).

(1) The plurality of field effect transistors include a plurality of gate electrodes and a plurality of impurity regions. The plurality of gate electrodes are arranged spaced by a distance from each other along one direction, and formed insulated on the semiconductor substrate. The impurity regions are formed in the semiconductor substrate between the plurality of gate electrodes. The gate electrodes are formed insulated on the first separation electrode. The first separation electrode extends adjacent to the impurity regions along the direction of arrangement of the plurality of gate electrodes.

In such an example, since the plurality of field effect transistors include a plurality of gate electrodes and the plurality of impurity regions, a gate array is provided. Accordingly, a semiconductor device including field effect transistors separated by the separation electrode and constituting a gate array, and a non-volatile memory cell transistor can be obtained through simple manufacturing steps.

(2) The field effect transistor includes a gate electrode and a first sidewall insulating film formed on a sidewall of the gate electrode. The non-volatile memory cell transistor includes a control gate electrode, and a second sidewall insulating film formed on a sidewall of the floating gate electrode. The second sidewall insulating film is smaller in width than the first sidewall insulating film.

In such an example, since the second sidewall insulating film formed on the sidewall of the floating gate is narrow, when impurity ions are introduced to the semiconductor substrate using the second sidewall insulating film as a mask, an impurity region can be formed close to the floating gate electrode. Therefore, the distance between the floating gate electrode and the impurity region can be made small. This means that an avalanche breakdown at an end portion of the impurity region is more likely. As a result, a semiconductor device including a field effect transistor and a non-volatile memory cell transistor in which writing and erasure of the non-volatile memory cell transistor is easy can be obtained through simple manufacturing steps.

(3) In another preferred example, the control gate electrode and the floating gate electrode have the same gate length.

(4) There are a plurality of non-volatile memory cell transistors. The semiconductor device further includes a second separating portion formed insulated on the semiconductor substrate. The second separating portion electrically separates the plurality of non-volatile memory cell transistors from each other. The second separating portion includes a second separation electrode. The second separation electrode has approximately the same thickness as the first separation electrode.

In the example structured as described above, the plurality of non-volatile memory cell transistors can be surely separated by the second separating portion. Since the second separation electrode has approximately the same thickness as the first separation electrode, the first separation electrode, the second separation electrode and the floating gate electrode come to have approximately the same thickness. Therefore, the first and second separation electrodes and the floating gate electrode can be formed through the same steps. Accordingly, a semiconductor device including a plurality of field effect transistors separated by the first separation electrode and a plurality of non-volatile memory cell transistors separated by the second separation electrode can be obtained through simple manufacturing steps.

Preferably, the floating gate electrode has a ring-shape.

(5) The semiconductor device further includes first, second, and third impurity regions. The first impurity region is formed at a portion of the semiconductor substrate which opposes to the gate electrode of the field effect transistor, and has a first impurity concentration. The second impurity region is formed at a portion of the semiconductor substrate which opposes to the first separation electrode, and has a second impurity concentration. The third impurity region is formed at a portion of the semiconductor substrate which opposes to the floating gate electrode, and has a third impurity concentration. The third impurity concentration is higher than the first impurity concentration. The second impurity concentration is not lower than the third impurity concentration.

In such an example, since the third impurity concentration is higher than the first impurity concentration, the threshold voltage of the non-volatile memory cell transistor positioned on the third impurity region is higher than the threshold value of the field effect transistor positioned on the first impurity region. Further, since the second impurity concentration is not lower than the third impurity concentration, the threshold value of the separating portion positioned on the second impurity region is higher than the threshold value of the non-volatile memory cell transistor positioned on the third impurity region. Therefore, a semiconductor device can be obtained which includes a field effect transistor capable of high speed operation and surely separated from the non-volatile memory cell transistor by the separation electrode.

More preferably, the semiconductor device further includes a separating oxide film. The separating oxide film is formed on the semiconductor substrate. Below the separating oxide film, a fourth impurity region having a fourth impurity concentration is formed. The second, third and fourth impurity concentrations are the same.

In such an example, the fourth impurity region below the separating oxide film serves as a channel stopper, and hence separation by the separating oxide film is ensured. Further, since the second, third and fourth impurity concentrations are the same, the second, third and fourth impurity regions can be formed through the same steps and hence the semiconductor device can be provided through smaller number of manufacturing steps.

(6) The floating gate electrode is formed on the semiconductor substrate with a first insulating film interposed. The field effect transistor includes a second insulating film and a gate electrode. The first separating portion includes a third insulating film. The gate electrode is formed on the semiconductor substrate with a second insulating film interposed. The first separation electrode is formed on the semiconductor substrate with a third insulating film interposed. The first insulating film is thicker than the second insulating film. The third insulating film has a thickness not smaller than the thickness of the first insulating film.

In the example structured as described above, the first insulating film is thicker than the second insulating film, and hence the threshold value of the non-volatile memory cell transistor positioned on the first insulating film is higher than that of the field effect transistor positioned on the second insulating film. In other words, the threshold value of the field effect transistor is lower than that of the non-volatile memory cell transistor. Further, since the third insulating film is not thinner than the first insulating film, the threshold value of the first separating portion positioned on the third insulating film is higher than the threshold value of the non-volatile memory cell transistor positioned on the first insulating film. Therefore, a semiconductor device can be obtained which includes a field effect transistor capable of high speed operation and surely separated at the separating portion, and a non-volatile memory cell transistor.

(7) The first separation electrode and that portion of the semiconductor substrate which opposes to the first separation electrode have the same conductivity type, while the floating gate electrode and that portion of the semiconductor substrate which opposes to the floating gate electrode have different conductivity type.

In such an example, the potential for inverting the conductivity type of the portion of the semiconductor substrate opposing to the first separation electrode becomes higher. Therefore, the threshold value of the first separating portion becomes higher than that of the non-volatile memory cell transistor having the floating gate electrode. Therefore, a semiconductor device including field effect transistors surely separated electrically by the separation electrode and the non-volatile memory cell transistor can be manufactured through simple steps.

(8) The non-volatile memory cell transistor includes first and second insulating films. The field effect transistor includes a gate electrode. The field effect transistor includes a third insulating film formed on a first separating electrode. The floating gate electrode is formed on the semiconductor substrate with the first insulating film interposed. The control gate electrode is formed on the floating gate electrode with the second insulating film interposed. A portion of the gate electrode is formed on the first separating electrode with the third insulating film interposed. The second insulating film is thicker than the first insulating film. The third insulating film is thicker than the first insulating film.

In such an example, the third insulating film positioned between the first separating electrode and the gate electrode is thick, and hence capacitance between the gate electrode and the first separating electrode becomes smaller. This facilitates current flow to the gate electrode, enabling high speed operation of the field effect transistor. Further, since the second insulating film between the control gate electrode and the floating gate electrode is thick, charges stored in the floating gate electrode do not escape to the control gate electrode. As a result, malfunction of the non-volatile memory cell transistor can be suppressed. Further, since the first insulating film below the floating gate electrode is thin, field effect transistor can operate at a high speed.

(9) Further, the semiconductor device includes first and second semiconductor layers formed insulated on the semiconductor substrate. The field effect transistor is formed on the first semiconductor layer. The non-volatile transistor is formed on the second semiconductor layer. The first and second semiconductor layers are electrically separated.

In such an example, since the first semiconductor layer on which the field effect transistor is formed is electrically separated from the second semiconductor layer on which the non-volatile memory cell transistor is formed, a semiconductor device can be provided in which the field effect transistor and the non-volatile memory cell transistor are surely separated electrically.

According to the present invention, the method of manufacturing a semiconductor device including a non-volatile memory cell transistor and a plurality of field effect transistor includes the following steps ① to ③:

① forming simultaneously a floating gate electrode and a separation electrode insulated on a semiconductor substrate;

② forming a plurality of field effect transistors on the semiconductor substrate to be electrically separated from each other by the separation electrode; and ③ forming the non-volatile memory cell transistor by providing a control gate electrode insulated on a floating gate electrode.

In the method of manufacturing a semiconductor device including the above-described steps, the separation electrode and the floating gate electrode are formed simultaneously in the step ①. Then, field effect transistors separated by the separation electrode and a non-volatile memory cell transistor including a floating gate electrode are formed. Therefore, a semiconductor device including field effect transistors separated by the separation electrode and a non-volatile memory cell transistor can be manufactured through simple manufacturing steps.

Preferable implementations of the present invention includes the following examples (1) to (3).

(1) The step ③ of forming the control gate electrode includes the steps of forming a control gate electrode of a prescribed gate length on the floating gate electrode, and etching the floating gate electrode using the control gate electrode as a mask, so as to form the floating gate electrode having the same gate length as the control gate electrode.

In such an example, the floating gate electrode is formed using the control gate electrode as a mask. Therefore, a semiconductor device in which the control gate electrode and the floating gate electrode have the same gate length can be manufactured through simple steps.

(2) The step ①, that is, the step of forming the separation electrode and the floating gate electrode simultaneously, preferably includes the step of forming a first separation electrode for electrically separating the plurality of field effect transistors from each other, and a second separation electrode for electrically separating a plurality of non-volatile memory cell transistors from each other.

In such an example, the second separation electrode for electrically separating the non-volatile memory cell transistors from each other is formed simultaneously with the first separation electrode and the floating gate electrode. Therefore, a semiconductor device including field effect transistors separated by the first separation electrode and the non-volatile memory cell transistors separated by the second separation electrode can be formed through simple manufacturing steps.

(3) The method of manufacturing the semiconductor device further includes the steps of forming a first impurity region by introducing a first impurity ions at a portion of the semiconductor substrate opposing to the gate electrode; forming a second impurity region by introducing a second impurity ions with higher doses than the first impurity ions at a portion of the semiconductor substrate opposing to the floating gate electrode; and forming a third impurity region by introducing a third impurity ions with a dosage not smaller than the dosage of the second impurity ions at a portion of the semiconductor substrate opposing to the separation electrode.

In such an example, the impurity concentration of the second impurity region positioned below the floating gate is higher than the impurity concentration of the first impurity region positioned below the gate electrode. Therefore, the threshold value of the non-volatile memory cell transistor including the floating gate electrode is higher than that of the field effect transistor including a gate electrode. In other words, the threshold value of the field effect transistor is smaller than that of the non-volatile memory cell transistor. Further, the impurity concentration of the third impurity region positioned below the separation electrode is higher than the impurity concentration of the second impurity region positioned below the non-volatile memory cell transistor. Therefore, threshold value of the separation electrode is higher than that of the non-volatile memory cell transistor. Accordingly, a semiconductor device including field effect transistors capable of high speed operation and surely separated by the separation electrode and a non-volatile transistor can be manufactured.

Preferably, the steps of forming the second impurity region and of forming the third impurity region are performed simultaneously.

In such an example, the number of steps of manufacturing the semiconductor device can further be reduced.

More preferably, the method of manufacturing the semiconductor device further includes the step of forming a separating oxide film on the semiconductor substrate, and the step of forming the second and third impurity regions simultaneously includes the step of forming a fourth impurity region below the separating oxide film.

In such an example, the fourth impurity region below the separating oxide film serves as a channel stopper. Therefore, a semiconductor device which has separating oxide film with superior separating capability can be obtained. Further, since the fourth impurity region is formed simultaneously with the second and third impurity regions, the number of steps for manufacturing the semiconductor device is not increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
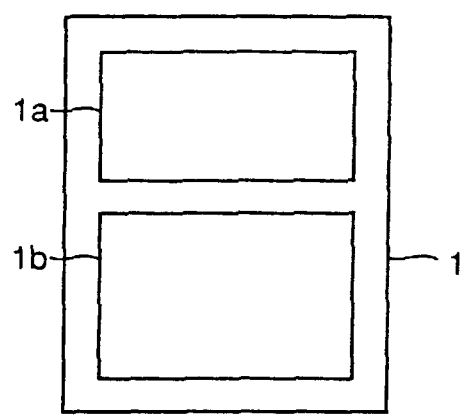
FIGS. 1A and 1B are plan view showing a semiconductor device and a gate array portion thereof in accordance with a first embodiment of the present invention.

Referring to FIGS. 1 to 5, a gate array portion 1a and a memory cell array portion 1b are formed on a silicon substrate 1. In gate array portion 1a, a p well 88 and an n well 87 are formed. A LOCOS oxide film 2 is formed to separate p well 88 from n well 87. At the surface of silicon substrate 1, a $p^+$ electrode 12a is formed in p well 88. The $p^+$ electrode 12a contains a p type impurity to a high concentration. On p well 88 of silicon substrate 1, a plurality of field effect transistors 89 are formed. Transistor 89 includes an n type gate electrode 80a having the thickness of 100 nm and impurity regions 10a and 11a as the source/drain regions. Gate electrode 80a is formed on silicon substrate 1 with a gate oxide film 7 and an oxide film 60a interposed. A separating portion 49 including a separation electrode 40a of n type having the thickness of 100 nm is formed so as to separate impurity region 10a from impurity region 11a. Transistors 89 are separated from each other by separating portion 49. Separation electrode 40a is formed in p well 88 of silicon substrate 1 with an oxide film 3a interposed. Separation electrode 40a is covered by oxide films 60a and 61a.

A plurality of transistors 27 are formed on n well 87. Transistor 27 has a p type gate electrode 28a having the thickness of 100 nm, and impurity regions 25a and 26a as the source/drain regions. Gate electrode 28a is formed on n well 87 with a gate oxide film interposed. Impurity regions 25a and 26a are separated from each other by a separating portion including a separation electrode 29a. Between LOCOS oxide film 2 and separation electrode 29a, an $n^+$ electrode 19a us formed. The $n^+$ electrode 19a contains an n type impurity of a high concentration. The $n^+$ electrode 19a is electrically connected to gate electrode 28a. When transistor 27 is in operation, $n^+$ electrode 19a is set to the ground potential and $p^+$ electrode 12a is set to the power supply potential. The $p^+$ electrode 12a is electrically connected to gate electrode 80a. An oxide film 90a is formed on the sidewall of gate electrode 80a.

Figure 5A:
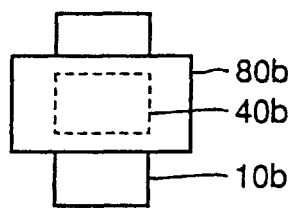
FIGS. 5A to 5D are plan view showing, in enlargement, a portion surrounded by a circle V of FIG. 2.
Figure 5B:
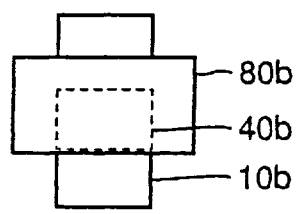
Figure 5C:
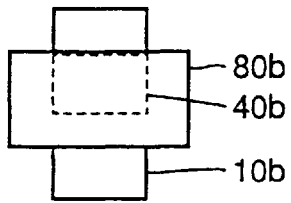
Figure 5D:
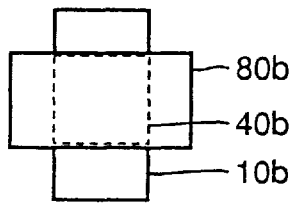

At the memory cell portion 1b of silicon substrate 1, a flash memory 99 is formed. Flash memory 99 includes an n type control gate electrode 80b, an n type floating gate electrode 40b having the thickness of 100 n, and impurity regions 10b and 11b as the source/drain regions. As shown in FIG. 5A, upper and lower ends of floating gate electrode 40b may be positioned below control gate 80b, and floating gate electrode 40b and control gate electrode 80b may be formed with the central axis thereof aligned. Alternatively, as shown in FIG. 5B, the lower end of floating gate electrode 40b may be aligned with the lower end of control gate electrode 80b, and the upper end of floating gate electrode 40b may be positioned below control gate electrode 80b. Alternatively, as shown in FIG. 5C, the upper end of floating gate 40b may be aligned with the upper end of control gate electrode 80b, and the lower end of floating gate electrode 40b may be positioned below control gate electrode 80b. Further, as shown in FIG. 5D, upper and lower ends of floating gate electrode 40b may be aligned with the upper and lower ends of control gate electrode 80b. Floating gate electrode 40b is formed on silicon substrate 1 with an oxide film 3b interposed. Control gate electrode 80b is formed on floating gate electrode 40b with an oxide film 60b interposed. On the sidewalls of control gate electrode 80b and floating gate electrode 40b, an oxide film 90b is formed.

An interlayer insulating film 14 is formed to cover the silicon substrate 1 entirely. On interlayer insulating film 14, an aluminum interconnection 16 is formed. Aluminum interconnection 16 is electrically connected to $p^+$ electrode 12a, impurity region 11b, separation electrodes 40a, gate electrodes 80a, 28a and $n^+$ electrode 19a, through contact plugs 15.

Referring to FIGS. 6 to 17, the method of manufacturing the semiconductor device shown in FIGS. 1 to 5 will be described.

Figure 1B:
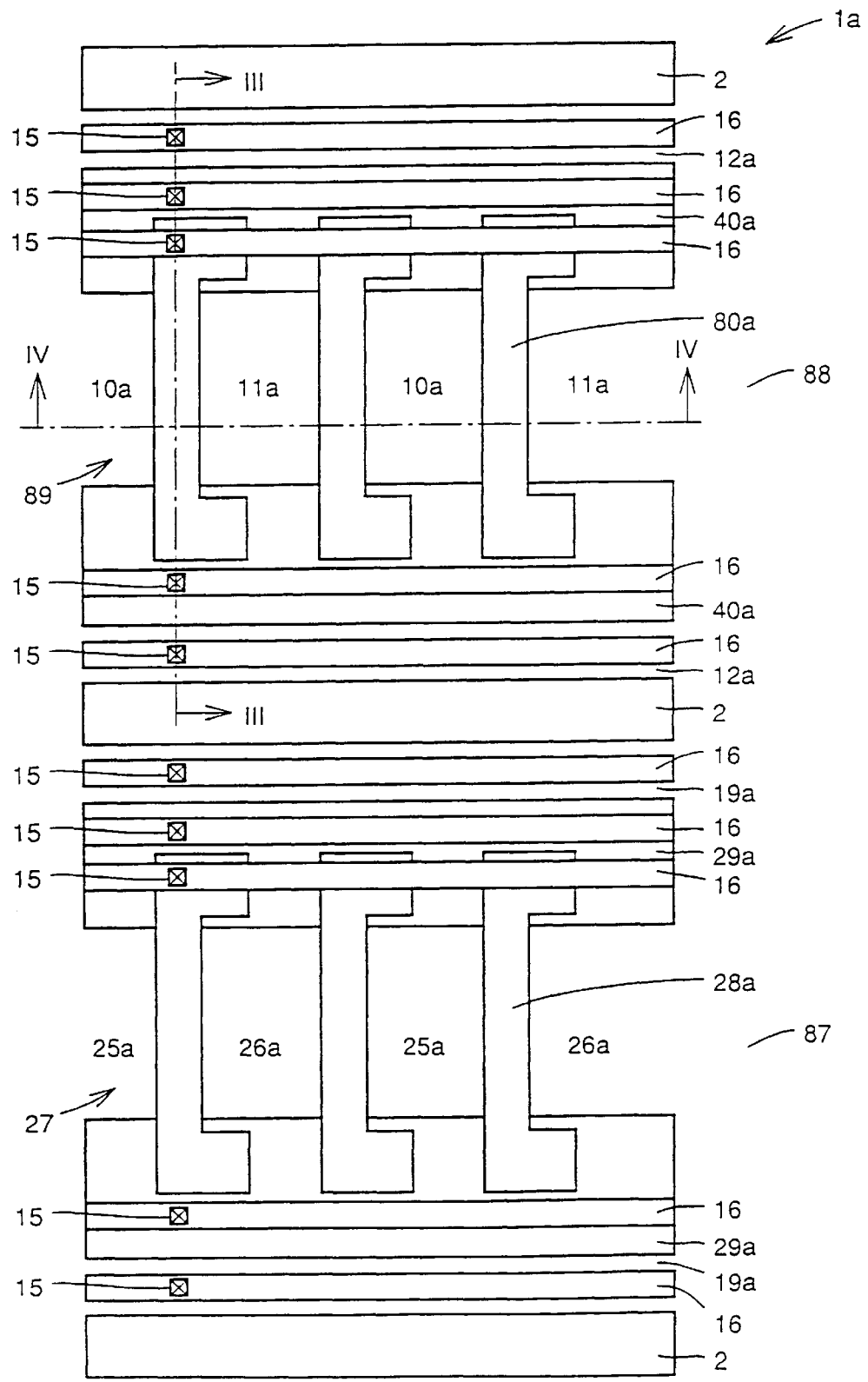
Figure 2A:
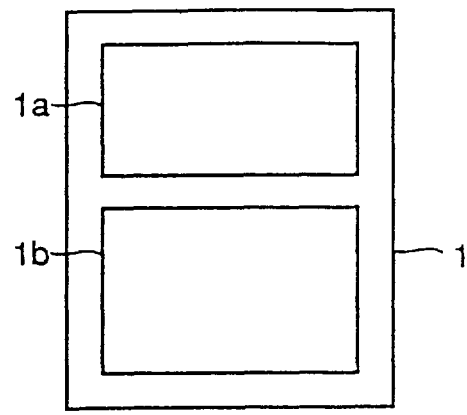
FIGS. 2A and 2B are plan view showing a semiconductor device and a memory cell array portion thereof in accordance with the first embodiment of the present invention.
Figure 2B:
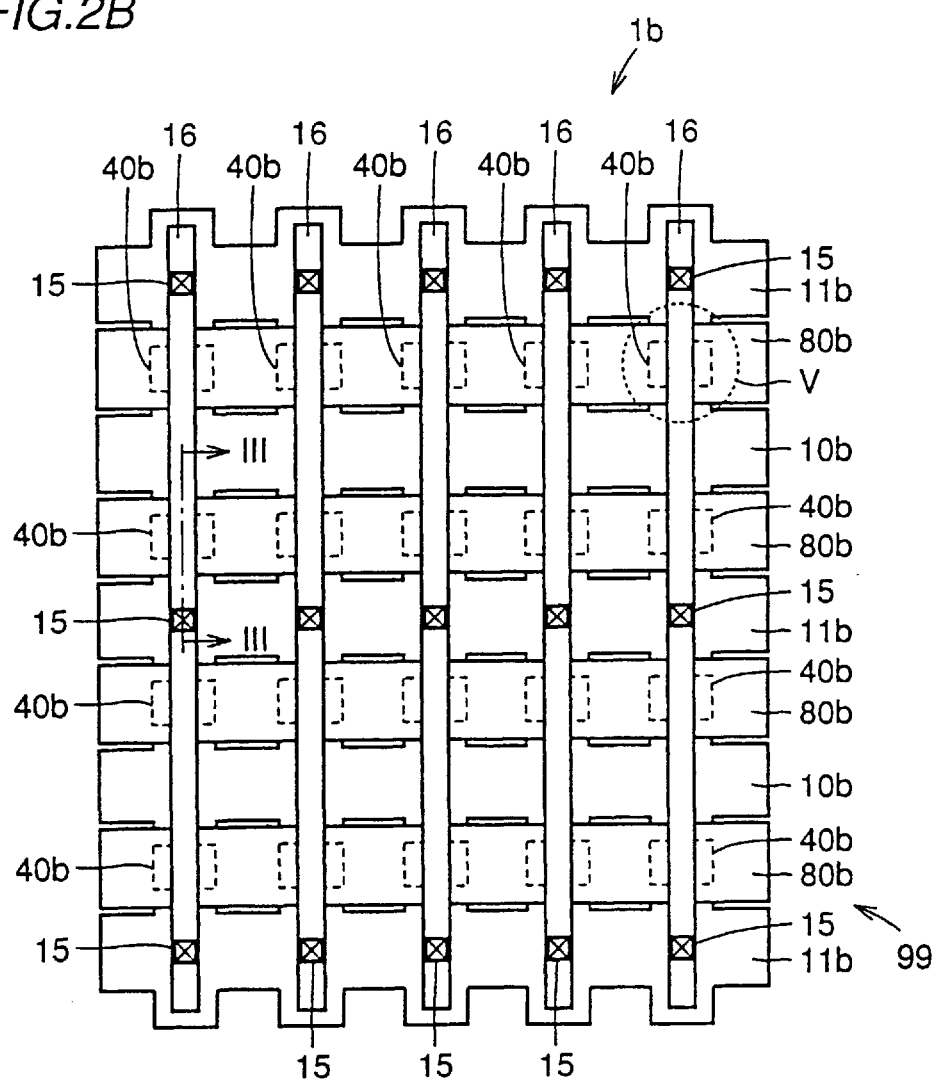
Figure 6:
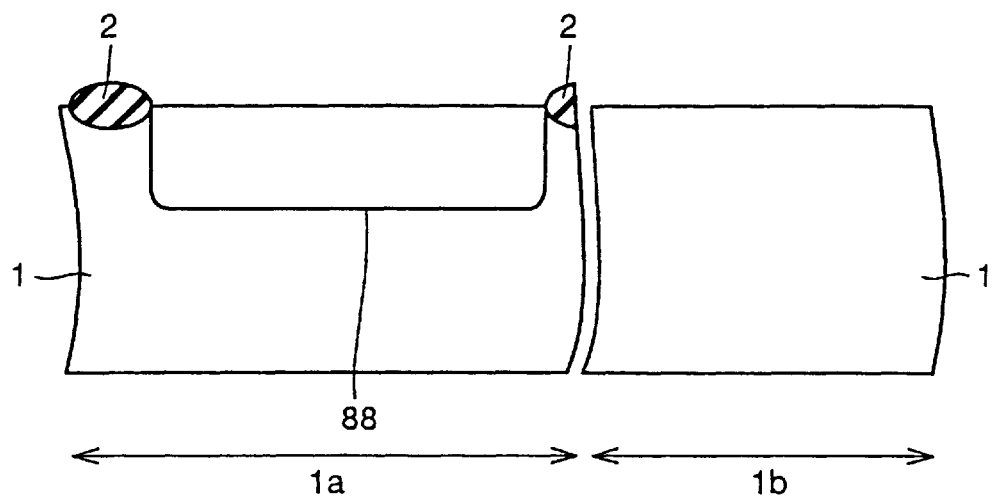
FIGS. 6 to 17 are cross sections showing, in this order, the steps of manufacturing the semiconductor device shown in FIG. 3.

Referring to FIG. 6, on the surface of a p type silicon substrate 1 having specific resistance of 10Ω.cm, an LOCOS oxide film 2 of a silicon oxide film having the thickness of 400 nm is formed by the LOCOS method. Boron is selectively ion-implanted to silicon substrate 1 with implantation energy of 200 to 500 KeV with the dosage of $1\times10^{13}/cm^2$, so that a p well 88 is formed at the surface of silicon substrate 1. The distance from the surface of silicon substrate 1 to the bottom of p well 88 is about 500 to about 1000 nm. By selectively ion-implanting phosphorus to the silicon substrate 1 with implantation energy of 400 to 900 KeV and dosage of $1\times10^{13}/cm^2$, an n well 87 shown in FIG. 1B is formed at the surface of silicon substrate 1. The distance from the surface of silicon substrate 1 to the bottom of n well 87 is about 500 to about 1000 nm.

Figure 7:
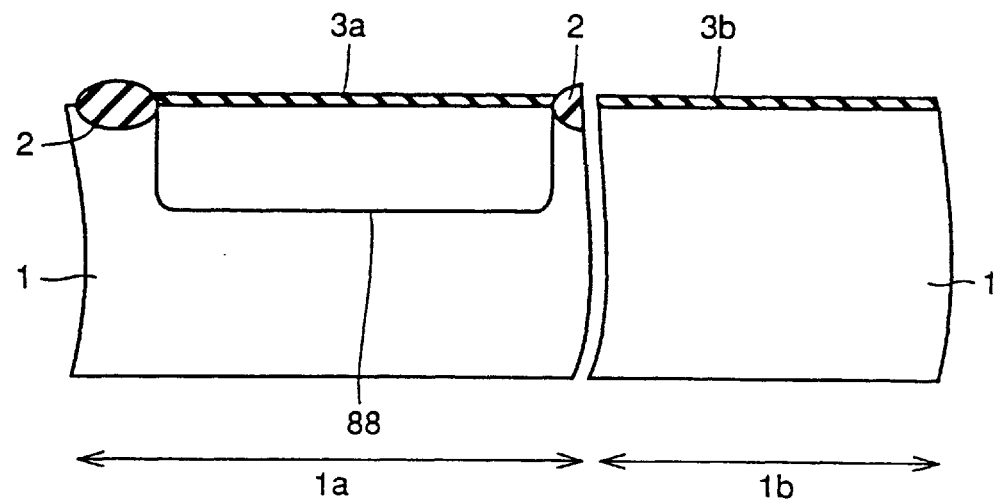

Referring to FIG. 7, oxide films 3a, and 3b of a TEOS (Tetraethyl Orthosilicate) oxide film having the thickness of about 10 nm are formed on the surface of silicon substrate 1.

Figure 8:
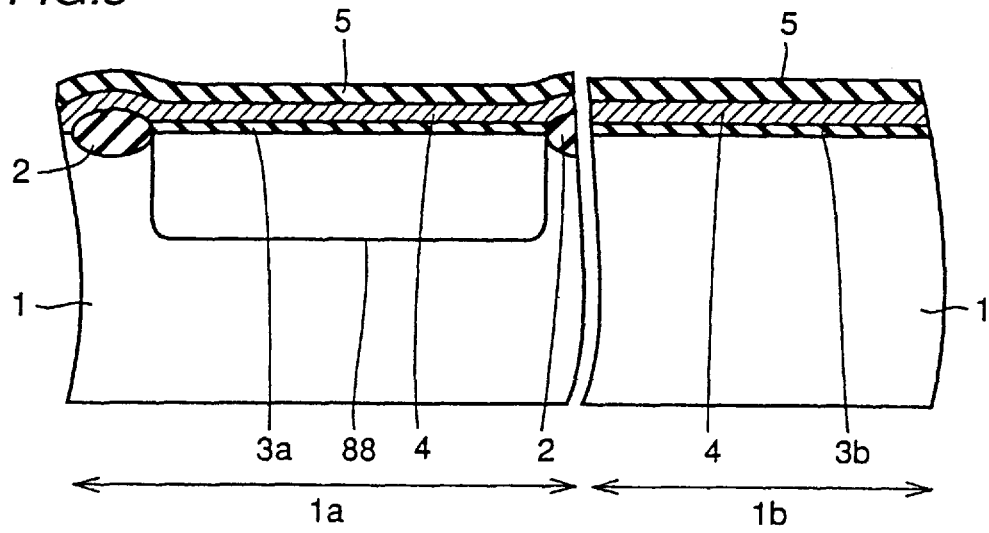

Referring to FIG. 8, polycrystalline silicon 4 having the thickness of 100 nm is formed on oxide films 3a and 3b. Ions of phosphorus are implanted to polycrystalline silicon 4 on memory cell region 1b and p well 88. Boron ions are implanted to polysilicon 4 on n well 87. An oxide film 5 is formed by depositing a TEOS oxide film to the thickness of 100 nm, by the CVD method, on polycrystalline silicon 4. Amorphous silicon can be used instead of polycrystalline silicon 4. The amorphous silicon film will be crystallized in the process hereinafter.

Figure 9:
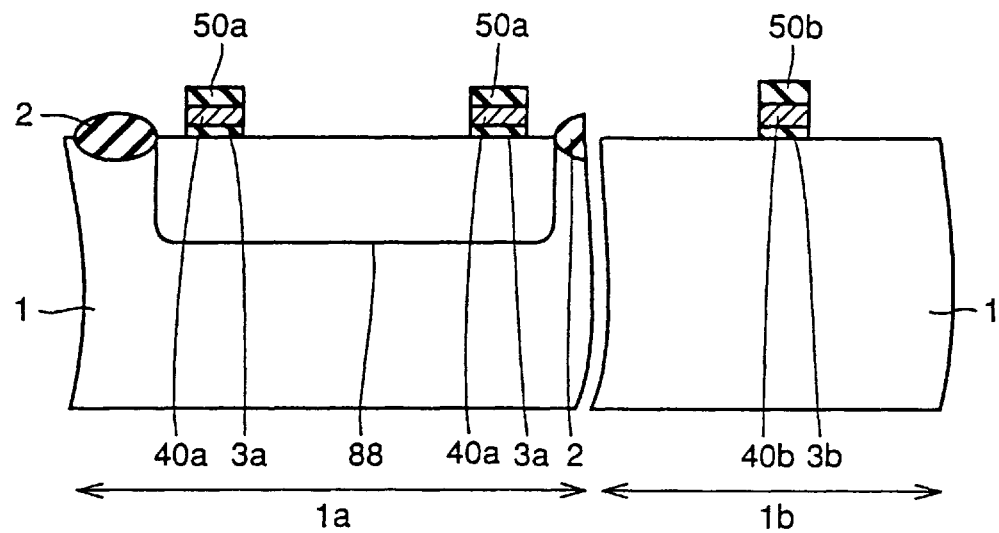

Referring to FIG. 9, oxide films 3a, 3b and 5, as well as polycrystalline silicon 4 are selectively etched, whereby in gate array portion 1a, an oxide film 3a, an n type separation electrode 40a having the thickness of 100 nm and an interlayer oxide film 50a are formed, and in the memory cell portion 1b, an oxide film 3b, an n type floating gate electrode 40b having the thickness of 100 nm, and an interlayer oxide film 50b are formed. In gate array portion 1a, a p type separation electrode 29a shown in FIG. 1 is also formed.

Figure 10:
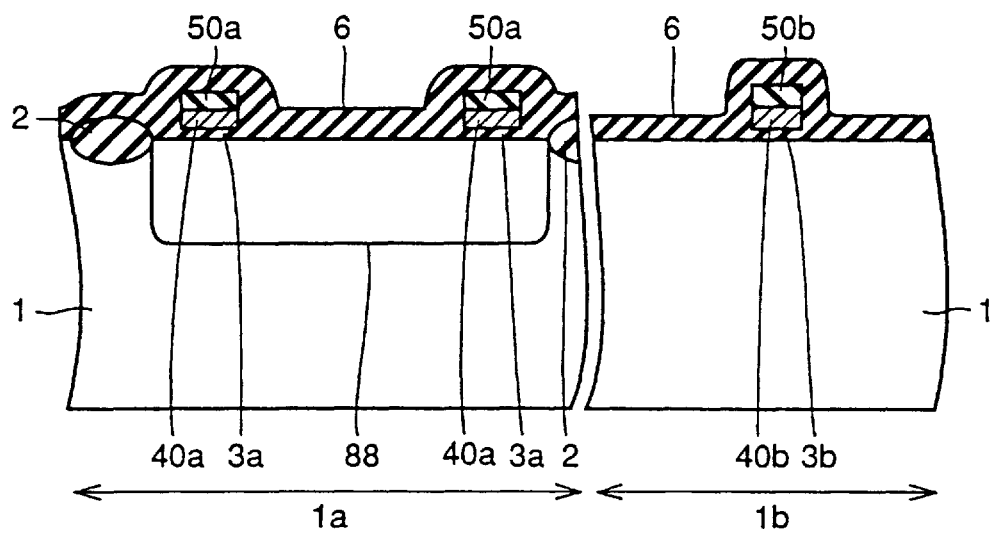

Referring to FIG. 10, an oxide film having the thickness of 100 nm is deposited by the CVD method to form an oxide film 6, to cover silicon substrate 1.

Figure 11:
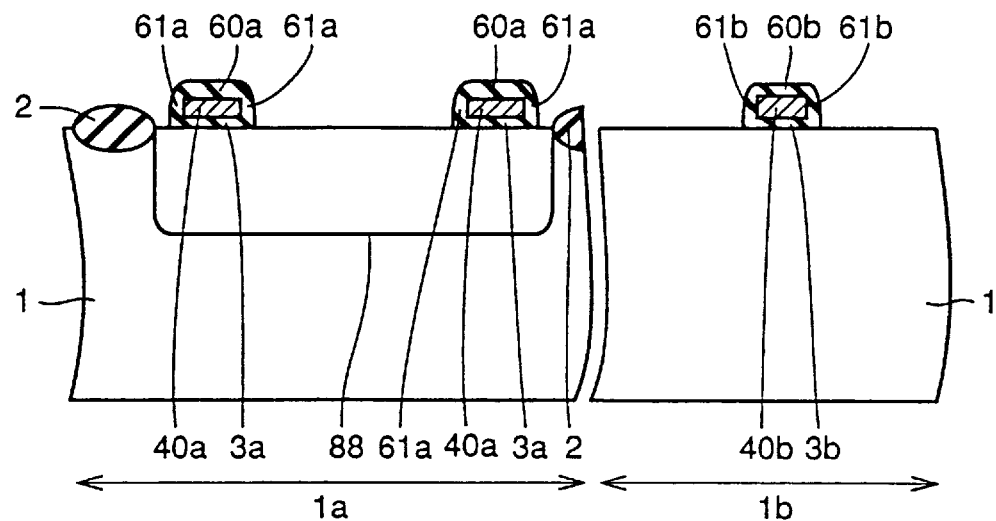

Referring to FIG. 11, by anisotropically etching the oxide film 6, oxide films 60a and 61a covering separation electrode 40a, and oxide films 60b and 61b covering floating gate electrode 40b are formed.

Figure 12:
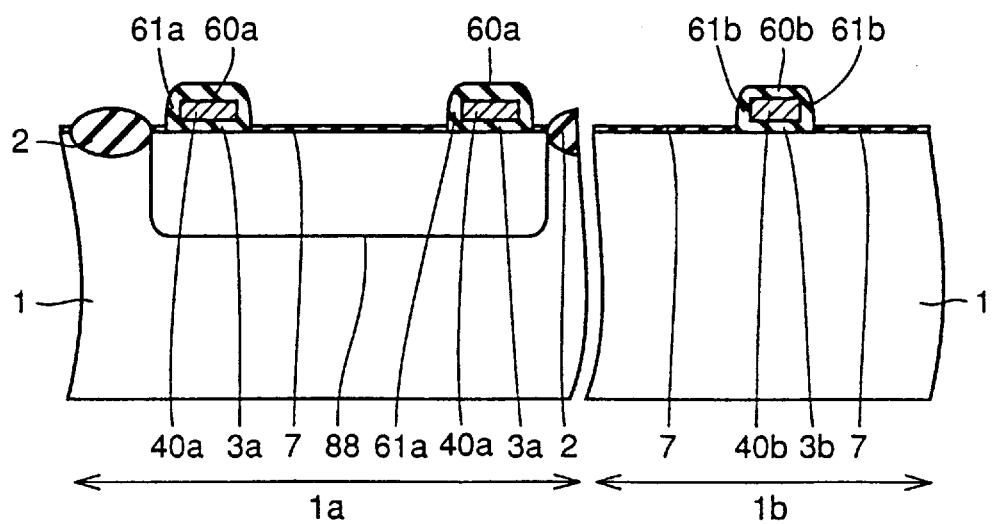

Referring to FIG. 12, a gate oxide film 7 having the thickness of 6 nm is formed by thermal oxidation on silicon substrate 1.

Figure 13:
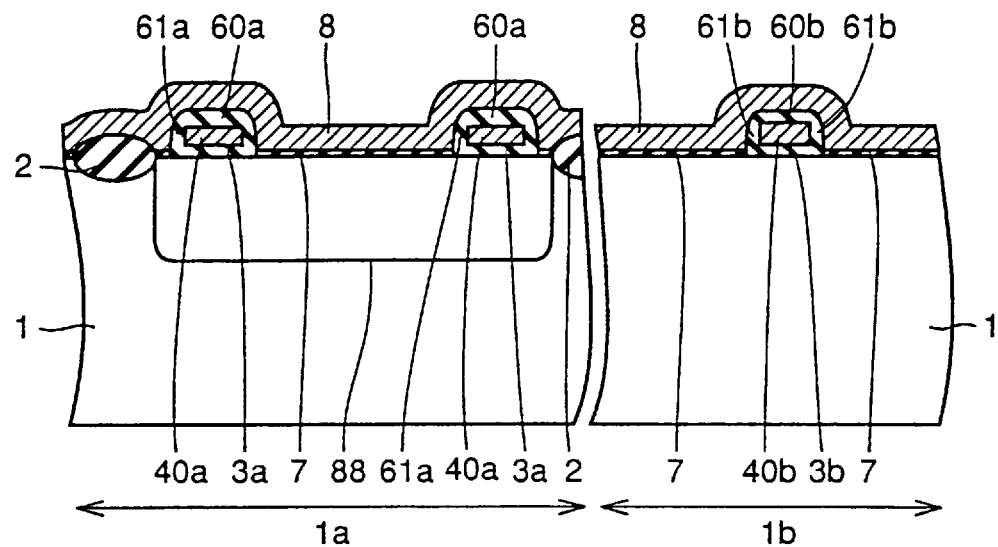

Referring to FIG. 13, polycrystalline silicon 8 having the thickness of 100 nm is deposited by the CVD method on silicon substrate 1. To polysilicon silicon 8 on floating gate electrode 40b and on p well 88, phosphorus ions are implanted. To polysilicon silicon 8 on n well 87, boron ions are implanted.

Figure 14:
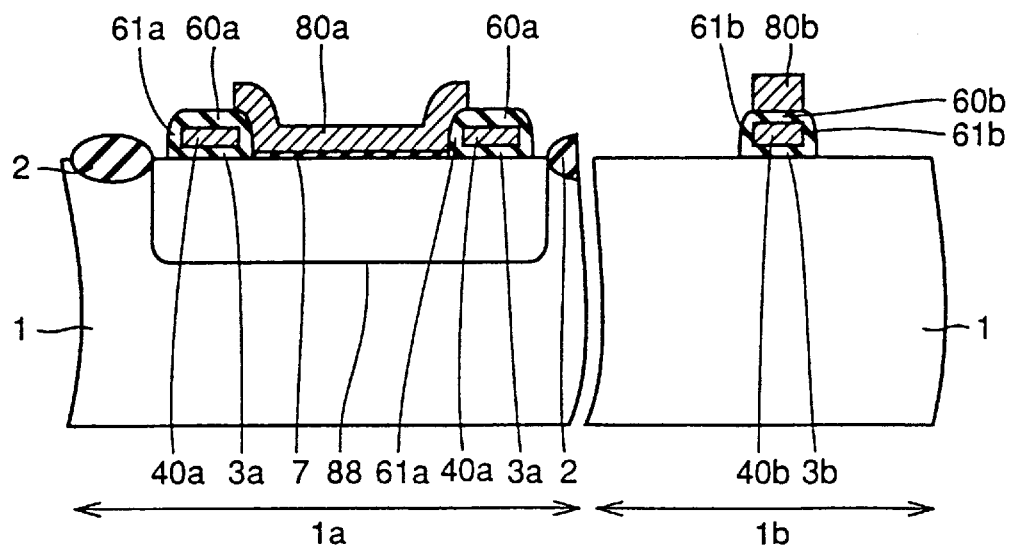

Referring to FIG. 14, by selectively etching polycrystalline silicon 8, an n type gate electrode 88a and an n type control gate electrode 80b are formed. Further, in the gate array portion 1a, a p type gate electrode 28a shown in FIG. 1 is also formed.

Figure 15:
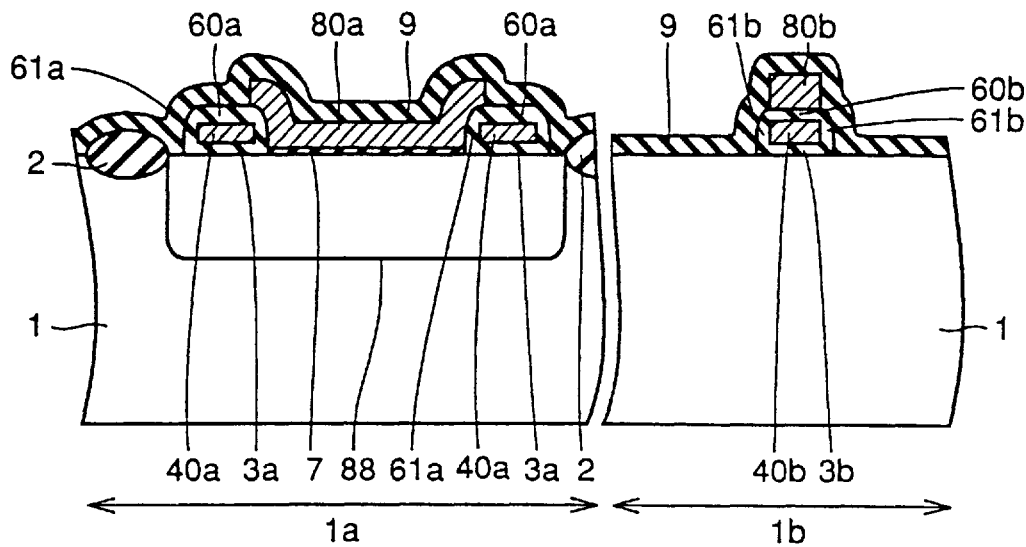

Referring to FIG. 15, a TEOS oxide film having the thickness of 100 nm is deposited to cover silicon substrate 1, thus forming oxide film 9.

Figure 16:
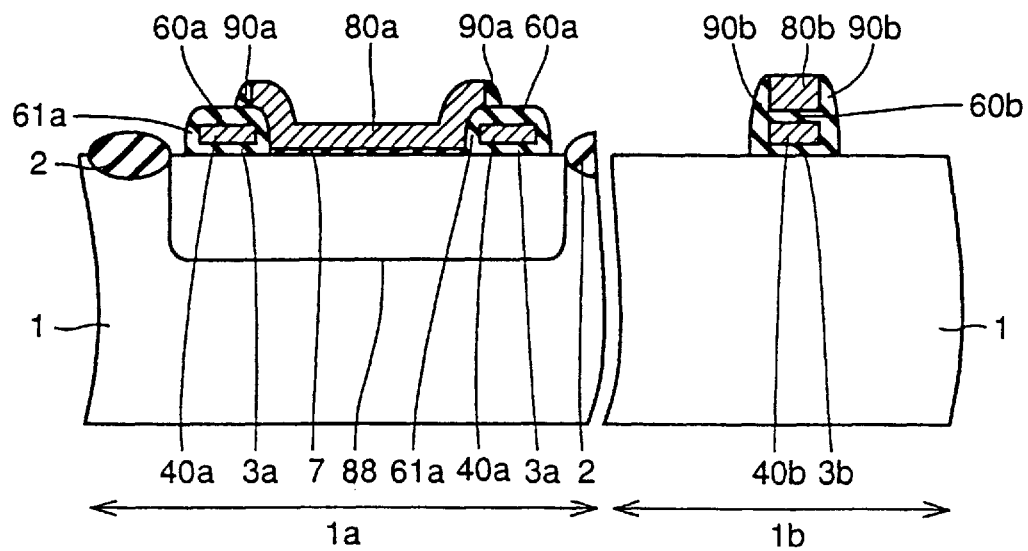

Referring to FIG. 16, by anisotropically etching oxide film 9, an oxide film 90a is formed on the sidewall of gate electrode 80a. At the same time, an oxide film 90b is formed on the sidewalls of control gate electrode 80b and floating gate electrode 40b.

Figure 17:
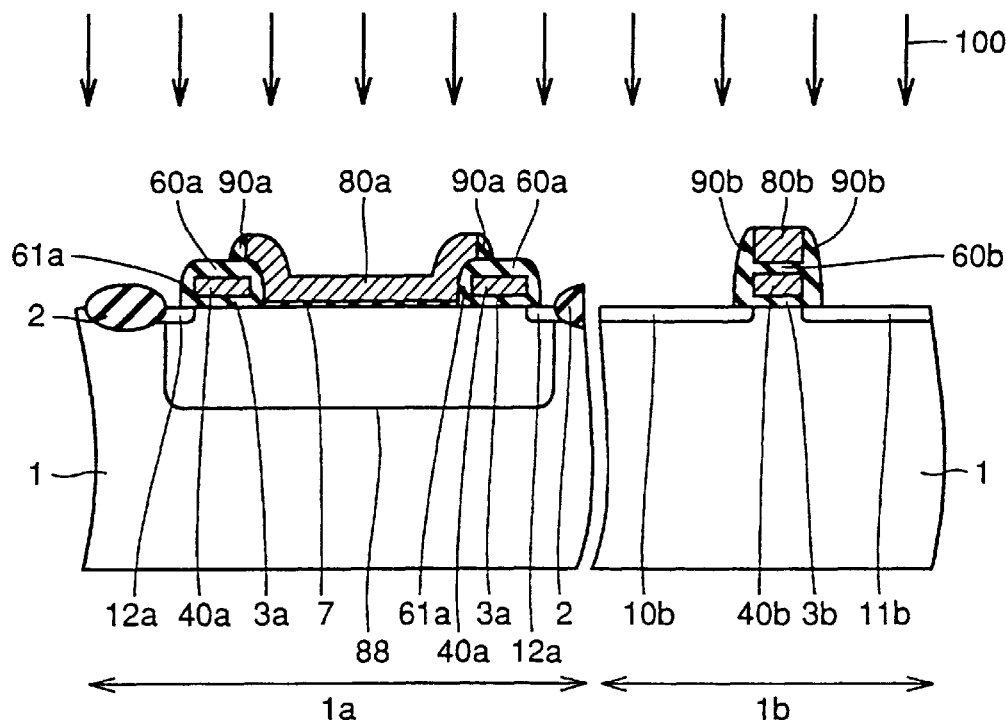

Referring to FIG. 17, boron ions are selectively implanted to silicon substrate 1 as shown by the arrow 100 with the implantation energy of 10 KeV and the dosage of $1 \times 10^{15}/cm^2$. Consequently, $p^+$ electrode 12a in the gate array portion 1a and impurity regions 25a and 26a shown in FIG. 1 are formed. Thereafter, by selectively implanting arsenic ions to silicon substrate 1 with implantation energy of 50 KeV and the dosage of $1 \times 10^{15}/cm^2$, impurity regions 10a, 10b, 11a and 11b as well as $n^+$ electrode 19a shown in FIG. 1 are formed.

Figure 3:
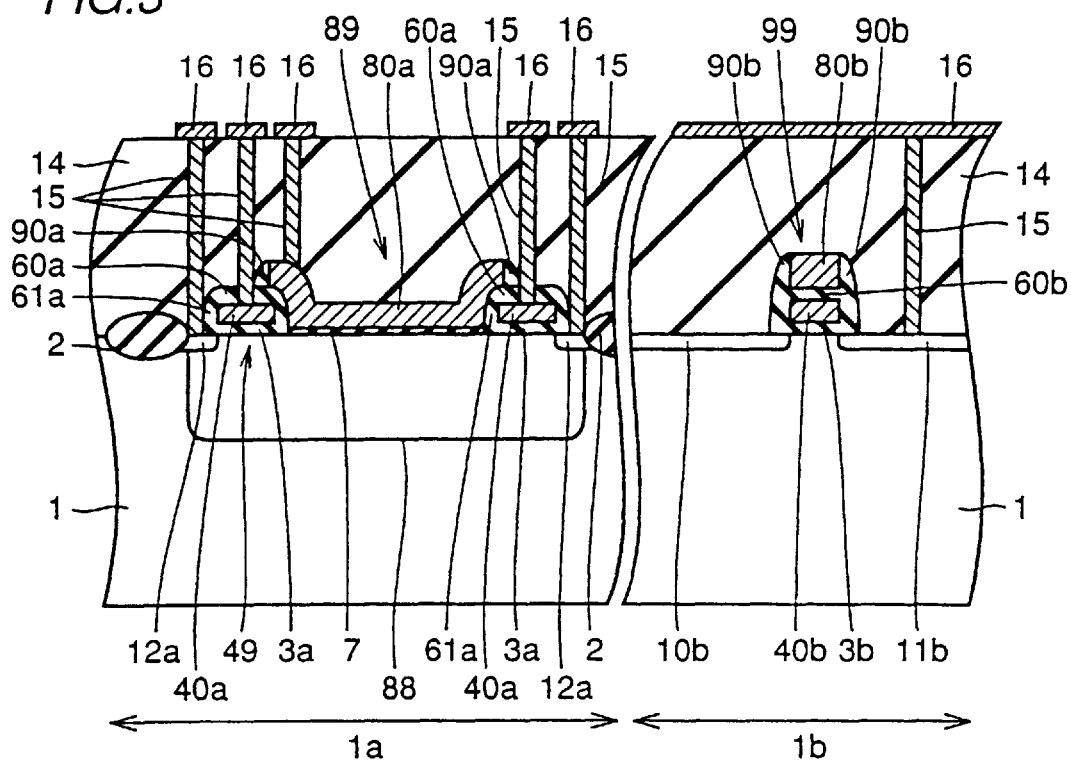
FIG. 3 shows cross sections taken along the lines III—III of FIGS. 1 and 2.

Referring to FIG. 3, a TEOS oxide film having the thickness of 100 nm is formed by the CVD method to cover silicon substrate 1, entirely. Thereafter, on the TEOS oxide film, a BPTEOS (Boro Phospho Tetraethyl Orthosilicate) oxide film is deposited. Thereafter, on the BPTEOS oxide film, a TEOS oxide film having the thickness of 100 nm is deposited by the CVD method. In this manner, an interlayer insulating film 14 is formed. Thereafter, by selectively and anisotropically etching the interlayer insulating film 14, a contact hole reaching $p^+$ electrode 12a is formed. Further, contact holes reaching separation electrode 40a, impurity region 11b, gate electrode 80a, $n^+$ electrode 19a, separation electrode 29a and gate electrode 28a are formed. Then, contact plugs 15 of tungsten are formed by CVD method to fill these contact holes. An aluminum film is formed by sputtering on interlayer insulating film 14. By etching the aluminum film in accordance with a prescribed pattern, aluminum interconnection 16 is formed. In this manner, the semiconductor device of the present invention is completed.

As described above, in the semiconductor device in accordance with the first embodiment, in the steps of manufacturing shown in FIGS. 8 and 9, separation electrode 40a and floating gate electrode 40b are formed through the same steps. Therefore, the number of manufacturing steps for forming the electrodes can be reduced. Therefore, an FPGA can be manufactured through smaller number of steps as compared with the conventional example.

Figure 4:
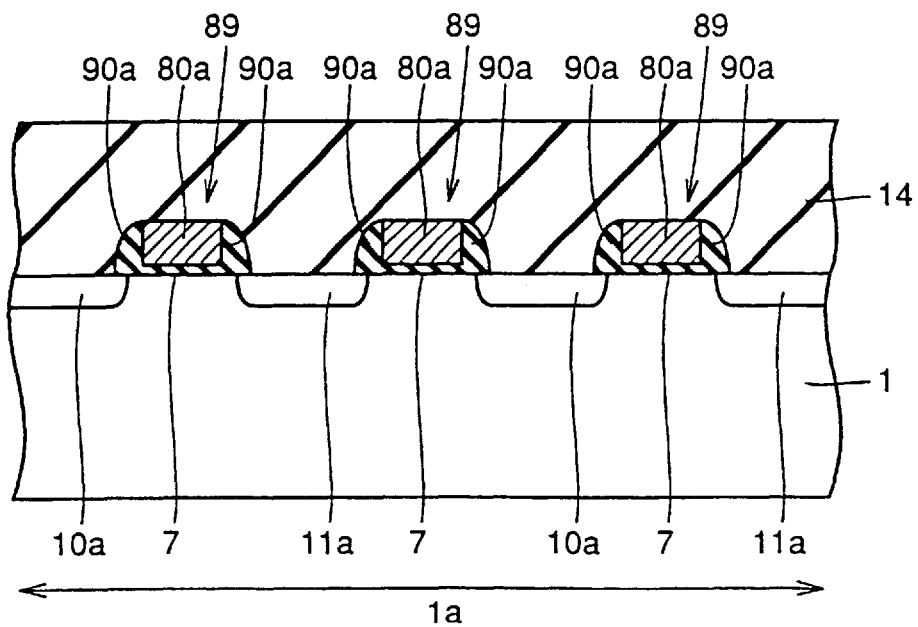
FIG. 4 shows a cross section taken along the line IV—IV of FIG. 1.
Figure 18:
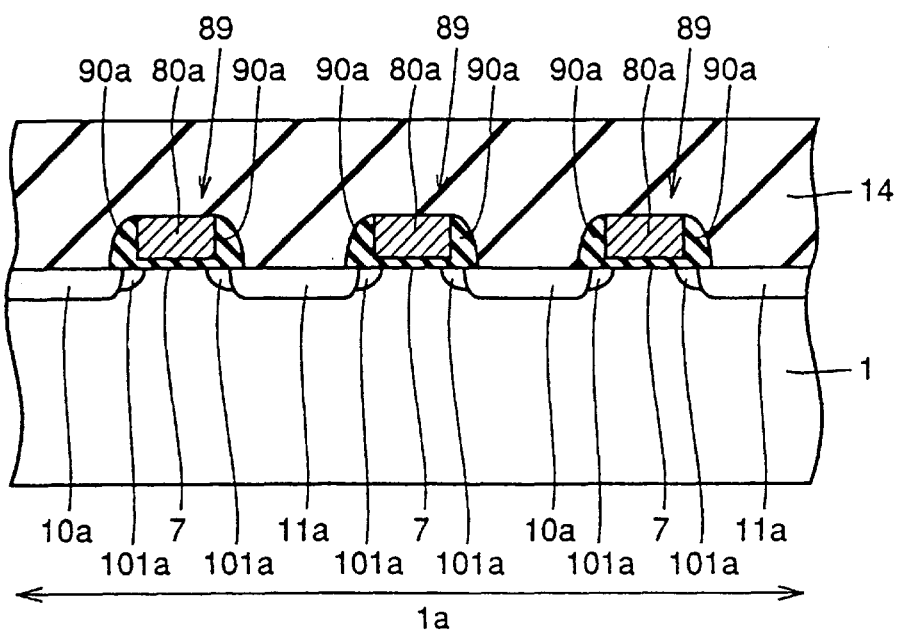
FIG. 18 is a cross section showing another example of the gate array portion.

In the above described embodiment, the impurity regions 10a and 11a as the source/drain regions of the transistor 89 in gate array portion 1a have single drain structure as shown in FIG. 4. However, the source/drain regions are not limited to the single drain structure. The source/drain regions may be of the LDD structure (Lightly Doped Drain), as shown in FIG. 18. In that case, n type impurity region 101a of low concentration is formed at end portions of impurity regions 10a and 11a. The impurity region 101 of low concentration is formed by implanting arsenic ions with the implantation energy of 50 KeV and the dosage of $1 \times 10^{13}/cm^2$ at the portion where p well 88 is formed of the silicon substrate, after oxide films 90a and 90b are formed in the step shown in FIG. 16. Though not shown in the figure, impurity regions 25a and 26a as the source/drain regions of transistor 27 shown in FIG. 1 may have the LDD structure. In that case, after oxide films 90a and 90b are formed in the step shown in FIG. 16, the p type impurity regions of low concentration are formed by implanting boron ions with the implantation energy of 10 KeV with the dosage of $1 \times 10^{13}/cm^2$ at a portion where n well 87 is formed.

Further, in the first embodiment, floating gate 40b and control gate 90b of the first memory 99 have approximately the same gate length. However, the shape of the floating gate and the control gate are not limited thereto. Namely, gate length of control gate electrode 81b of flash memory 99 may be made longer than the gate length of floating gate electrode 40b, so that control gate electrode 81b extends over impurity region 11b and serves as a selection gate.

Figure 19:
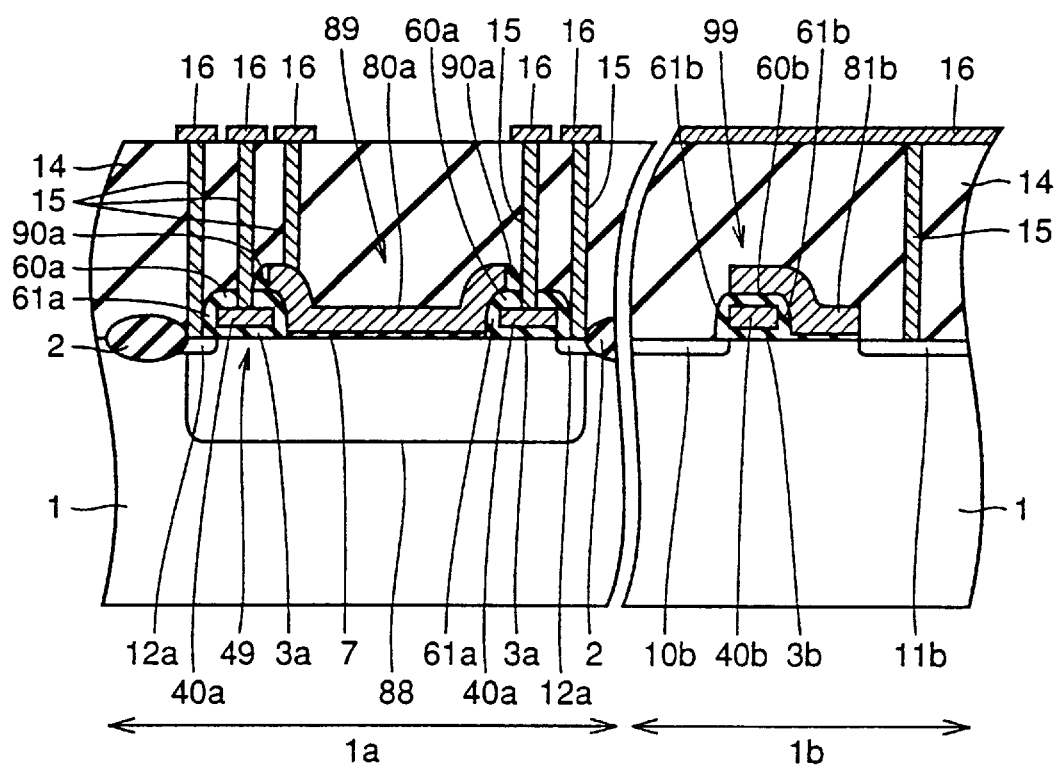
FIG. 19 is a cross section showing another example of the memory cell portion.

To form such a flash memory 99 as shown in FIG. 19, in the step shown in FIG. 14, polycrystalline silicon 8 may be etched so that floating gate electrode is brought into contact with silicon substrate 1. In that case also, the number of steps to form electrode is reduced. Therefore, the semiconductor device can be manufactured through simple steps.

Though gate electrode 80a and control gate electrode 80b are formed of polycrystalline silicon, these electrodes may be formed of silicide such as $CoSi_2$, $TiSi_2$, $NiSi_2$ or the combination of the polycrystalline silicon and silicide.

Although an FPGA in which the gate array and the flash memory are integrated has been described, the present invention is also applicable to one having a microprocessor and a flash memory combined, or to one having DSP (Digital Signal Processor) and a flash memory combined.

Figure 20:
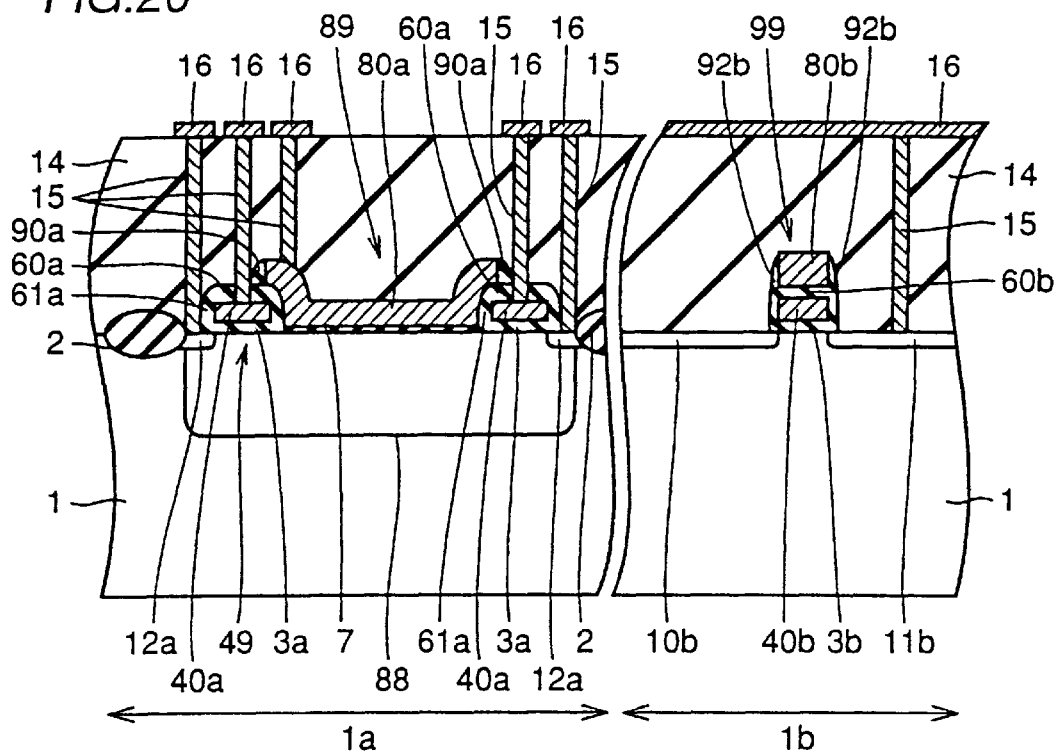
FIG. 20 is a cross section showing a semiconductor device in accordance with a second embodiment of the present invention.

In the first embodiment described above, oxide film 90b is left on the sidewalls of control gate electrode 80b and floating gate electrode 40b of flash memory 99. In the second embodiment, the width of oxide film 92b is made smaller as shown in FIG. 20, than the first embodiment. In the second embodiment, end portions of impurity regions 10b and 11b are closer to floating gate electrode 40b than the first embodiment.

The method of manufacturing the semiconductor device shown in FIG. 20 will be described.

Through the same process steps as shown in FIGS. 6 to 16 of the first embodiment, oxide film 90b is formed on the sidewalls of control gate electrode 80b and floating gate electrode 40b.

Figure 21:
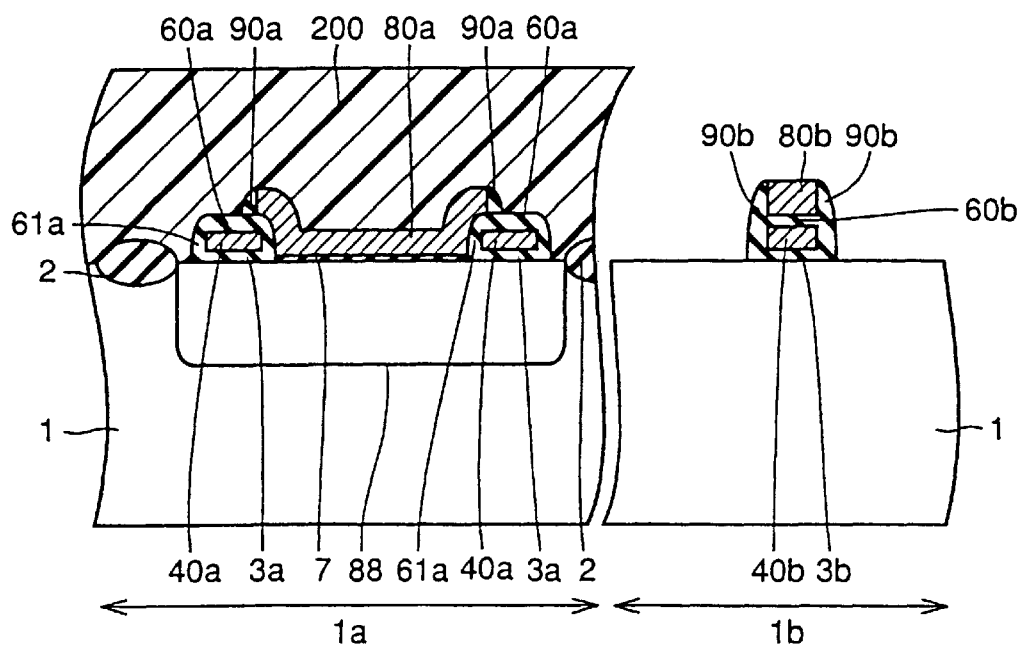
FIGS. 21 and 22 are cross sections showing, in this order, steps of manufacturing the semiconductor device shown in FIG. 20.

Referring to FIG. 21, a resist 200 is formed to cover gate array portion 1a.

Figure 22:
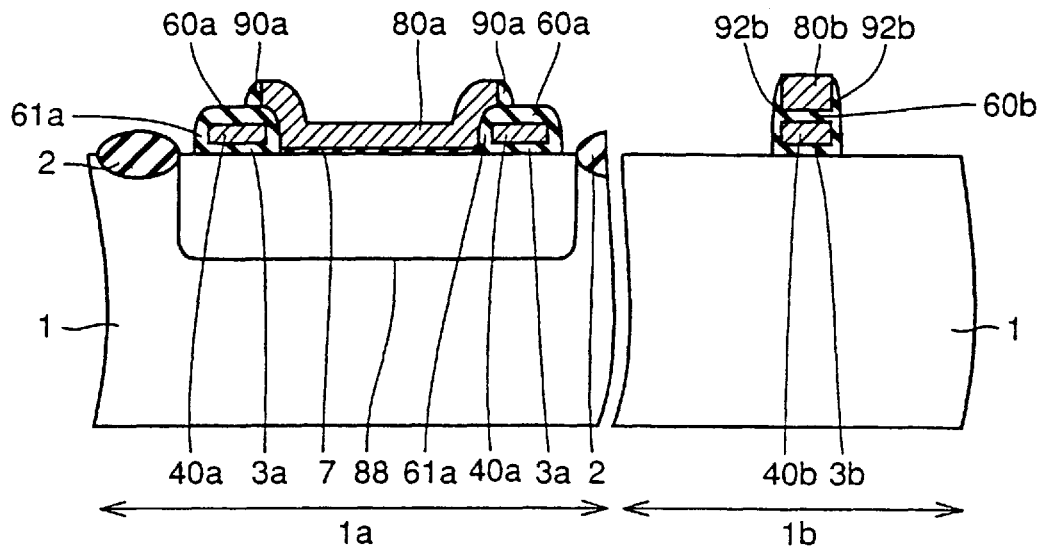

Referring to FIG. 22, using resist 200 as a mask, oxide film 90b is isotropically etched by hydrofluoric acid solution, whereby a narrow oxide film 92b is formed.

Thereafter, through the steps shown in FIGS. 17 and 3 of the first embodiment, the semiconductor device shown in FIG. 20 is completed.

In the semiconductor device structured as described above, effects similar to the first embodiment can be obtained. Further, since the oxide film 92b formed on the sidewall of flash memory 99 is narrow, impurity regions 10b and 11b as the source/drain regions formed by implanting impurity ions to the silicon substrate 1 using oxide film 92b as a mask come closer to floating gate electrode 40b. As a result, electric field at the end portions of impurity regions 10b and 11b become stronger, so that avalanche breakdown is more likely. This facilitates writing to flash memory 99.

Third Embodiment

In the first embodiment, floating gate electrode 40b and control gate electrode 80b have approximately the same gate length. In the third embodiment, referring to FIG. 23, the gate length of the floating gate electrode 41b is more precisely coincide with the gate length of control gate electrode 82b. Except this point, the third embodiment is the same as the first embodiment.

Figure 23:
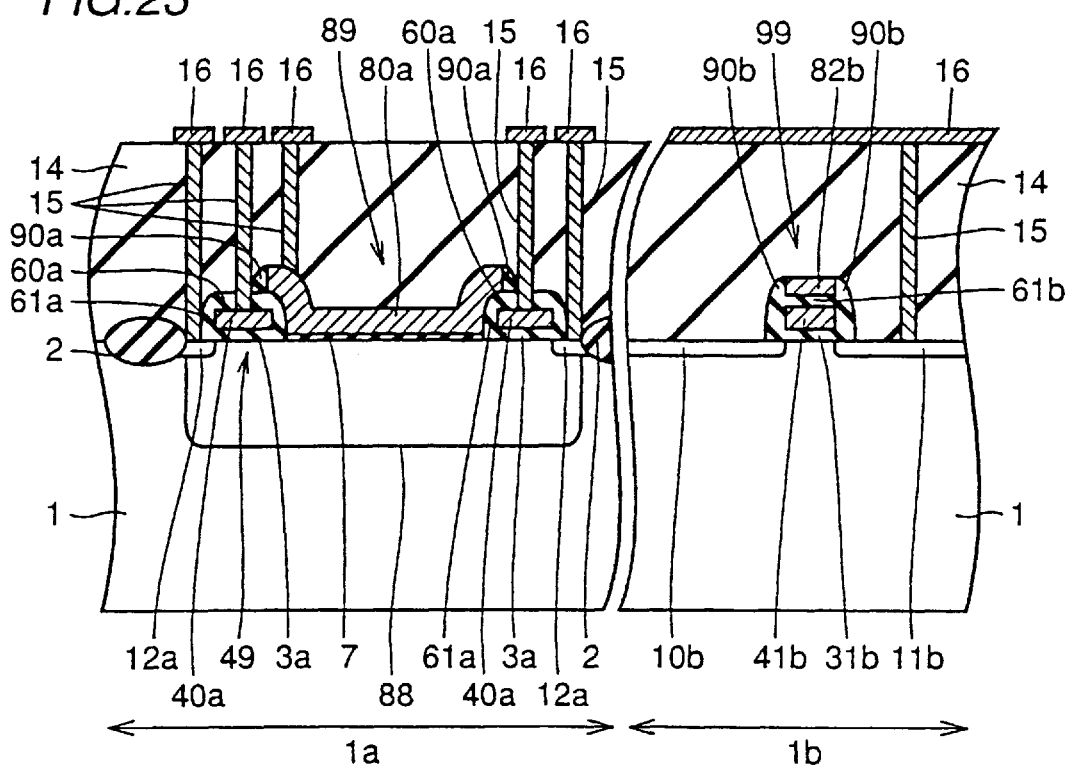
FIG. 23 is a cross section showing a semiconductor device in accordance with a third embodiment of the present invention.

Referring to FIGS. 24 to 33, the method of manufacturing the semiconductor device shown in FIG. 23 will be described.

Figure 24:
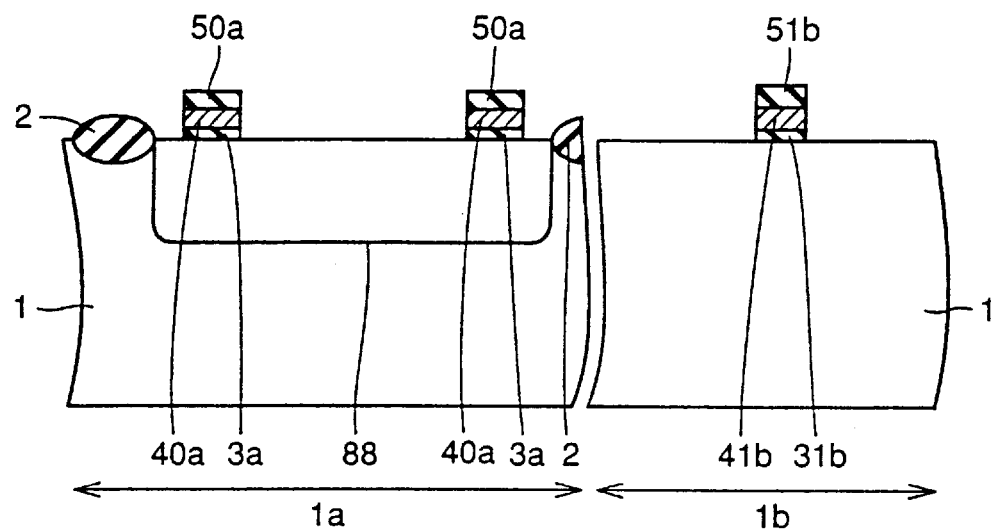
FIGS. 24 to 33 are cross sections showing, in this order, the steps of manufacturing the semiconductor device shown in FIG. 23.

Referring to FIG. 24, through the same process steps as shown in FIGS. 5 to 9 for the first embodiment, LOCOS oxide film 2, p well 88, oxide film 3a and 31b, separation electrode 40a, floating gate electrode 41b and interlayer oxide films 50a and 51b are formed on silicon substrate 1. Here, oxide film 31b, control gate electrode 41b and interlayer oxide film 51b are the same in thickness as oxide film 3b, floating gate electrode 40b and interlayer oxide film 50b shown in FIG. 9. The width of oxide film 31b, floating gate electrode 41b and interlayer oxide film 51b is slightly wider (0.5μm) than the width (0.35μm) to be attained in the final stage.

Figure 25:
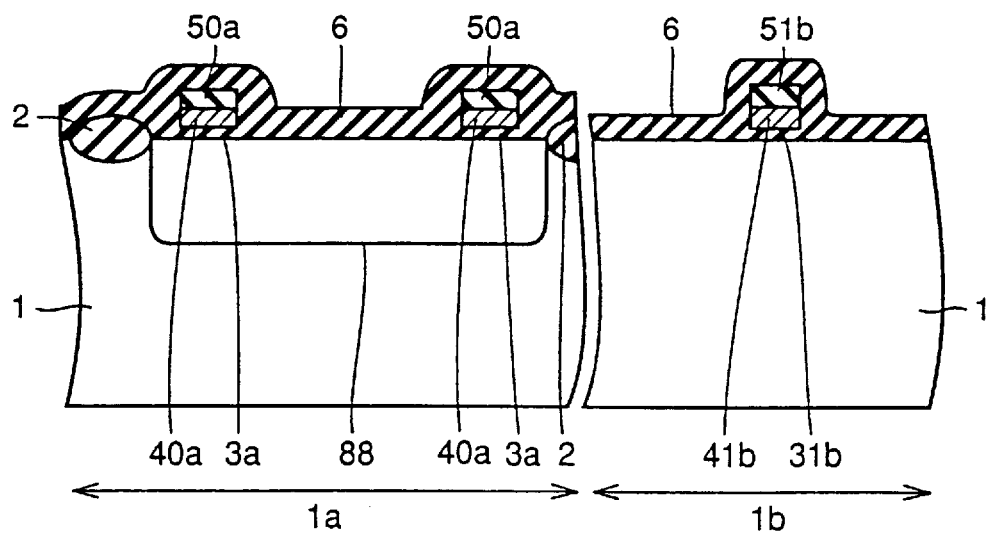

Referring to FIG. 25, a TEOS oxide film is deposited to the thickness of 100 nm by the CVD method to cover silicon substrate 1, so as to form an oxide film 6.

Figure 26:
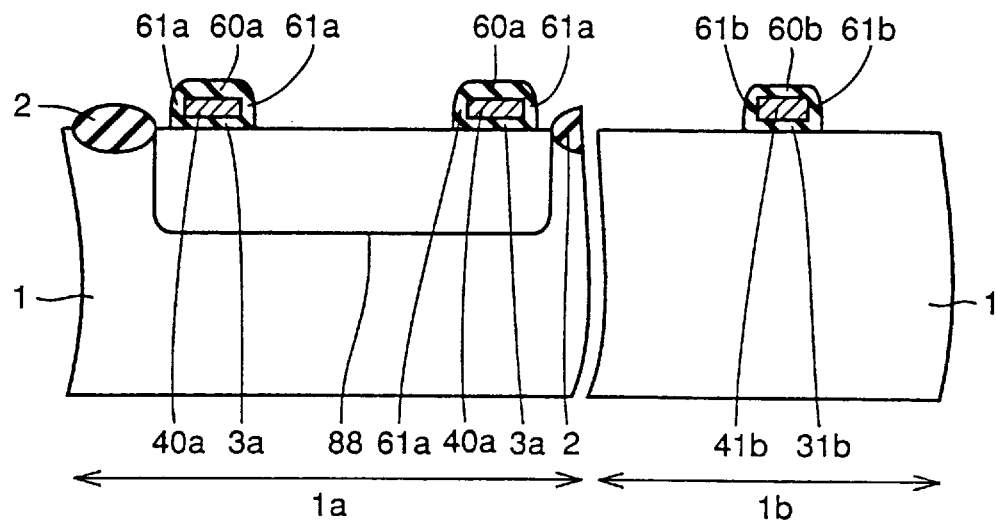

Referring to FIG. 26, by anisotropically etching oxide film 6, oxide films 60a and 61a covering separation electrode 40a and oxide films 61b and 60b covering floating gate electrode 41b are formed.

Figure 27:
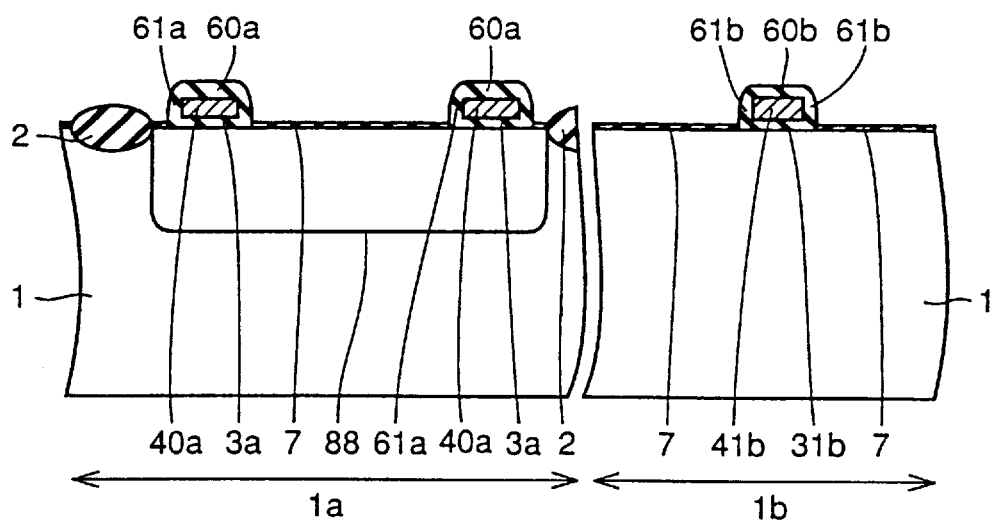

Referring to FIG. 27, a gate oxide film 7 having the thickness of 6 nm is formed by thermal oxidation on the surface of silicon substrate 1.

Figure 28:
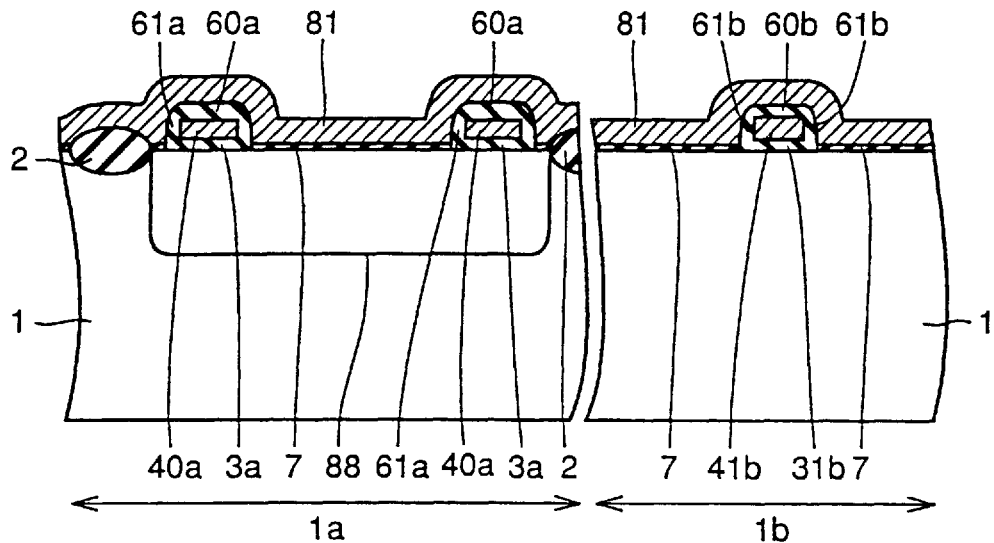

Referring to FIG. 28, a polycrystalline silicon 81 having the thickness of 200 nm is formed by the CVD method to cover silicon substrate 1. Arsenic ions are implanted to polycrystalline silicon 81 positioned on p well 88 and floating gate electrode 41b. Boron ions are implanted to polycrystalline silicon 81 positioned on n well 87.

Figure 29:
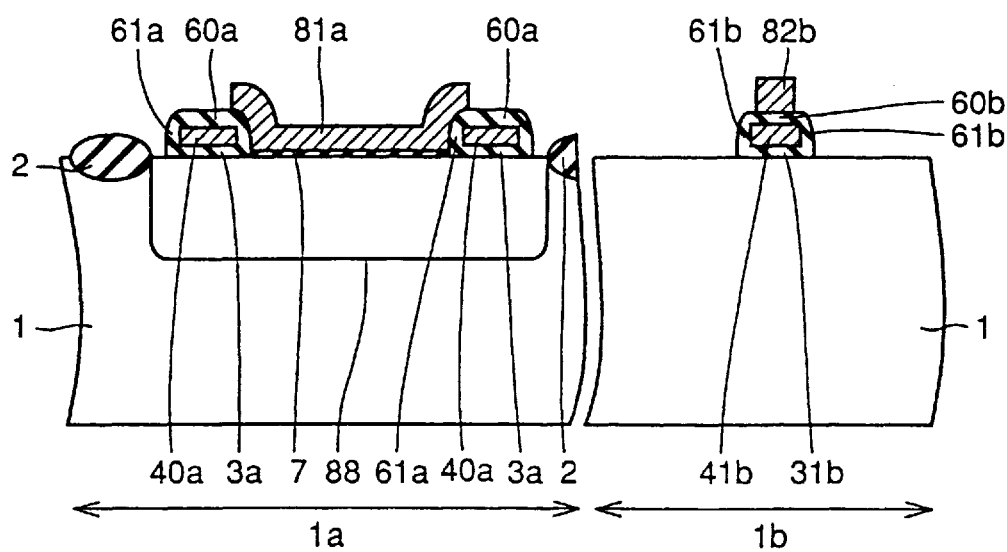

Referring to FIG. 29, by selectively and anisotropically etching polycrystalline silicon 81, gate electrode 81a and control gate electrode 82b are formed. The width of control gate electrode 82b is the width (0.35μm) to be attained in the final stage.

Figure 30:
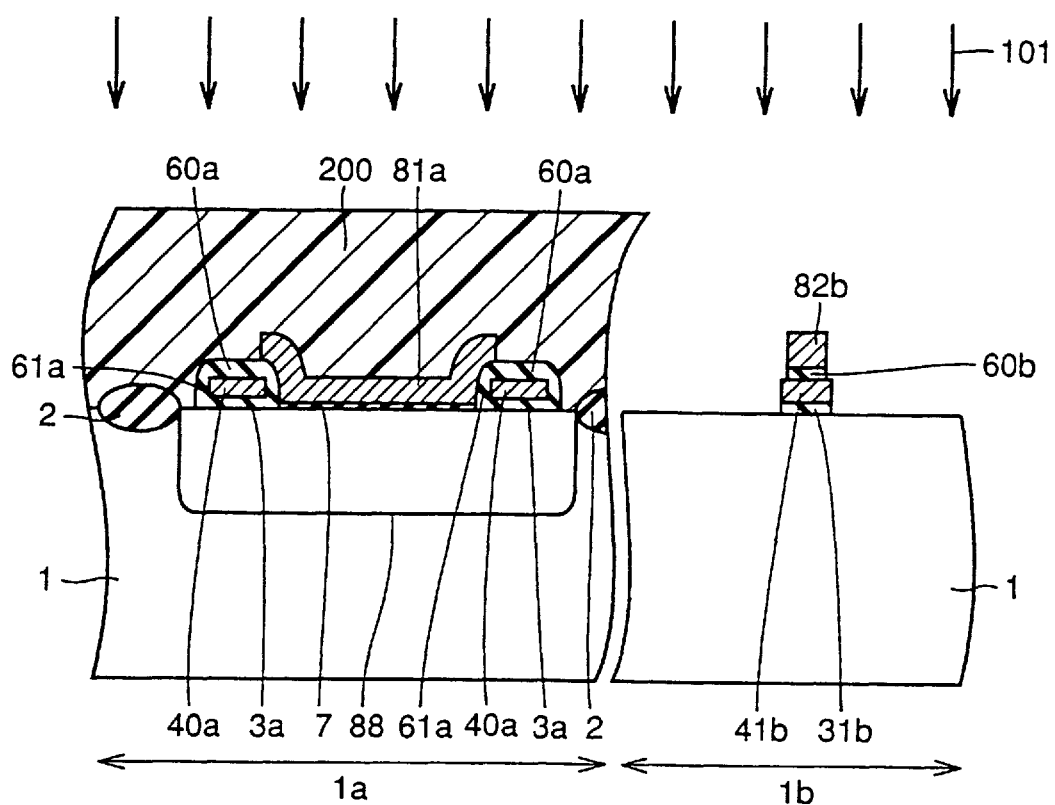

Referring to FIG. 30, gate array portion 1a is covered by resist 200. By etching gas ($CH_4+H_2$ or $CHF_3+O_2$) represented by arrow 101, oxide film 61b is etched, using control gate electrode 82b as a mask. At this time, the width of oxide film 61b comes to be the same as the width of control gate electrode 82b.

Figure 31:
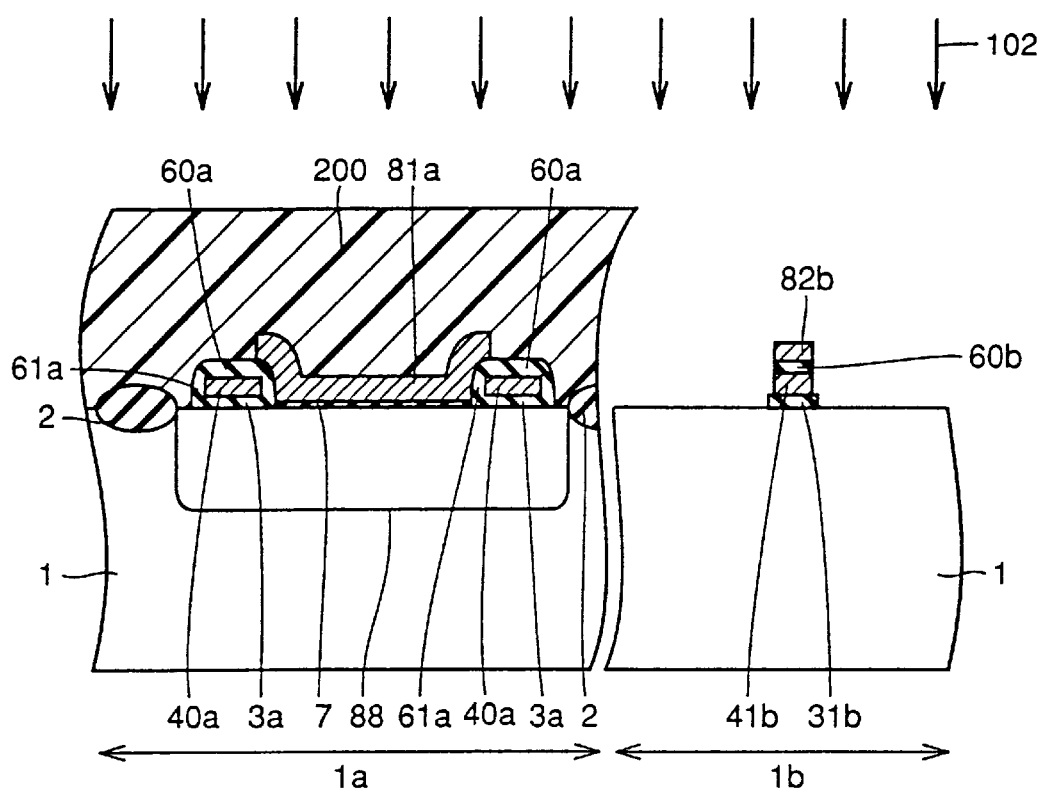

Referring to FIG. 31, by an etching gas ($CF_4$, $Cl_2$ or HBr) represented by arrow 102, floating gate 41b is etched using control gate electrode 82b as a mask. At this time, floating gate electrode 41b comes to have the same width as control gate electrode 82b. Control gate electrode 82b is also etched. However, since control gate electrode 82b is thick (200 nm), control gate electrode 82b remains even after etching.

Figure 32:
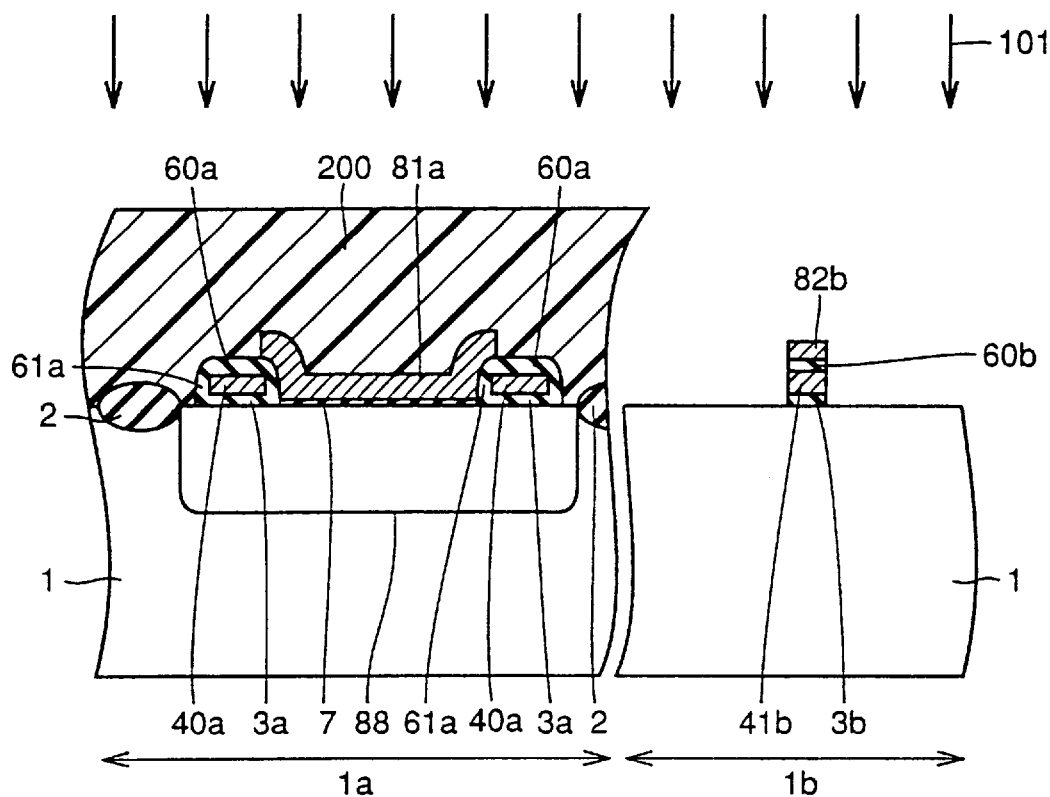

Referring to FIG. 32, by using an etching gas ($CH_4+H_2$ or $CHF_3+O_2$) represented by arrow 101 and using control gate electrode 82b as a mask, oxide film 31b is etched.

Figure 33:
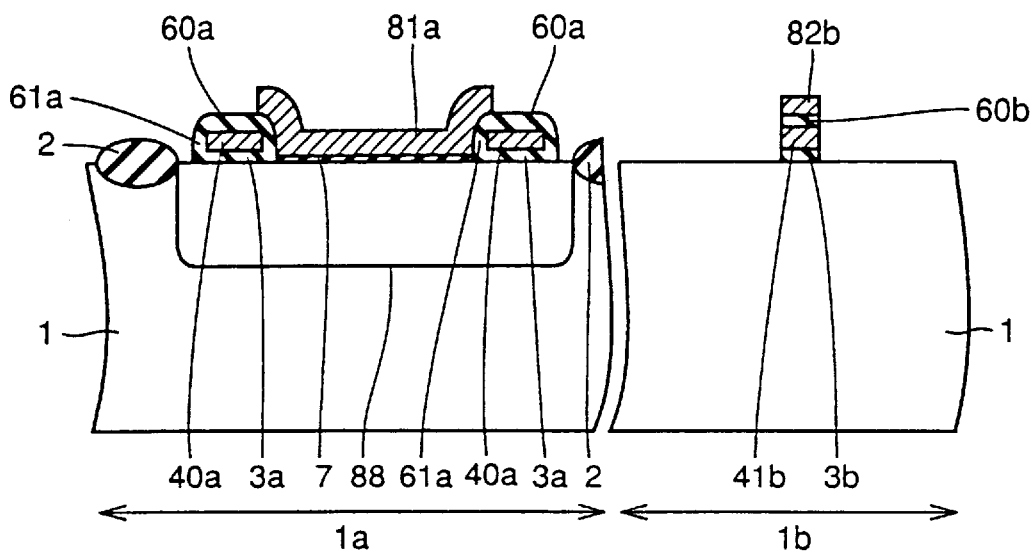

Referring to FIG. 33, resist 200 is removed by ashing.

Thereafter, through the steps shown in FIGS. 15, 16, 17 and 3 of the first embodiment, the semiconductor device is completed.

In the semiconductor device and the manufacturing method thereof as described above, the effect similar to the first embodiment can be obtained. Further, in the step shown in FIG. 31, floating gate electrode 41b is formed by etching using control gate electrode 82b as a mask. Therefore, the gate length of the floating gate electrode 41b more precisely matches the gate length of control gate electrode 82b as compared with the case where these electrodes are formed through separate steps of photolithography. Therefore, defects caused when the control gate electrode is failed to be formed on floating gate electrode can be prevented, and production yield of the semiconductor device can be improved.

Figure 34A:
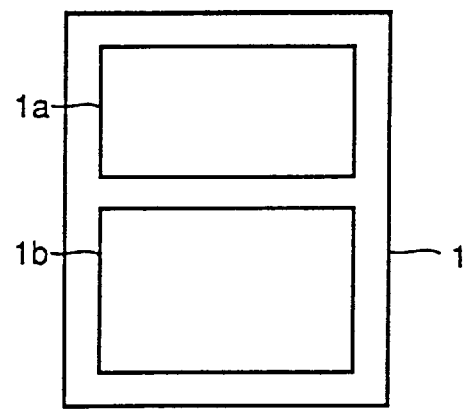
FIGS. 34A and 34B are plan view showing the memory cell portion of the semiconductor device in accordance with a fourth embodiment of the present invention.
Figure 34B:
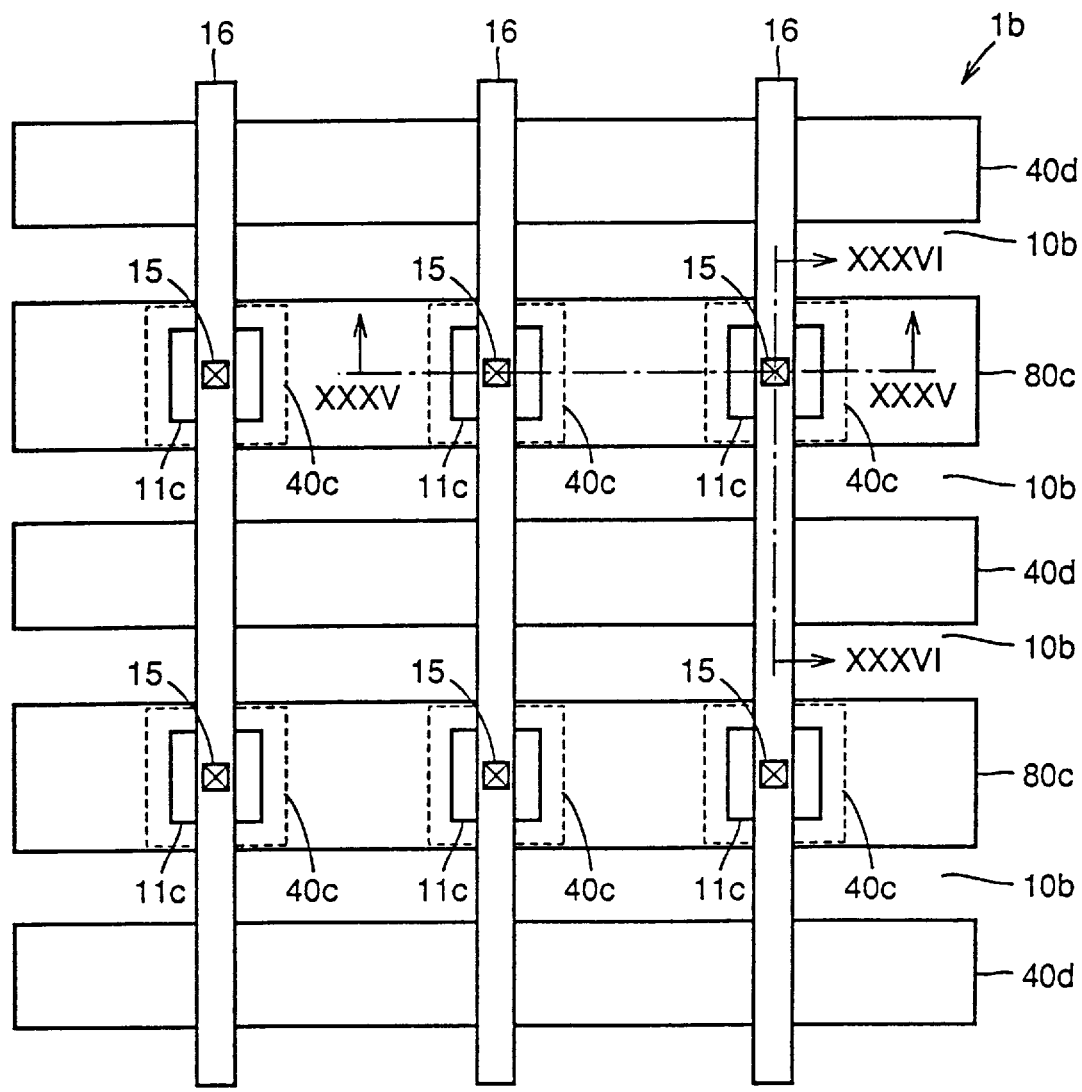
Figure 35:
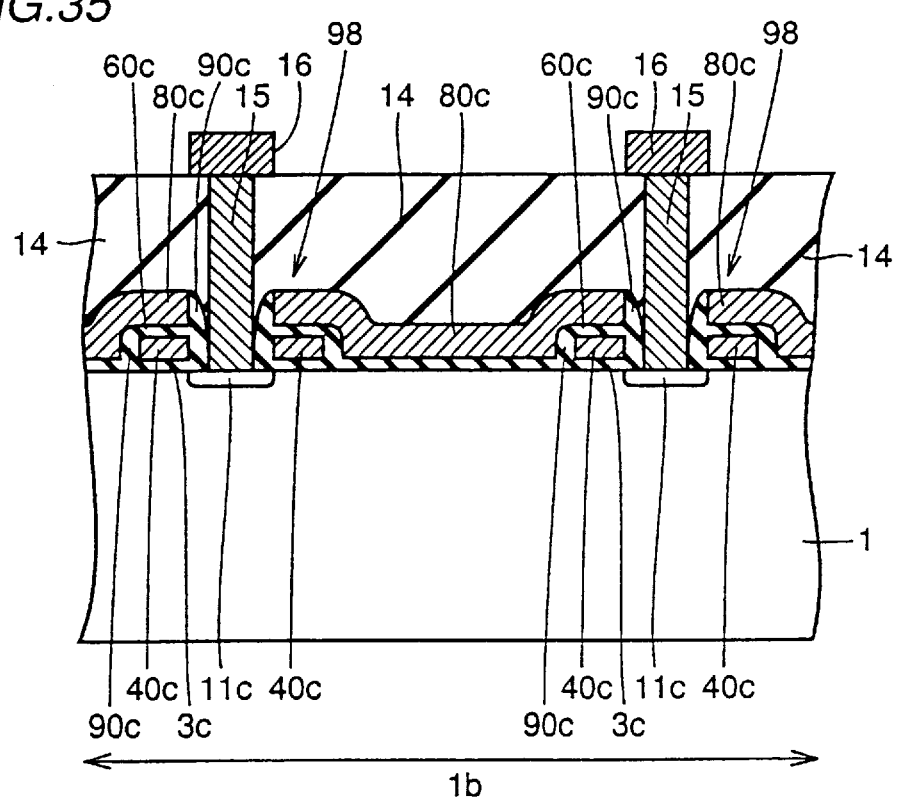
FIG. 35 shows a cross section taken along the line XXXV—XXXV of FIG. 34.
Figure 36:
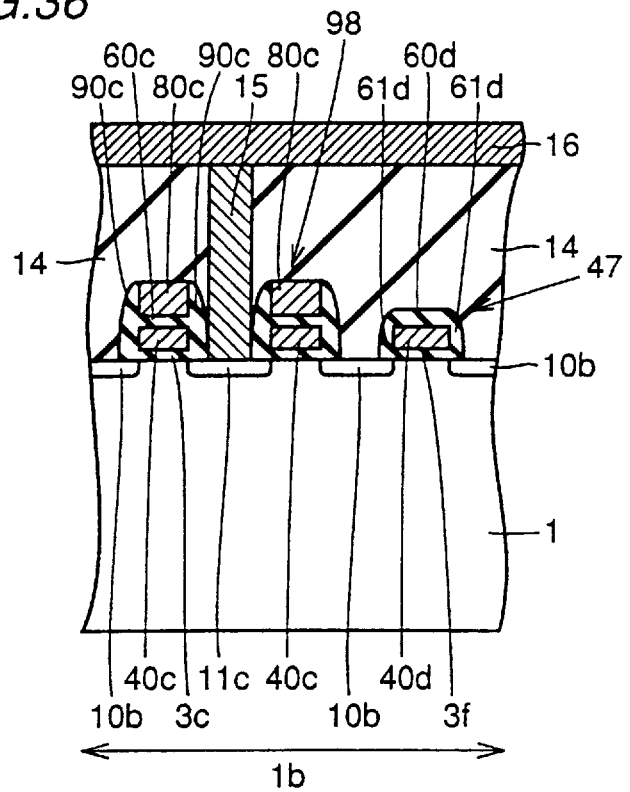
FIG. 36 is a cross section taken along the line XXXVI—XXXVI of FIG. 34.

Fourth Embodiment Referring to FIGS. 34 to 36, there are gate array portion 1a and memory cell portion 1b formed on silicon substrate 1. Cross section of gate array portion 1a is the same as the that positioned on the left side of FIG. 3. There are a plurality of flash memories 98 formed in memory cell portion 1b. Flash memory 98 includes an impurity region 10b as a source region, an impurity region 11c as a drain region, a floating gate electrode 40c having the thickness of 100 nm, and a control gate electrode 80c. An impurity region 11c is formed in silicon substrate 1. Floating gate electrode 40c having a ring-shape is formed surrounding impurity region 11c, with an oxide film 3c interposed. Control gate electrode 80c is formed to cover floating gate electrode 40c and extending in the lateral direction of FIG. 34. Impurity region 10b as the source region is formed extending along control gate electrode 80c, on the side of floating gate electrode 40c opposite to impurity region 11c. Between the two impurity regions 10b, separating portion 47 including a separation electrode 40d having the thickness of 100 nm is formed. Separation electrode 40d separates two impurity regions 10b, and is formed on silicon substrate 1 with oxide film 3f interposed. Oxide films 60d and 61d are formed to cover separation electrode 40d. Interlayer insulating film 14 is formed to cover silicon substrate 1. A contact hole reaching impurity region 11c is formed in interlayer insulating film 14. A contact plug 15 is formed to fill the contact hole. Aluminum interconnection 16 is formed to be in contact with the contact plug.

The method of manufacturing the semiconductor device shown in FIG. 36 will be described with reference to FIGS. 37 to 45.

Figure 37:
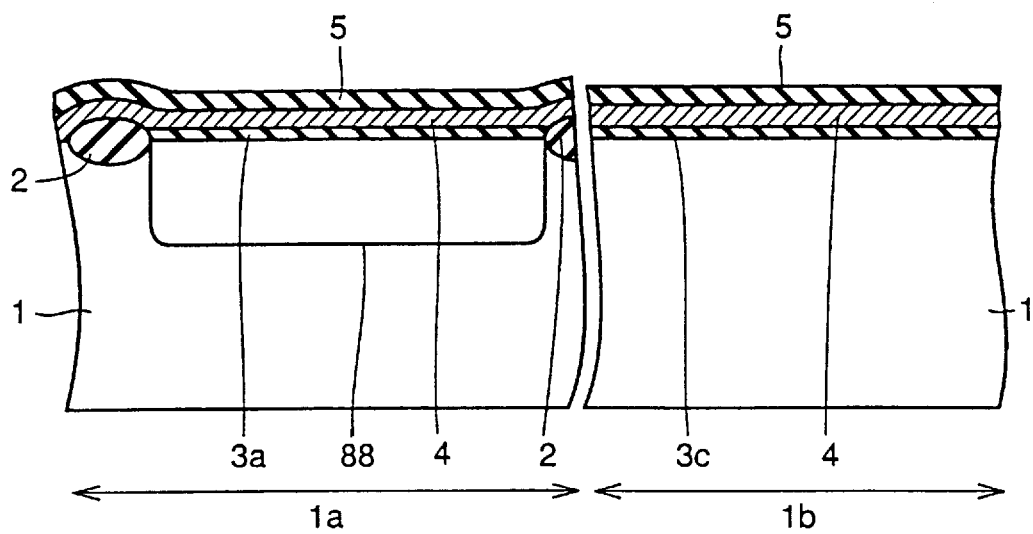
FIGS. 37 to 45 are cross sections showing, in this order, the steps of manufacturing the semiconductor device shown in FIG. 36.

Referring to FIG. 37, an LOCOS oxide film 2 having the thickness of 400 nm is formed on a p type silicon substrate 1. Thereafter, by selectively implanting boron ions with the implantation energy of 200 to 500 KeV and the dosage of $1 \times 10^{13}/cm^2$ to silicon substrate 1, a p well 80 is formed. By selectively implanting ions of arsenic with the implantation energy of 400 to 900 KeV and the dosage of $1 \times 10^{13}/cm^2$ to silicon substrate 1, an n well is formed. Oxide films 3a and 3c having the thickness of 10 nm are formed by the CVD method to cover silicon substrate 1 entirely. Polycrystalline silicon 4 having the thickness of 100 nm is formed to cover oxide films 3a and 3c. Phosphorus ions are implanted to polycrystalline silicon 4 on memory cell region 1b and p well 88. Boron ions are implanted to the polycrystalline silicon on n well 87. On the polycrystalline silicon 4, oxide film 5 having the thickness of 100 nm is formed by the CVD method.

Figure 38:
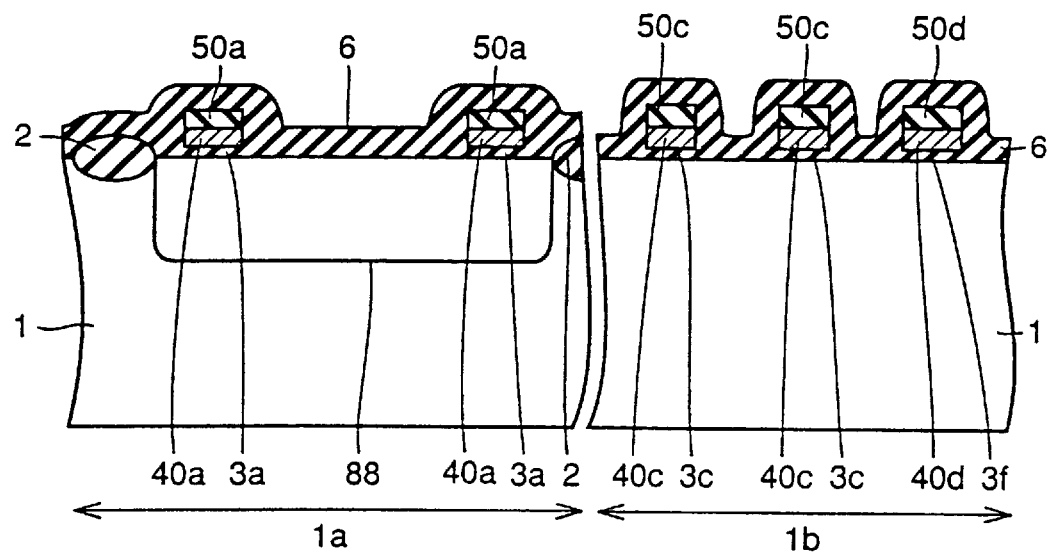

Referring to FIG. 38, by anisotropically etching oxide films 3a, 3c and 5 as well as polycrystalline silicon 4 in accordance with a prescribed pattern, oxide films 3a, 3c and 3f, separation electrodes 40a and 40d having the thickness of 100 nm, a floating gate electrode 40c having the thickness of 100 nm, and interlayer oxide films 50a, 50c and 5d are formed.

Oxide film 6 is formed by the CVD method to cover silicon substrate 1.

Figure 39:
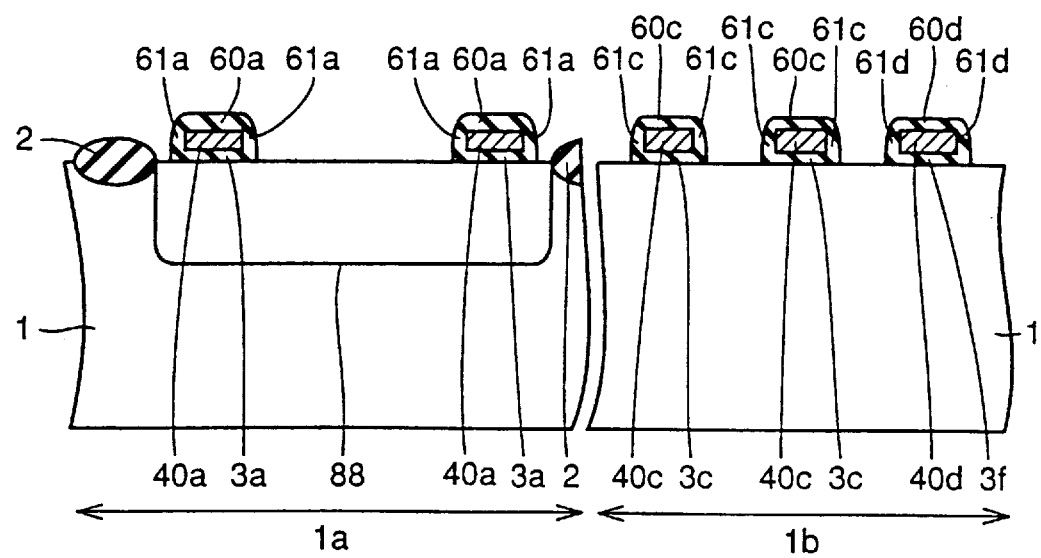

Referring to FIG. 39, by anisotropically etching oxide film 6, oxide films 60a and 61a covering separation electrode 40a, oxide films 60c and 61c covering floating gate electrode 40c, and oxide films 60b and 61d covering separation electrode 40d are formed.

Figure 40:
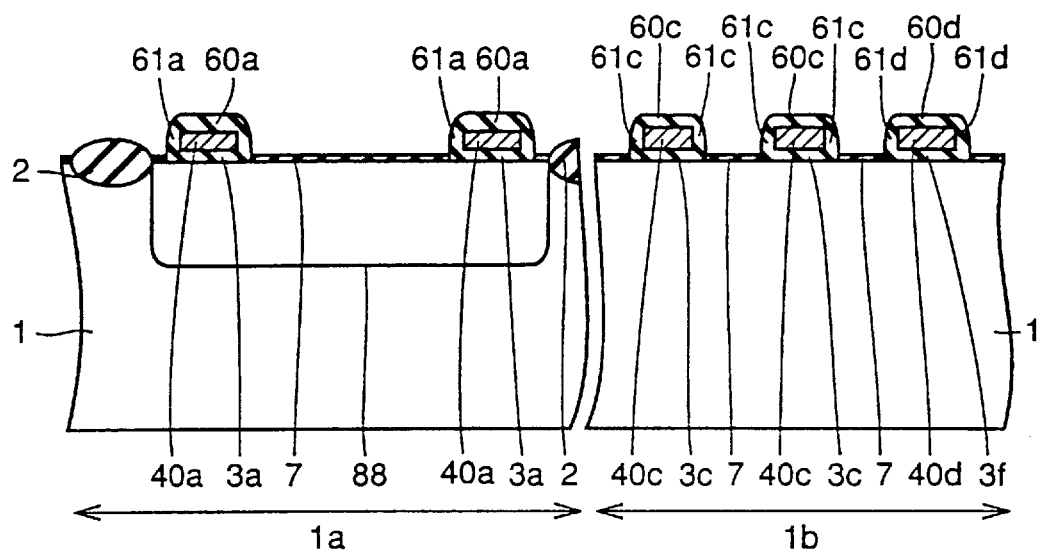

Referring to FIG. 40, an oxide film 7 having the thickness of 6 nm is formed by thermal oxidation on silicon substrate 1.

Figure 41:
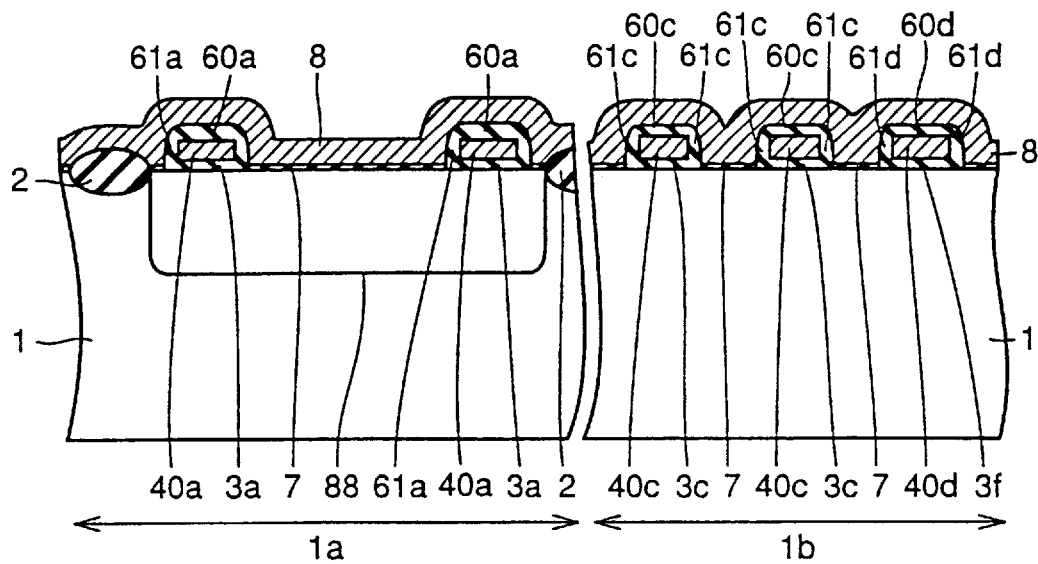

Referring to FIG. 41, a polycrystalline silicon 8 having the thickness of 100 nm is formed by the CVD method to cover silicon substrate 1. Phosphorus ions are implanted to polycrystalline silicon 8 on p well 88 and a floating gate electrode 40c. Boron ions are implanted to the polycrystalline silicon 8 on the n well.

Figure 42:
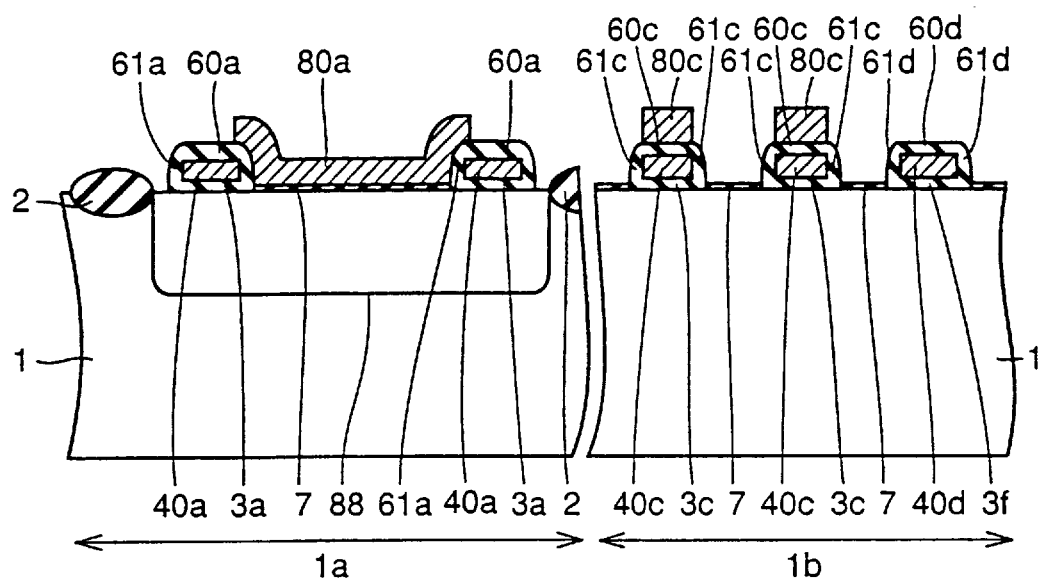

Referring to FIG. 42, by patterning polycrystalline silicon 8 to a prescribed shape, gate electrode 80a and control gate electrode 80c are formed.

Figure 43:
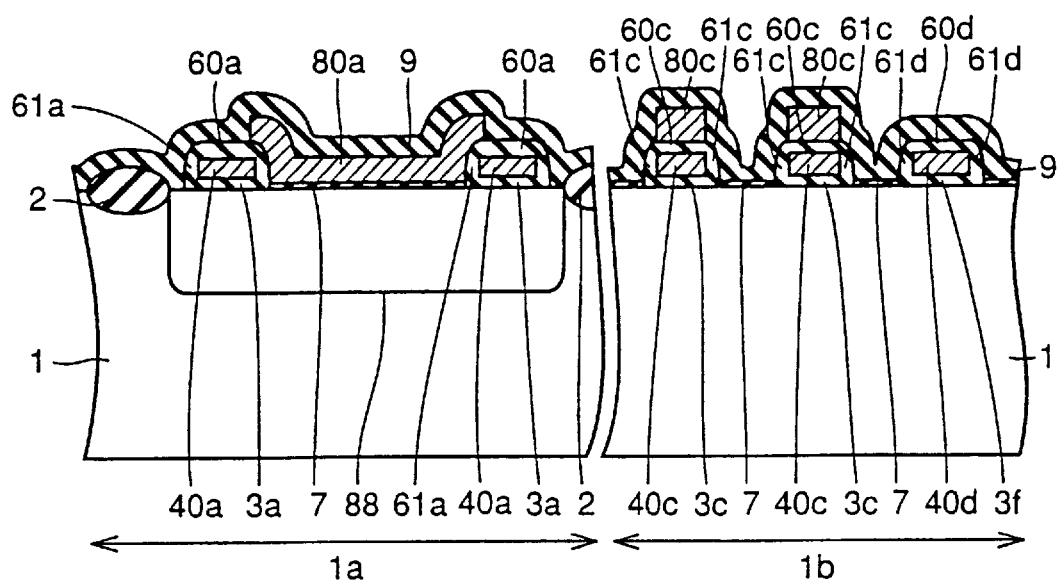

Referring to FIG. 43, a TEOS oxide film having the thickness of 100 nm is deposited to cover silicon substrate 1, thus providing oxide film 9.

Figure 44:
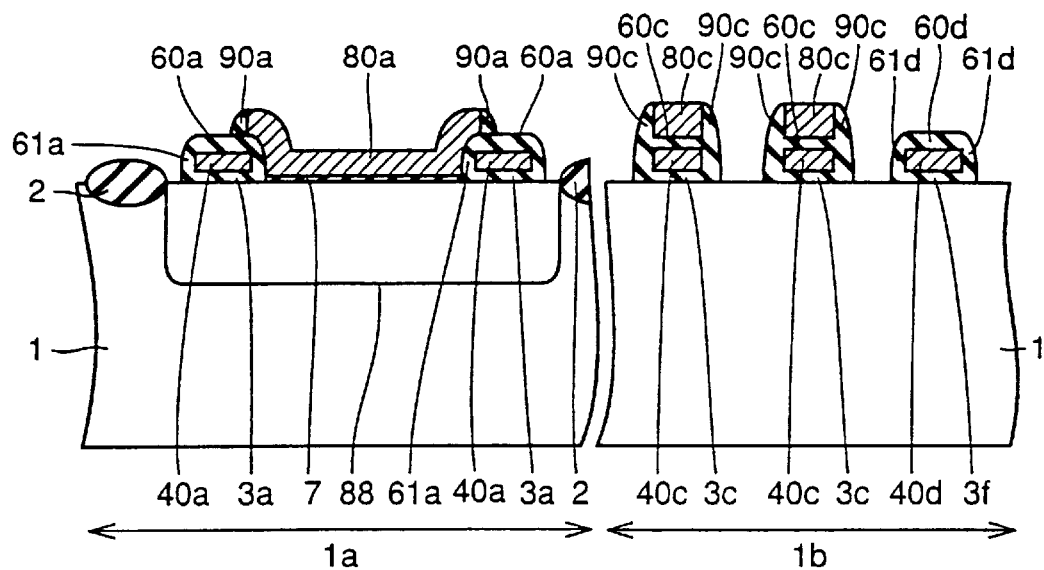

Referring to FIG. 44, by anisotropically etching oxide film 9, an oxide film 90a is formed on the sidewall of gate electrode 80a. Further, an oxide film 90c is formed on the sidewall of control gate electrode 80c.

Figure 45:
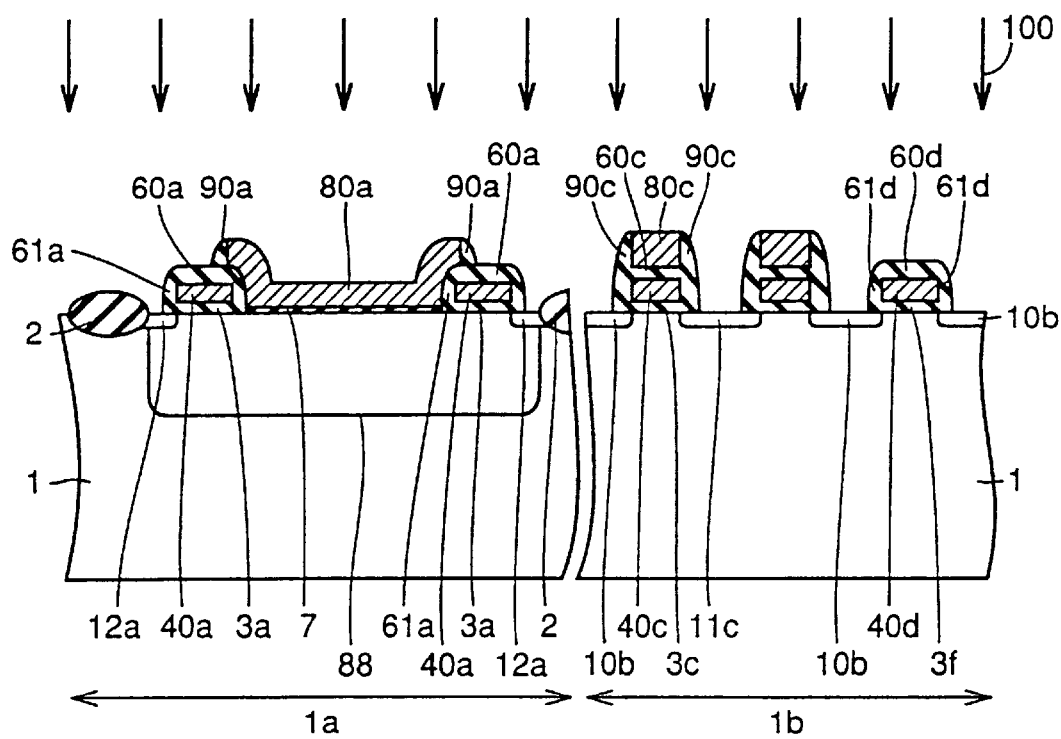

Referring to FIG. 45, by selectively implanting boron ions denoted by arrow 100 with implantation energy of 10 KeV and the dosage of $1 \times 10^{15}/cm^2$ to silicon substrate 1, a $p^+$ electrode 12a and impurity regions 10b and 11c are formed. In the gate array portion 1a, to a region where n well is formed, arsenic ions are implanted with the implantation energy of 50 KeV and a dosage of $1 \times 10^{15}/cm^2$.

Referring to FIG. 36, an interlayer insulating film 14 covering silicon substrate 1 is formed. A contact hole reaching impurity region 11c is formed in interlayer insulating film 14. A contact plug 15 of tungsten is formed by the CVD method to fill the contact hole. An aluminum interconnection 16 is formed to be in contact with contact plug 15, on interlayer insulating film 14. Thus the semiconductor device is completed.

As described above, according to the semiconductor device and the manufacturing method of the fourth embodiment described above, in the step shown in FIG. 37, the separation electrode 40a in the gate array portion 1a, the floating gate electrode 40c and separation electrode 40d of the memory cell portion 1b are formed through the same process steps. Therefore, the number of steps for forming the electrodes can be reduced. Therefore, the SPGA can be manufactured through smaller number of manufacturing steps.

Further, as shown in FIG. 34, in order to separate flash memory 98 in the memory cell portion 1b, separating portion 47 including a separation electrode 40d is used. Therefore, the flash memory 98 can surely be separated.

Fifth Embodiment

In the first embodiment, there is not an impurity region formed below separation electrode 40a, floating gate electrode 40b or gate electrode 80a. In the fifth embodiment, referring to FIG. 46, a p type impurity region 132 as a channel doped region is formed below separation electrode 40a, a p type impurity region 133 as a channel doped region is formed below floating gate electrode 40b, and a p type impurity region 131 as a channel doped region is formed below gate electrode 80a. The impurity concentration of impurity region 131 is $n_{GA}$, that of impurity region 132 is $n_{FS}$, and that of impurity region 133 is $n_{Flash}$. There is a relation $n_{GA} < n_{Flash} \leq n_{FS}$ between the impurity concentrations $n_{GA}$, $n_{FS}$ and $n_{Flash}$. Except this point, the embodiment is the same as the first embodiment shown in FIG. 3.

The method of manufacturing the semiconductor device shown in FIG. 46 will be described with reference to FIGS. 47 to 49.

Figure 47:
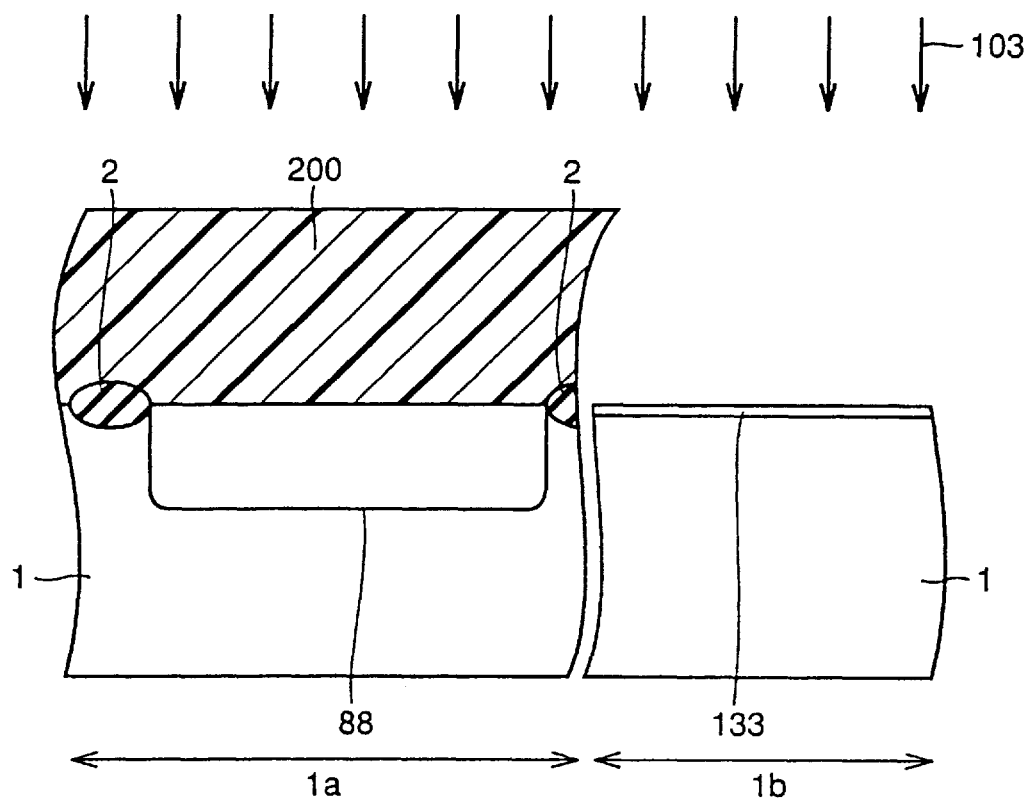
FIGS. 47 to 49 are cross sections showing, in this order, the steps of manufacturing the semiconductor device shown in FIG. 46.

Referring to FIG. 47, an LOCOS oxide film 2 is formed on silicon substrate 1, as in the first embodiment. Thereafter, similar to the first embodiment, a p well 88 is formed in silicon substrate 1. Thereafter, a resist 200 is formed to cover gate array portion 1a. Using the resist 200 as a mask, boron ions represented by the arrow 103 are implanted to silicon substrate 1 with the implantation energy of 20 KeV and a dosage of $7 \times 10^{12}/cm^2$. Thus the p type impurity region 133 as the channel doped region is formed. Impurity concentration of impurity region 133 is $n_{Flash}$ ($7 \times 10^{17}/cm^3$).

Figure 48:
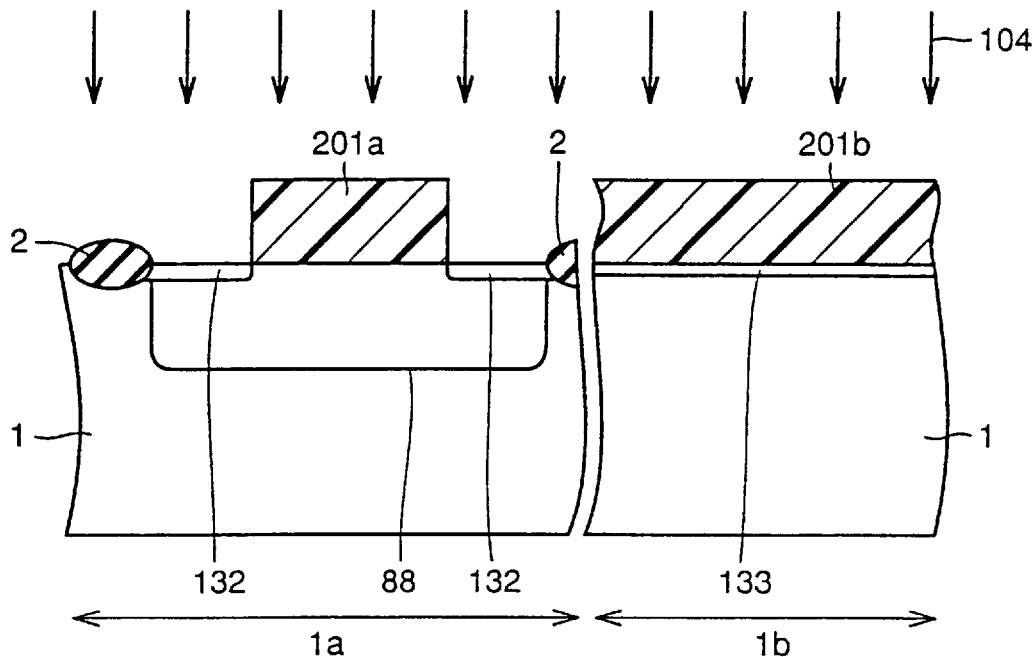

Referring to FIG. 48, a resist 201b covering memory cell portion 1b is formed. Further, a resist 201a covering a portion of gate array portion 1a is formed. Using resists 201a and 201b as masks, boron ions are implanted to silicon substrate 1 as represented by the arrow 104, with the implantation energy of 20 KeV and the dosage of $1 \times 10^{13}/cm^2$. Thus p type impurity region 132 as a channel doped region is formed. Impurity concentration of impurity region 13 is $n_{FS}$ ($1 \times 10^{18}/cm^3$).

Figure 49:
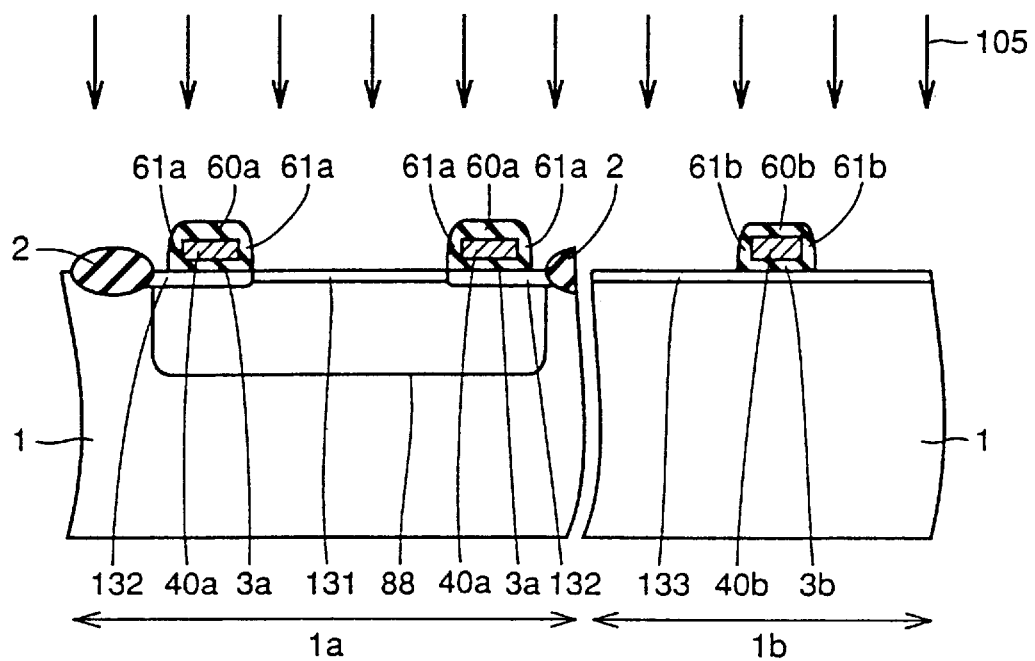

Referring to FIG. 49, through the steps shown in FIGS. 7 to 11 of the first embodiment, oxide films 3a and 3b, separation electrode 40a, floating gate electrode 40b and oxide films 60a, 61a, 60b, and 61b are formed. Thereafter, by implanting boron ions to the silicon substrate as represented by the arrow 105 with the implantation energy of 20 KeV and the dosage of $6 \times 10^{12}/cm^2$, p type impurity region 131 as the channel doped region is formed. The impurity concentration of impurity region 131 is $n_{GA}$ ($6 \times 10^{17}/cm^3$).

Figure 46:
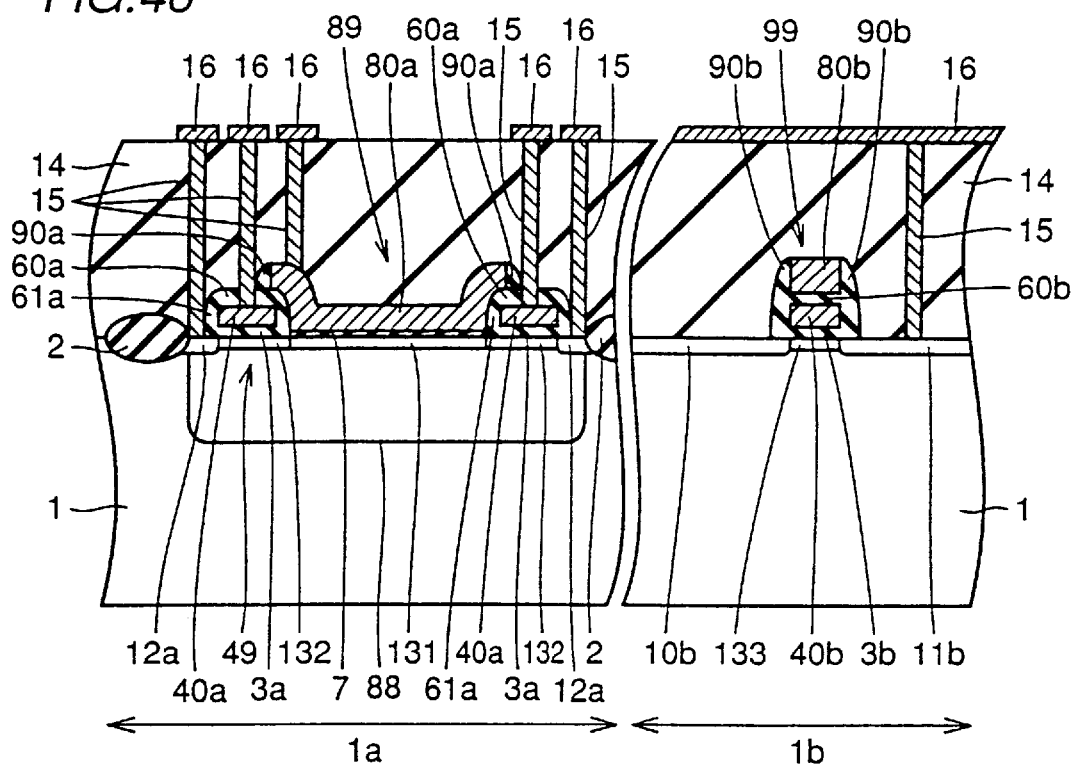
FIG. 46 is a cross section showing a semiconductor device in accordance with a fifth embodiment of the present invention.

Thereafter, through the steps shown in FIGS. 12 to 17 and 3 of the first embodiment, the semiconductor device shown in FIG. 46 is completed.

As described above, the semiconductor device and manufacturing method thereof in accordance with the fifth embodiment provides similar effects as the first embodiment. Further, impurity region 131 (having the impurity concentration of $n_{GA}$) is formed as a channel doped region below gate electrode 80a. Impurity region 132 (having the impurity concentration of $n_{FS}$) is formed as a channel doped region below separation electrode 40a. Impurity region 133 (having the impurity concentration of $n_{Flash}$) is formed as a channel doped region below floating gate electrode 40b. There is a relation $n_{GA} < n_{Flash} \leq n_{FS}$ between the impurity concentrations. Here, the relation $V \approx Vo + k \cdot T \cdot \sqrt{n}$ holds between threshold voltage V of respective electrode, impurity concentration n of the channel doped region and thickness T of the oxide film between the electrode and the channel doped region, where k is a proportional constant, Vo is a constant. Therefore, according to the present invention, there is the relation $V_{GA} < V_{Flash} \leq V_{FS}$, provided that T is constant, where $V_{GA}$ represents the threshold value of gate electrode 80a, $V_{Flash}$ represents the threshold voltage of floating gate electrode 40b, and $V_{FS}$ represents the threshold voltage of separation electrode 40a. Accordingly, the field effect transistor 89 in gate array portion 1a can operate at a high speed as it has low threshold value, while in the separation portion 49, leak current is reduced, as the threshold value is high.

Further, in the step shown in FIG. 49, boron ions represented by the arrow 105 are implanted to the entire surface of silicon substrate 1. However, the dosage at this time is sufficiently small so as not to affect impurity concentration of n+ electrode 19a and n type impurity regions 10a and 11a.

Sixth Embodiment

In the fifth embodiment, impurity regions 132 and 133 are formed before forming separation electrode 40a and floating gate electrode 40b. However, in the sixth embodiment, impurity regions 132 and 133 are formed after floating gate electrode 40b and separation electrode 40a are formed.

Figure 50:
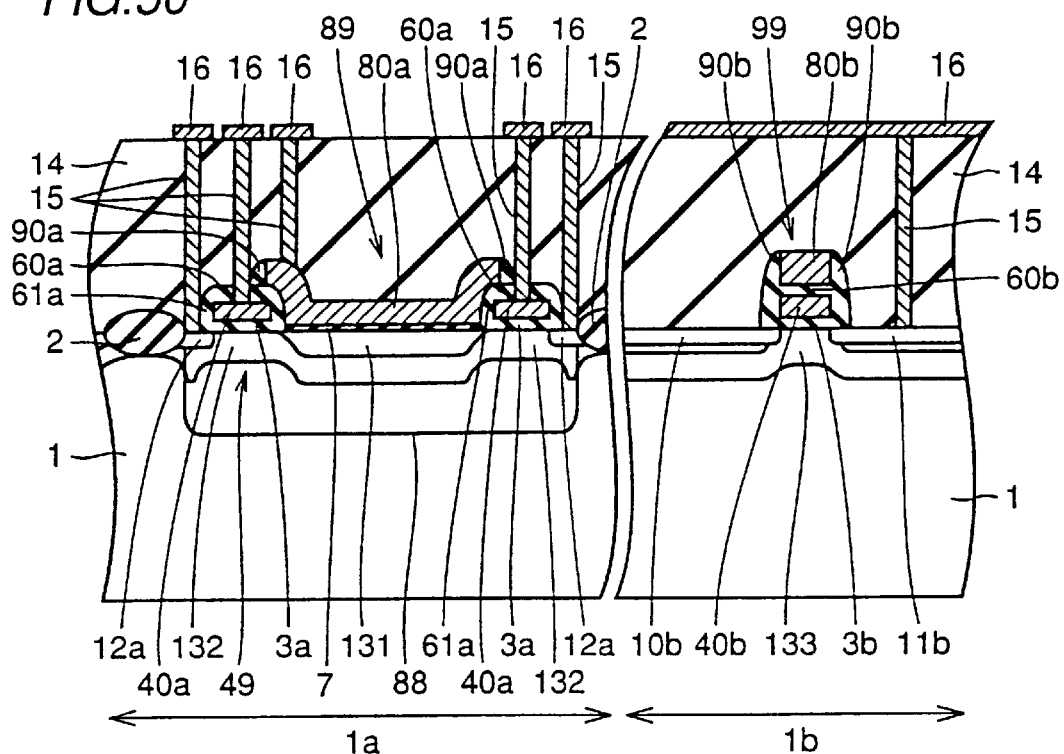
FIG. 50 is a cross section showing a semiconductor device in accordance with a sixth embodiment of the present invention.

Referring to FIG. 50, p type impurity region 132 as a channel doped region is formed below separation electrode 40a. Below floating gate electrode 40b, p type impurity region 133 as a channel doped region is formed. Impurity regions 132 and 133 have the same impurity concentration. Impurity regions 132 and 133 are formed after separation electrode 40a and floating gate electrode 40b are formed. Impurity region 132 extends below impurity region 131. Impurity region 133 extends below impurity regions 10b and 11b. Except these points, this embodiment is the same as the fifth embodiment shown in FIG. 46.

The method of manufacturing the semiconductor device shown in FIG. 50 will be described with reference to FIG. 51.

First, through the steps shown in FIGS. 6 to 11 of the first embodiment, LOCOS oxide film 2, oxide films 3a, 3b, 60a, 60b, 61a, 61b, separation electrode 40a, floating gate electrode 40b and p well 88 are formed on silicon substrate 1. Thereafter, by implanting boron ions represented by the arrow 106 to silicon substrate 1 with implantation energy of 70 KeV and a dosage of $1 \times 10^{13}/cm^2$, p type impurity regions 132 and 133 are formed. Impurity regions 132 and 133 have the same impurity concentration. Thereafter, through the steps shown in FIG. 45 of the fifth embodiment, impurity region 131 is formed. After the steps shown in FIGS. 12 to 17 and FIG. 3 of the first embodiment, the semiconductor device is completed.

Figure 51:
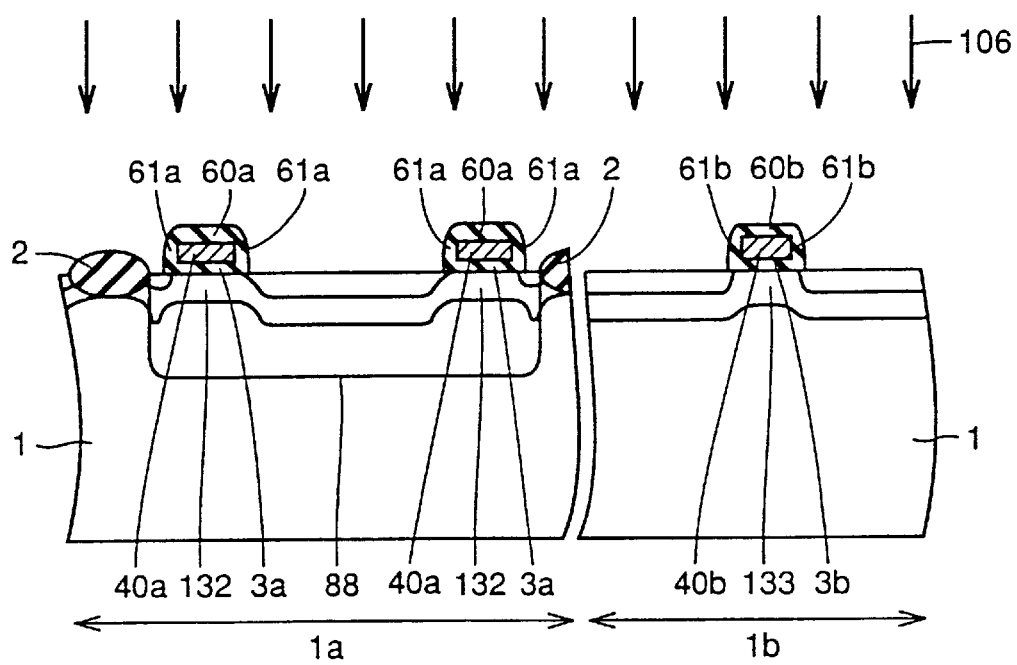
FIG. 51 is a cross section showing a step of manufacturing the semiconductor device shown in FIG. 50.

As described above, in the semiconductor device and the manufacturing method thereof in accordance with the sixth embodiment, impurity regions 132 and 133 can be formed simultaneously in the step shown in FIG. 51. Therefore, in addition to the effects obtained by the fifth embodiment, it has an advantage that the number of manufacturing steps can further be reduced.

Another process steps for manufacturing the semiconductor device shown in FIG. 50 will be described with reference to FIGS. 52 and 53.

Figure 52:
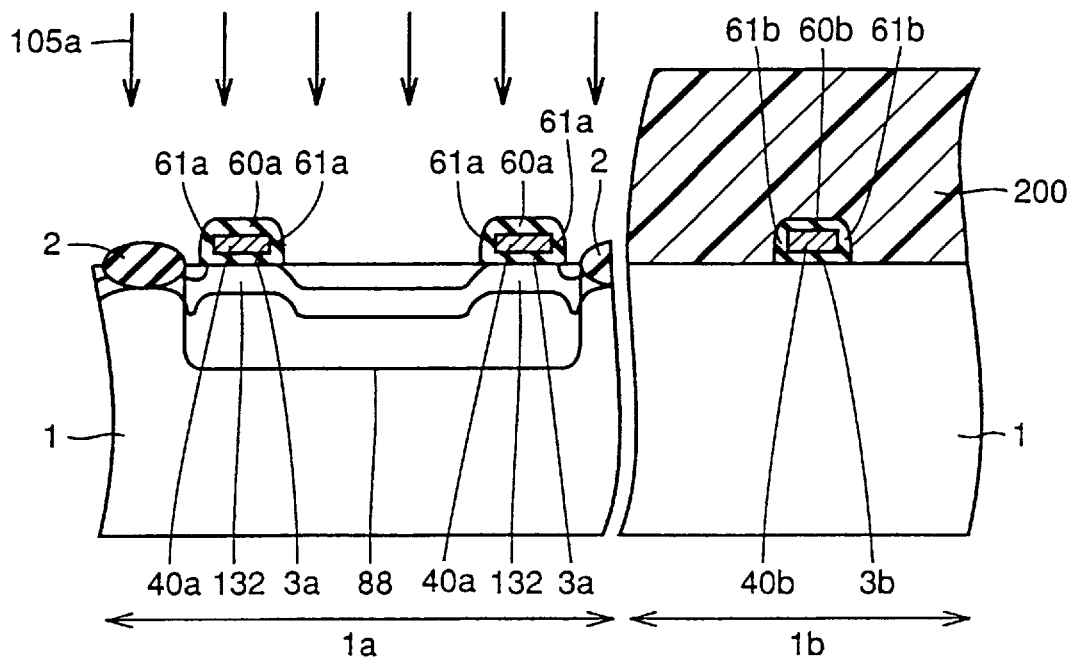
FIGS. 52 and 53 are cross sections showing, in this order, different steps of manufacturing the semiconductor device shown in FIG. 50.
Figure 60:
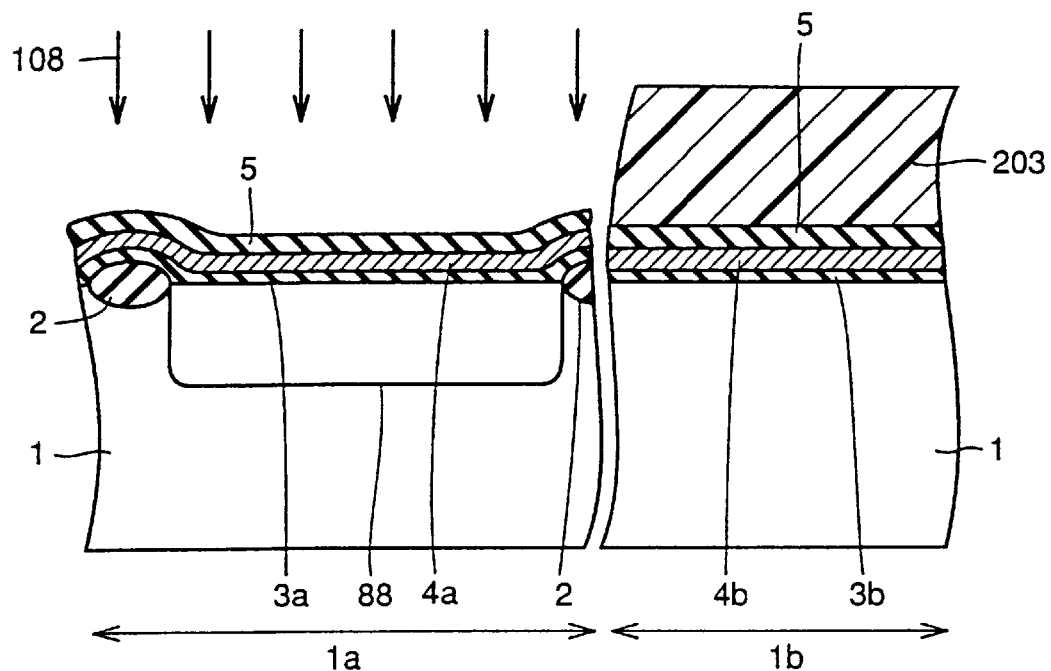
FIGS. 60 and 61 are cross sections showing, in this order, the steps of manufacturing the semiconductor device shown in FIG. 59.
Figure 61:
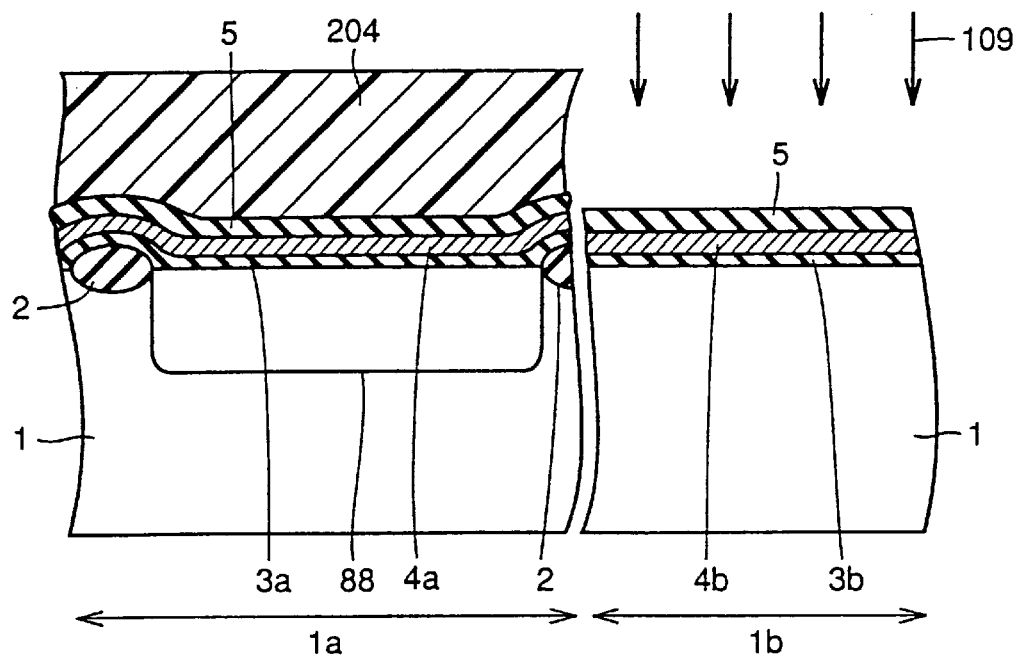

Referring to FIG. 52, through the steps shown in FIGS. 60 to 61 of the first embodiment, LOCOS oxide film 2, oxide films 3a, 3b, 60a, 60b, 61a, 61b, floating gate electrode 40b, separation electrode 40a and p well 88 are formed on silicon substrate 1. Thereafter, memory cell portion 1b is covered with resist 200, and boron ions represented by arrows 105a are implanted to the gate array portion 1a of silicon substrate 1 with implantation energy of 70 KeV and a dosage of $1 \times 10^{13}/cm^2$, whereby p type impurity region 132 as the channel doped region is formed.

Figure 53:
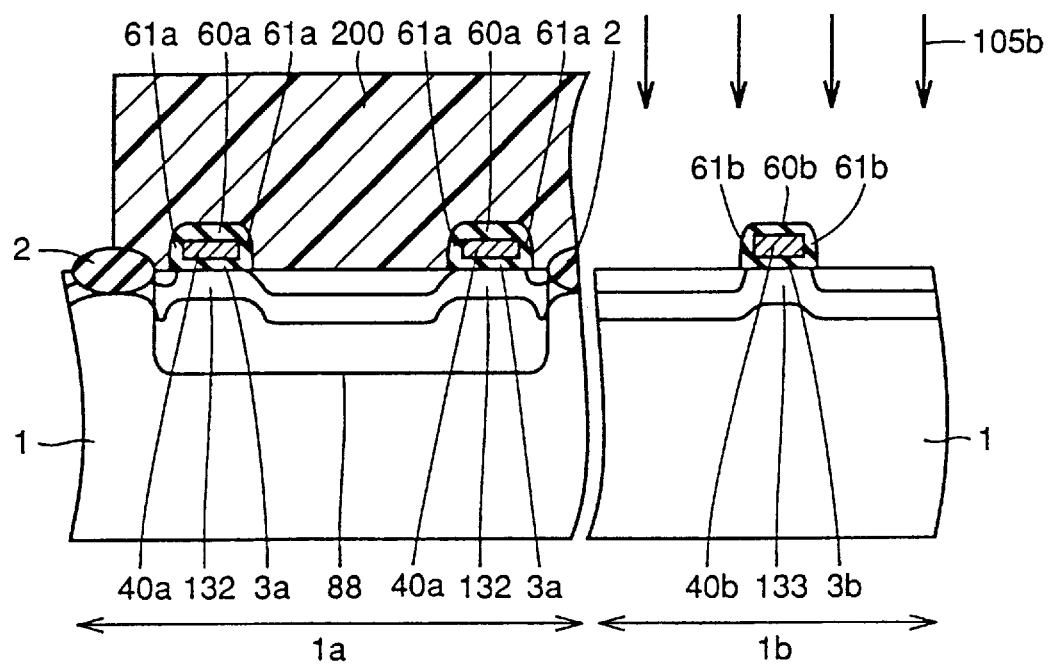

Referring to FIG. 53, gate array portion 1a is covered with resist 200, and boron ions represented by arrows 105b are implanted to the memory cell portion 1b of silicon substrate 1 with the implantation energy of 70 KeV and a dosage of $7 \times 10^{12}/cm^2$, whereby p type impurity region 133 as the channel doped region is formed. Thereafter, through the steps shown in FIG. 49 of the fifth embodiment and the steps shown in FIGS. 12 to 17 of the first embodiment, the semiconductor device shown in FIG. 50 is completed.

In the semiconductor device and manufacturing method thereof described above, as compared with the process step shown in FIG. 51, the number of process steps is increased by one. However, impurity concentrations of impurity regions 132 and 133 can be controlled independent from each other. Therefore, threshold voltage of separation electrode 40a and threshold voltage of floating gate electrode 40b can be controlled independent from each other.

Further, the semiconductor device shown in FIG. 50 can be obtained by performing ion implantation shown in FIG. 53 first, followed by ion implantation shown in FIG. 52.

Seventh Embodiment

In the sixth embodiment, an impurity region is not formed below LOCOS oxide film 2. In the seventh embodiment, an impurity region 132a as a channel stopper is formed below LOCOS oxide film 2. The thickness ($t_b$ in the figure) of LOCOS oxide film 2a is 200 nm. The height ($t_a$ in the figure) from the surface of silicon substrate 1 to the top surface of oxide film 60a and the height ($t_a$ in the figure) from the surface of silicon substrate 1 to the top surface of oxide film 60b are also 200 nm. Except these points, the embodiment is similar to the sixth embodiment shown in FIG. 50.

Figure 54:
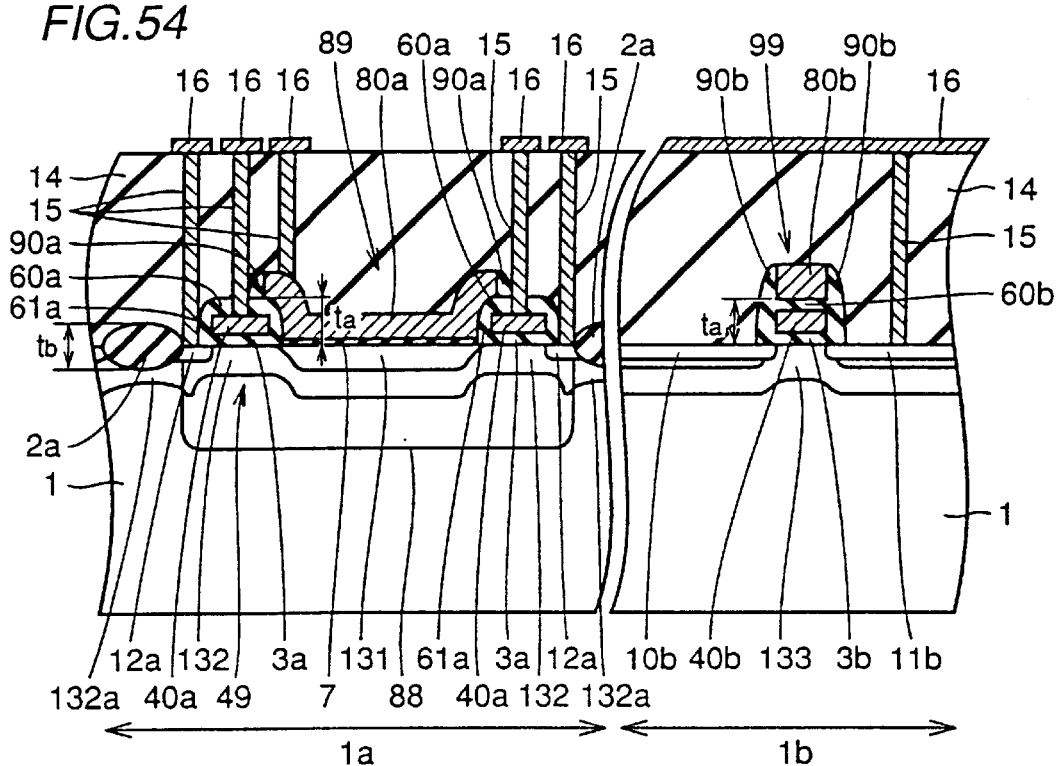
FIG. 54 is a cross section showing a semiconductor device in accordance with a seventh embodiment of the present invention.
Figure 55:
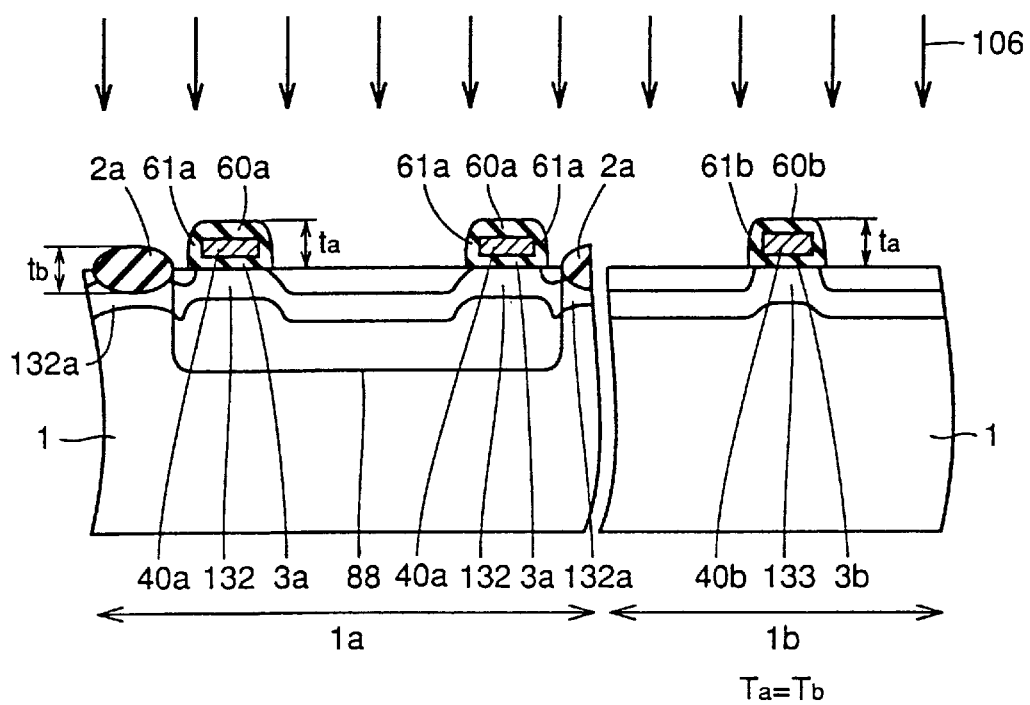
FIG. 55 is a cross section showing a step of manufacturing the semiconductor device shown in FIG. 54.

Referring to FIG. 55, the method of manufacturing the semiconductor device shown in FIG. 54 will be described.

Referring to FIG. 55, through the steps shown in FIGS. 6 to 11 of the first embodiment, LOCOS oxide film 2, oxide films 3a, 3b, 60a, 60b, 61a and 61b, separation electrode 40a, floating gate electrode 40b and p well 88 are formed on silicon substrate 1. At this time, the thickness ($t_b$) of LOCOS oxide film 2a is 200 nm. The height ($t_a$) from the surface of silicon substrate 1 to the top surface of oxide film 60 and the height ($t_a$) from the surface of silicon substrate 1 to the top surface of oxide film 60b are 200 nm. Thereafter, by implanting boron ions to silicon substrate 1 with implantation energy of 70 KeV and a dosage of $1 \times 10^{13}/cm^2$, impurity regions 132, 132a and 133 are formed. Impurity concentration of impurity regions 132, 132a and 133 is $1 \times 10^{18}/cm^3$. Thereafter, through the step shown in FIG. 49 of the fifth embodiment, the step shown in FIGS. 12 to 17 of the first embodiment and the step shown in FIG. 3, the semiconductor device shown in FIG. 54 is completed.

In the semiconductor device and the manufacturing method in accordance with the seventh embodiment described above, effects similar to the fifth embodiment can be obtained. Further, since impurity region 132a as a channel stopper is formed below LOCOS oxide film 2, the capability of separation of the LOCOS oxide film 2 can be improved. Since the impurity region 132a as the channel stopper is manufactured through the same steps as other impurity regions 132 and 133 as shown in FIG. 55, the steps of manufacturing is not increased.

Eighth Embodiment

In the first embodiment, thicknesses of oxide films 3a and 3b and of the gate oxide film 7 are not specified. In the eighth embodiment, there is a relation $T_{GA}<T_{Flash}\leq T_{FS}$ between the thickness $T_{FS}$ of oxide film 3d, the thickness $T_{Flash}$ of oxide film 3e and thickness $T_{GA}$ of gate oxide film 7a. Except this point, the embodiment is the same as the first embodiment shown in FIG. 3.

Figure 56:
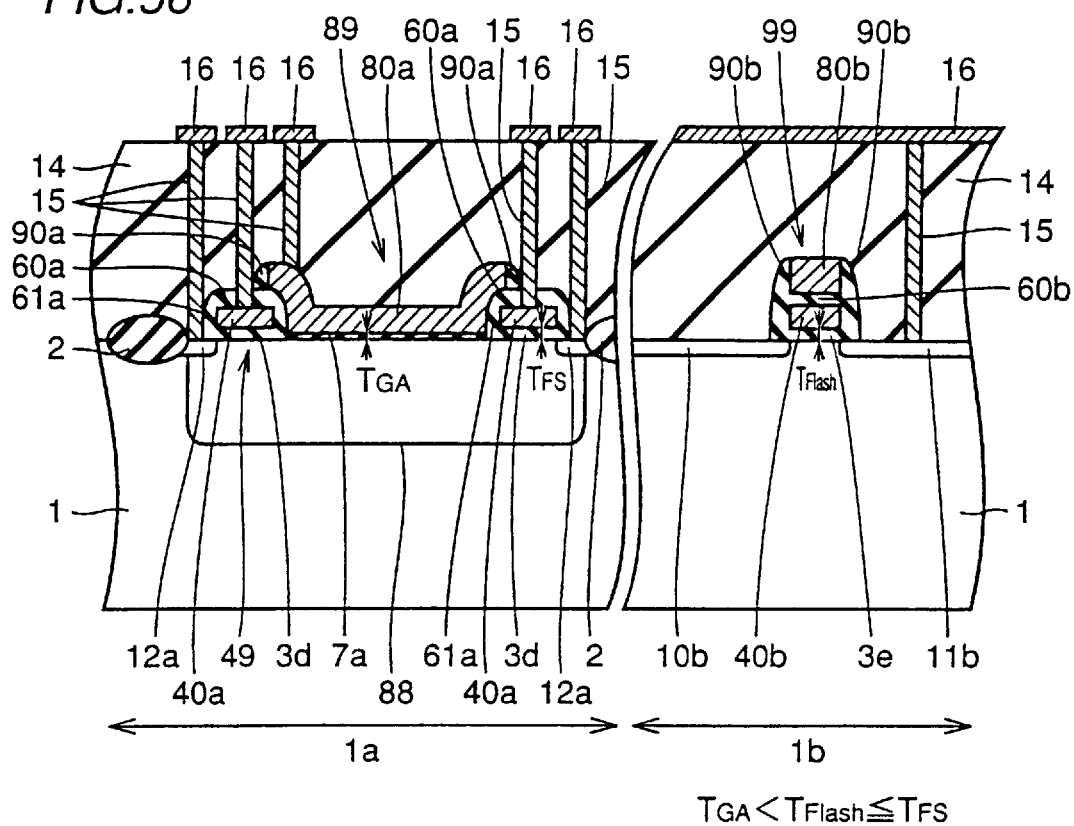
FIG. 56 is a cross section showing a semiconductor device in accordance with an eighth embodiment of the present invention.

The method of manufacturing the semiconductor device shown in FIG. 56 will be described.

The semiconductor device in which $T_{GA}<T_{Flash}=T_{FS}$ holds can be manufactured through the step shown in FIGS. 6 to 17 and 3 of the first embodiment.

Figure 57:
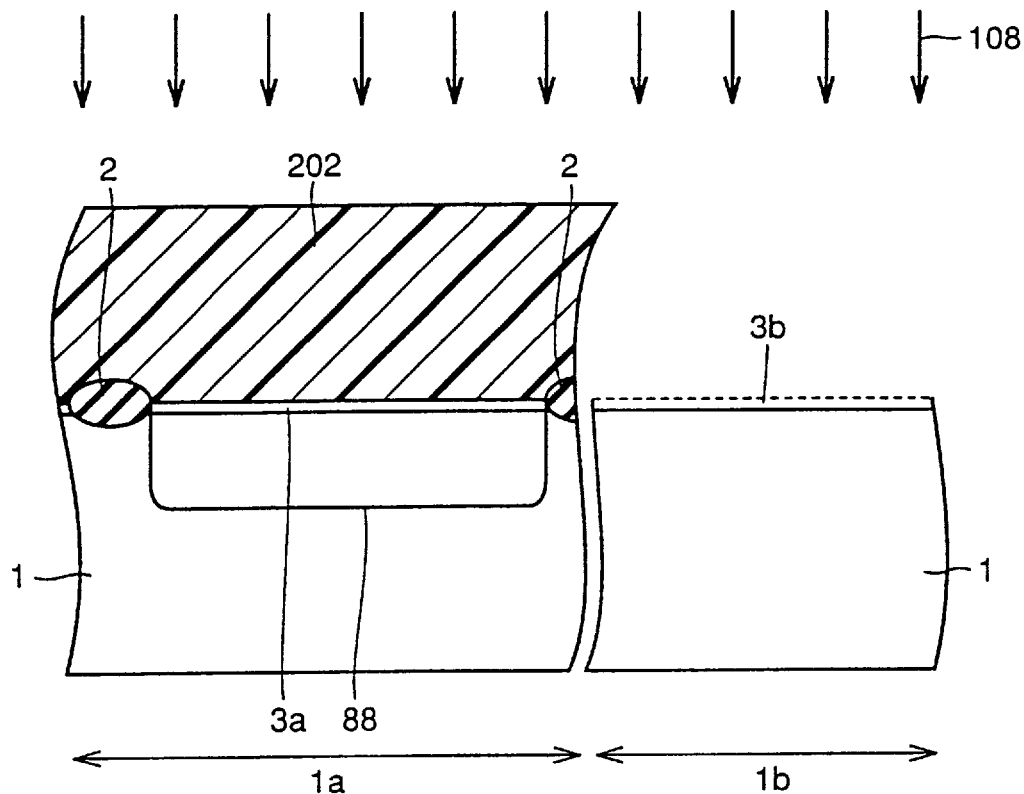
FIGS. 57 and 58 are cross sections showing, in this order, the steps of manufacturing the semiconductor device shown in FIG. 56.
Figure 58:
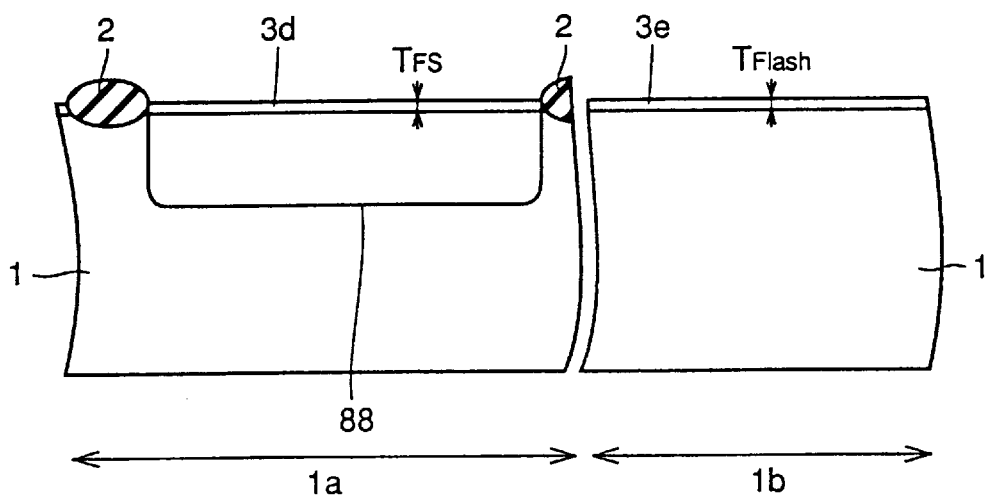

Referring to FIGS. 57 and 58, the method of manufacturing the semiconductor device in which $T_{GA}<T_{Flash}\leq T_{FS}$ will be described.

First, referring to FIG. 57, LOCOS oxide film 2 having the thickness of 400 nm is formed on silicon substrate 1 by the LOCOS method. Thereafter, oxide films 3a and 3b having the thickness of 15 nm are formed by thermal oxidation on the surface of silicon substrate 1. Resist 202 is formed at gate array portion 1a, and oxide film 3b is removed by etching, by hydrofluoric acid represented by the arrow 108.

Referring to FIG. 58, by thermal oxidation, an oxide film is deposited to the thickness of 15 nm on the oxide film 3a in gate array portion 1a. In memory cell portion 1b, an oxide film is deposited to the thickness of 15 nm on the surface of silicon substrate 1. In this manner, an oxide film 3d having the thickness $T_{FS}$=30 nm is formed in gate array portion 1a. In memory cell portion 1b, an oxide film 3e having the thickness $T_{Flash}$=15 nm is formed. Thereafter, in the gate array portion, p well 8 and an n well are formed, and through the steps shown in FIGS. 8 to 17 and 3 of the first embodiment, the semiconductor device shown in FIG. 56 is completed. In the step shown in FIG. 12, gate oxide film 7a is formed. At this time, the thickness of gate oxide film 7a is 6 nm, as in the first embodiment. The threshold values are $V_{FS}$=1.6V and $V_{Flash}$=0.8V.

In the semiconductor device and manufacturing method thereof in accordance with the eighth embodiment described above, there is a relation $T_{GA}<T_{Flash}\leq T_{FS}$ between the thickness $T_{GA}$ of gate oxide film 7, thickness $T_{Flash}$ of oxide film 3c and thickness $T_{FS}$ of oxide film 3d. Here, as already described in the fifth embodiment, the relation $V\approx Vo+k.T.\sqrt{n}$ holds between the threshold voltage V, impurity concentration n of the channel doped region and the thickness T of the oxide film. Therefore, provided that n is constant in the semiconductor device of the eighth embodiment, the relation $V_{GA}<V_{Flash}\leq V_{FS}$ holds. Therefore, in the eighth embodiment, transistor 89 can operate at a high speed, while leak current is reduced in the separating portion 49.

Ninth Embodiment

In the fifth embodiment, as shown in FIG. 46, separation electrode 40a is of n type, impurity region 132 is of the p type, floating gate electrode 40b is of the n type and impurity region 133 is of the p type. In the ninth embodiment, referring to FIG. 59, separation electrode 41a is of the p type, impurity region 132 is of the p type, floating gate electrode 41b is of the n type and impurity region 133 is of the p type. Except this, the embodiment is the same as the fifth embodiment shown in FIG. 46.

Figure 59:
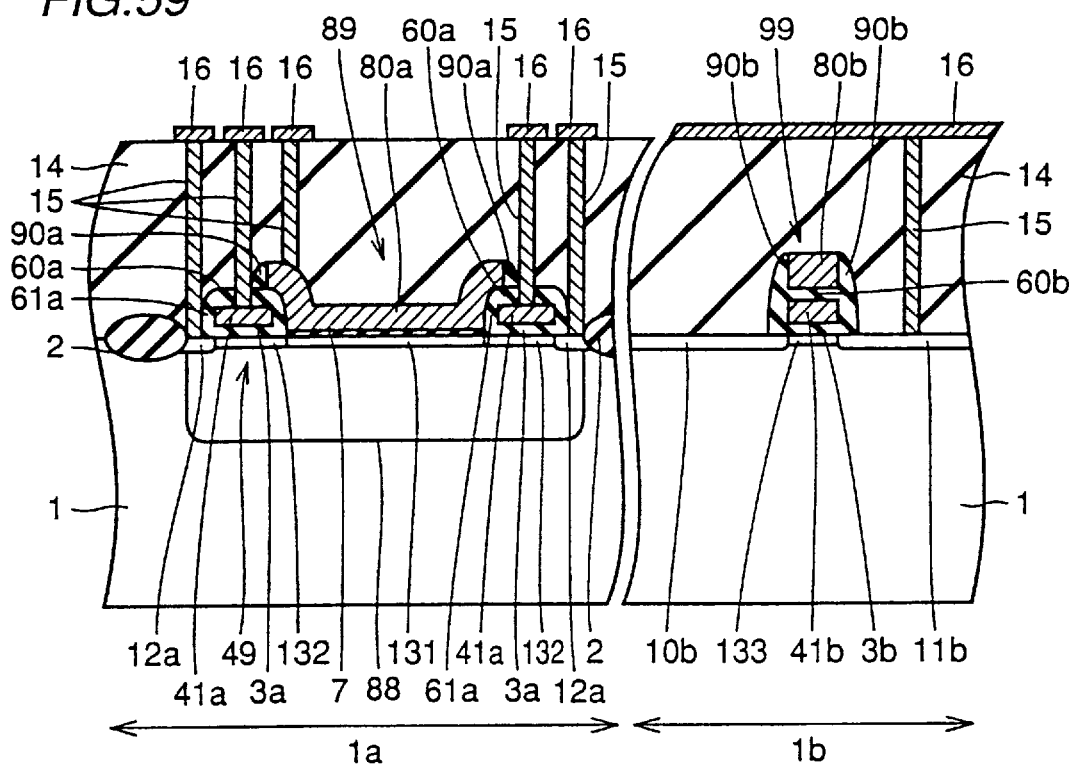
FIG. 59 is a cross section showing a semiconductor device in accordance with a ninth embodiment of the present invention.

The method of manufacturing the semiconductor device shown in FIG. 59 will be described with reference to FIGS. 60 and 61.

First, referring to FIG. 60, an LOCOS oxide film 2 is formed by the LOCOS method on silicon substrate 1. Thereafter, oxide films 3a and 3b having the thickness of 6 nm are formed by thermal oxidation to cover silicon substrate 1. Polycrystalline 4 is formed by the CVD method to cover oxide films 3a and 3b. Thereafter, nitrogen is introduced to polycrystalline silicon 4 with implantation energy of 10 keV and a dosage of $5\times 10^{15}/cm^2$. Thereafter, an oxide film 5 is formed by the CVD method on the polycrystalline silicon 4. Thereafter, resist 203 is formed in the memory cell portion 1b. Using the resist 203 as a mask, boron, represented by the arrow 108 is implanted to the polycrystalline silicon 4 with the implantation energy of 10 keV and a dosage of $5\times 10^{15}/cm^2$, thus providing a p type doped polycrystalline silicon 4a.

Referring to FIG. 61, resist 203 is removed, and resist 204 is formed on gate array portion 1a. Using resist 204 as a mask, phosphorus as represented by the arrow 109 is implanted to polycrystalline silicon 4 with the implantation energy of 10 keV and the dosage of $5\times 10^{15}/cm^2$, providing an n type doped polycrystalline silicon 4b. Thereafter, through the steps shown in FIGS. 9 to 17 and 3 of the first embodiment, the semiconductor device shown in FIG. 59 is completed.

In the semiconductor device and manufacturing method thereof described above, separation electrode 41a is of the p type, and impurity region 132 positioned therebelow is also of the p type. Therefore, as compared with an example where separation electrode 41a is of n type, the threshold value necessary for inverting the impurity region 132 from the p type to n type becomes higher. This suppresses generation of leak current, and hence separation of impurity regions 10a and 11a can be ensured at the separating portion 49 including the separation electrode 41a.

Tenth Embodiment

In the first embodiment, the thicknesses of oxide film 60a, oxide film 3b and interlayer oxide film 60b are not specified. In the tenth embodiment, there is a relation $T_{Flash}<T_{FG-CG}<T_{FS-GA}$ between the thickness $T_{FS-GA}$ of oxide film 62a, the thickness $T_{Flash}$ of oxide film 3b and the thickness $T_{FG-CG}$ of interlayer oxide film 62b. Except this point, the embodiment is the same as the first embodiment shown in FIG. 3.

Figure 62:
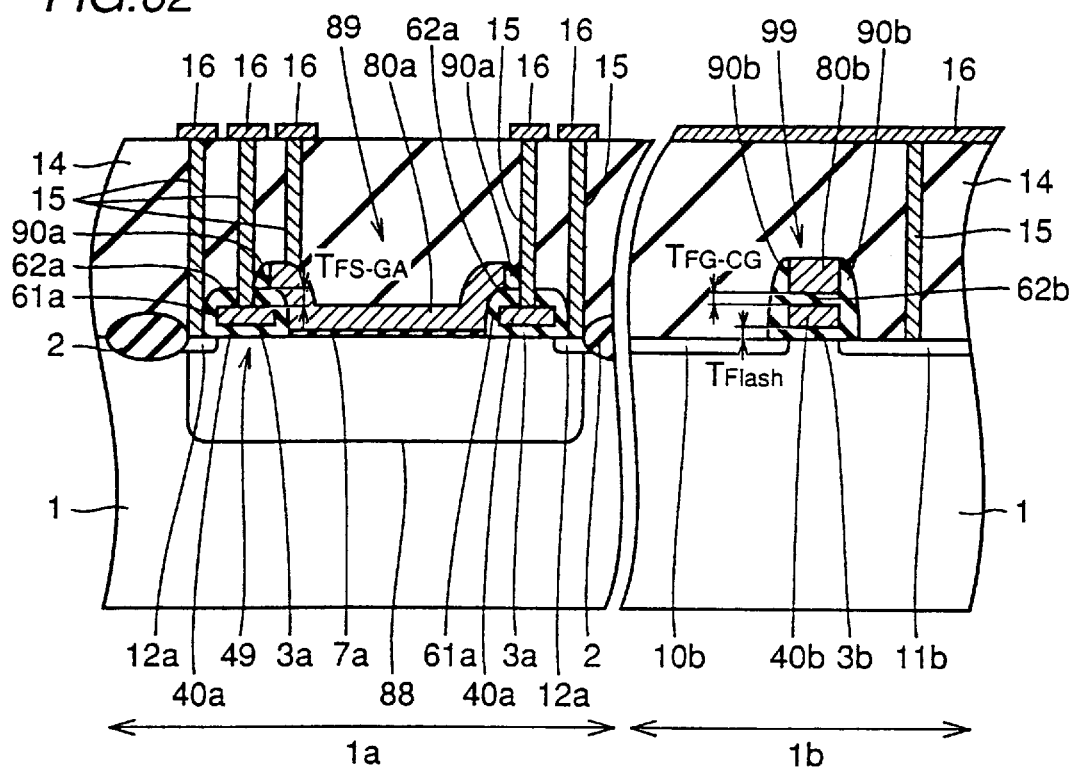
FIG. 62 is a cross section showing a semiconductor device in accordance with a tenth embodiment of the present invention.

The method of manufacturing the semiconductor device shown in FIG. 62 will be described with reference to FIGS. 63 to 66.

Figure 63:
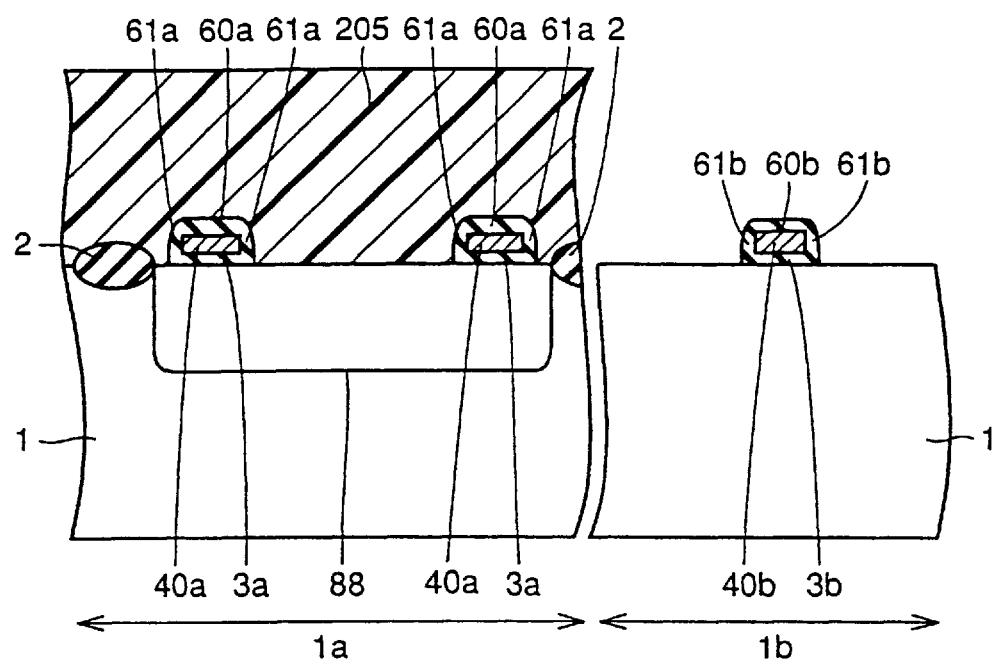
FIGS. 63 to 66 are cross sections showing, in this order, the steps of manufacturing the semiconductor device shown in FIG. 62.

Referring to FIG. 63, LOCOS oxide film 2, oxide films 3a, 3b, 60a, 60b, 61a, 61b and p well 88 are formed on silicon substrate 1 through the steps shown in FIGS. 6 to 11 of the first embodiment. The thickness of oxide films 3a and 3b is 6 nm. Resist 205 is formed on gate array portion 1a.

Figure 64:
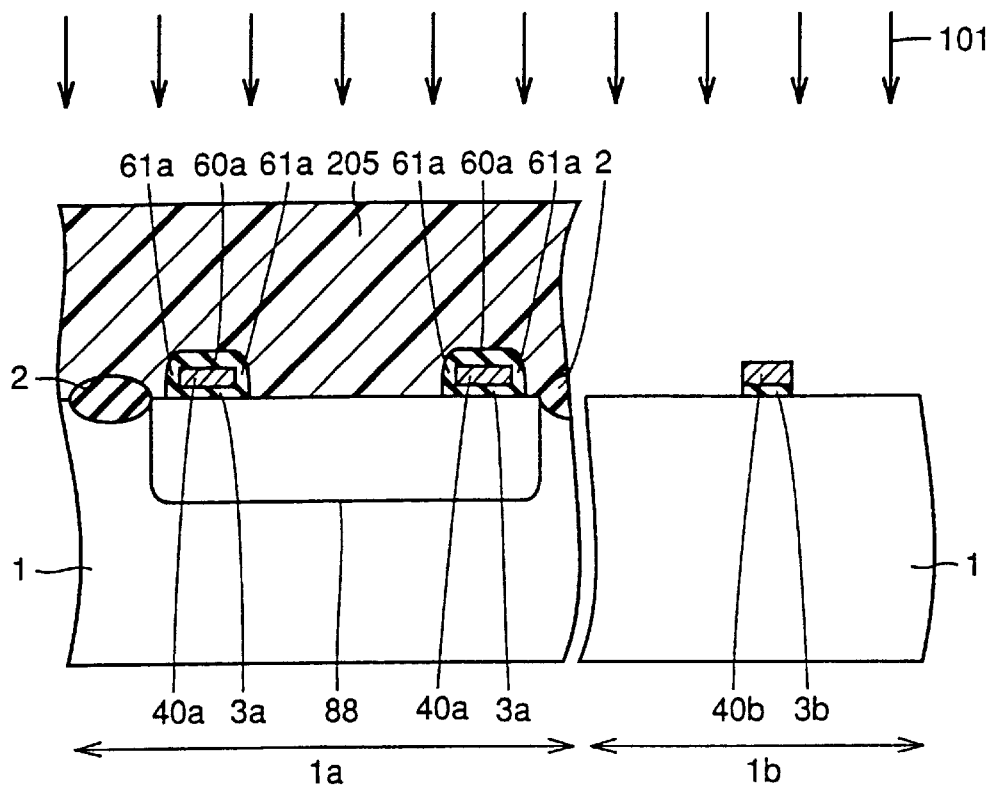

Referring to FIG. 64, oxide films 60b and 61b are etched using hydrofluoric acid represented by the arrow 101. Thus floating gate electrode 40b is exposed.

Figure 65:
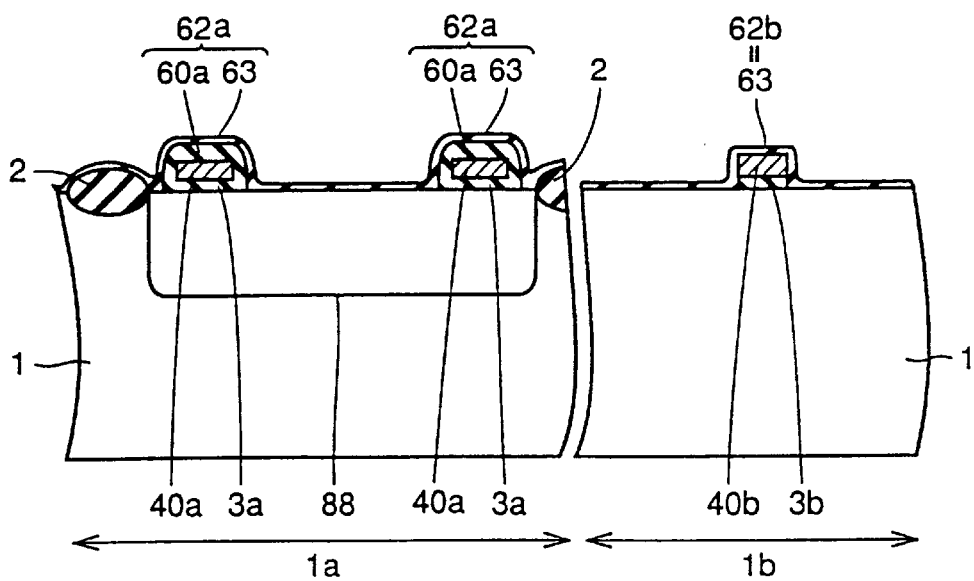

Referring to FIG. 65, an oxide film 63 having the thickness of 20 nm is formed by the CVD method to cover silicon substrate 1. Oxide film 60a and oxide film 63 on separation electrode 3a will be the oxide film 62a. Oxide film 63 on floating gate electrode 40b and the oxide film 62b.

Figure 66:
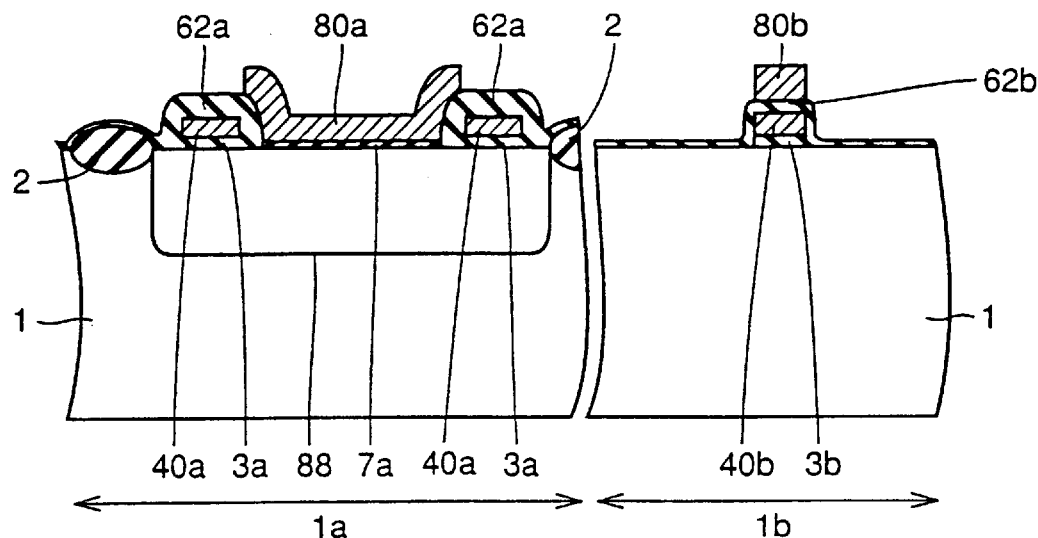

Referring to FIG. 66, a polycrystalline silicon is formed to cover silicon substrate 1, and impurity ions are implanted to the polycrystalline silicon. Thereafter, by patterning the polycrystalline silicon to a prescribed shape, gate electrode 80a and control gate electrode 80b are formed. Thereafter, through the steps shown in FIGS. 15 to 17 and 3 of the first embodiment, the semiconductor device shown in FIG. 62 is completed.

In the semiconductor device and manufacturing method thereof described above, the thickness $T_{FS-GA}$ of oxide film 62a positioned between gate electrode 80a and separation electrode 40a is made thick. Therefore, capacitance between gate electrode 80a and separation electrode 40a becomes smaller. This facilitates current flow to gate electrode 80a, enabling high speed operation of transistor 89. Further, since thickness $T_{FG-CG}$ of interlayer oxide film 62b between control gate electrode 80b and the floating gate electrode 40b is thick, charges stored in floating gate electrode 3b do not go out to control gate electrode 80b, thus suppressing malfunction of flash memory 99. Further, since thickness $T_{Flash}$ of oxide film 3b below floating gate electrode 62b is thin, high speed operation of flash memory 99 is also possible.

Eleventh Embodiment

Figure 67:
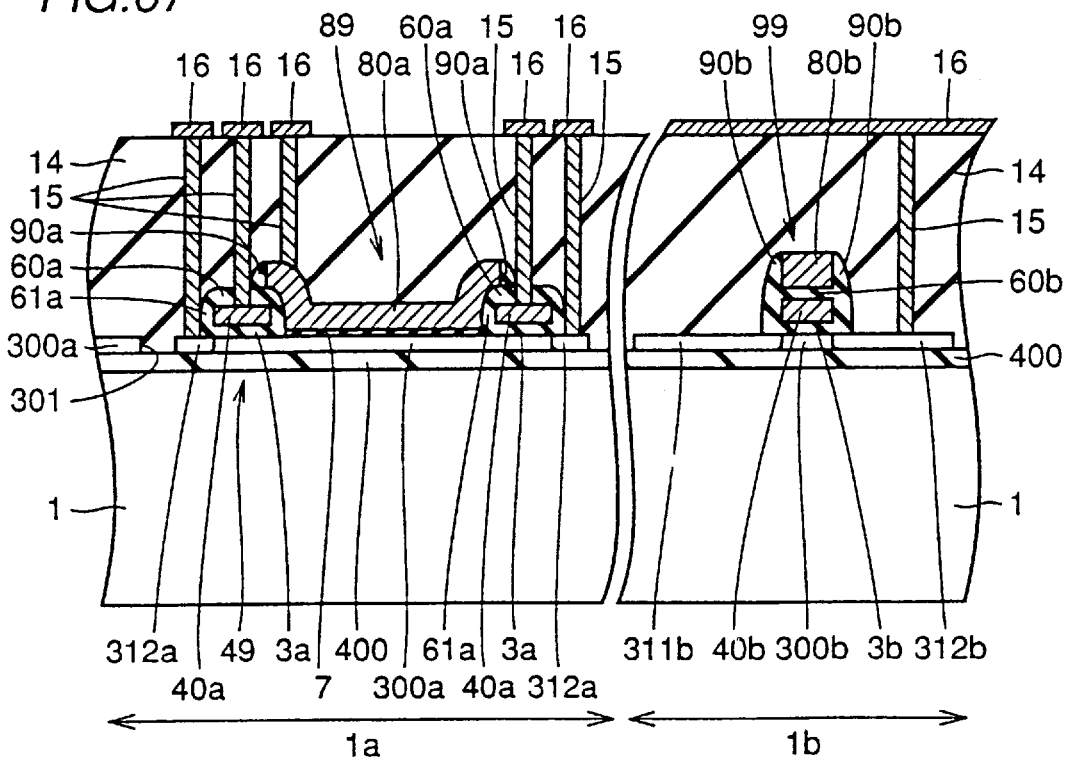
FIG. 67 is a cross section showing a semiconductor in accordance with an eleventh embodiment of the present invention.

In the first embodiment, an impurity region is formed in silicon substrate 1. In the eleventh embodiment, a buried oxide film 400 is formed on silicon substrate 1, as shown in FIG. 67, SOI (Silicon On Insulator) layers 300a and 300b are formed on the buried oxide film 400, and impurity regions 311b and 312b and a p+ electrode 312a are formed in SOI layers 300a and 300b. Further, impurity regions (not shown) corresponding to impurity regions 10a, 11a, 25a and 26a shown in FIG. 1 are also formed in semiconductor layer 300a. Meanwhile, p well 88 and n well 87 of FIG. 1 are not formed in the eleventh embodiment. Except these points, the embodiment is the same as the first embodiment shown in FIG. 3.

The method of manufacturing the semiconductor device shown in FIG. 67 will be described with reference to FIG. 68.

Figure 68:
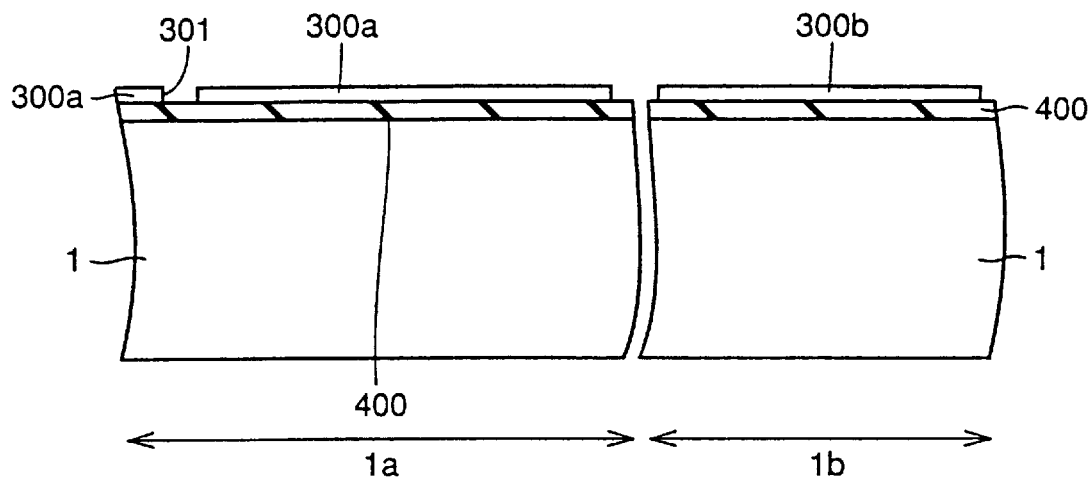
FIG. 68 is a cross section showing a step of manufacturing the semiconductor device shown in FIG. 67.

First, referring to FIG. 68, oxygen ions are implanted to silicon substrate 1 and heat treatment is performed, so that a buried oxide film 400 having the thickness of 100 nm is formed. A portion upper than buried oxide film 400 will be the SOI layer. By patterning the SOI layer to a prescribed shape in accordance with a resist pattern, SOI layers 300a and 300b as well as a mesa separating portion 301 are formed. Through the step shown in FIGS. 7 to 17 and 3 of the first embodiment, transistor 89 is formed on SOI layer 300a, flash memory 99 is formed on SOI layer 300b and thus the semiconductor device shown in FIG. 67 is completed.

In the semiconductor device and the manufacturing method in accordance with the eleventh embodiment described above, in addition to the effects obtained by the first embodiment, there are the following advantages. Namely, flash memory 99 formed in SOI layers 300a and 300b is more susceptible to avalanche breakdown as compared with the transistor formed in a bulk silicon substrate 1, which means writing is possible with a lower voltage. Further, transistors 89 and flash memory 99 are separated from each other three-dimensionally. Therefore, parasitic resistance between the transistors can be reduced, enabling high speed operation of the transistors.

Further, since transistor 89 and flash memory 99 are electrically separated from each other, even when a high voltage is applied to control gate 80b, the voltage does not reach transistor 89. Therefore, malfunction of transistor 89 can be prevented.

Figure 69:
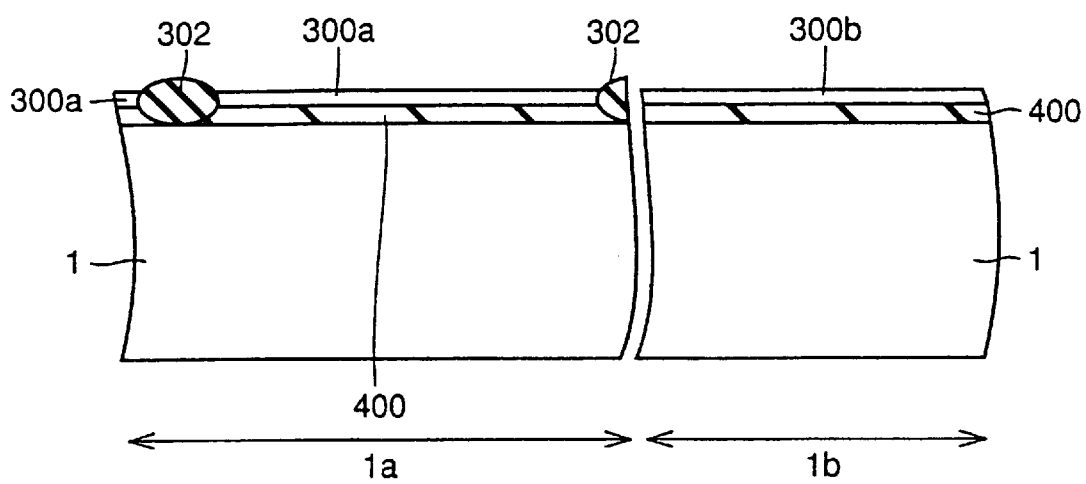
FIG. 69 is a cross section showing another step of manufacturing the semiconductor device in accordance with the eleventh embodiment of the present invention.
Figure 70:
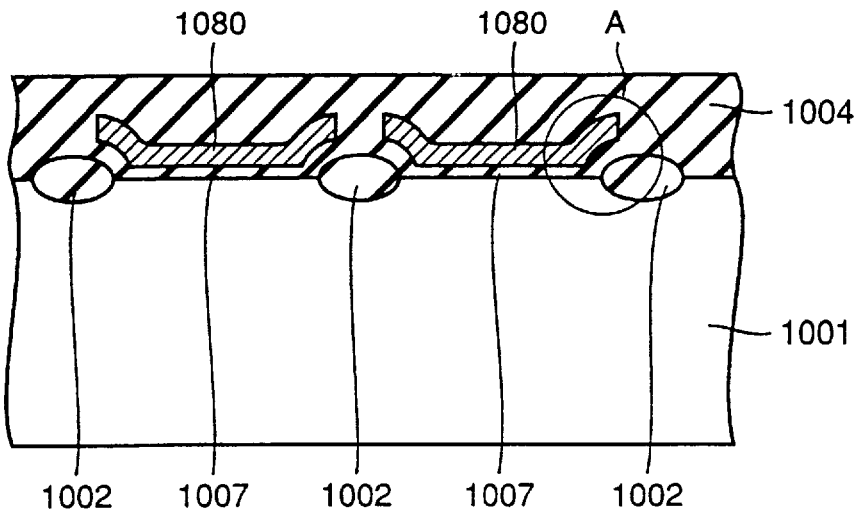
FIG. 70 is a cross section showing transistors separated by a conventional LOCOS oxide film.
Figure 71:
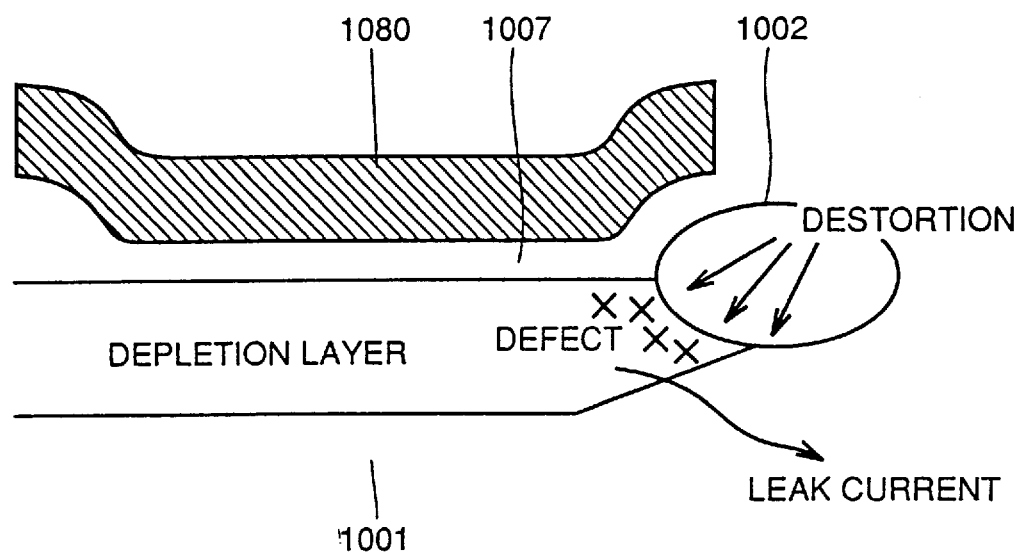
FIG. 71 is a cross section showing, in enlargement, a region separated by the conventional LOCOS.
Figure 72:
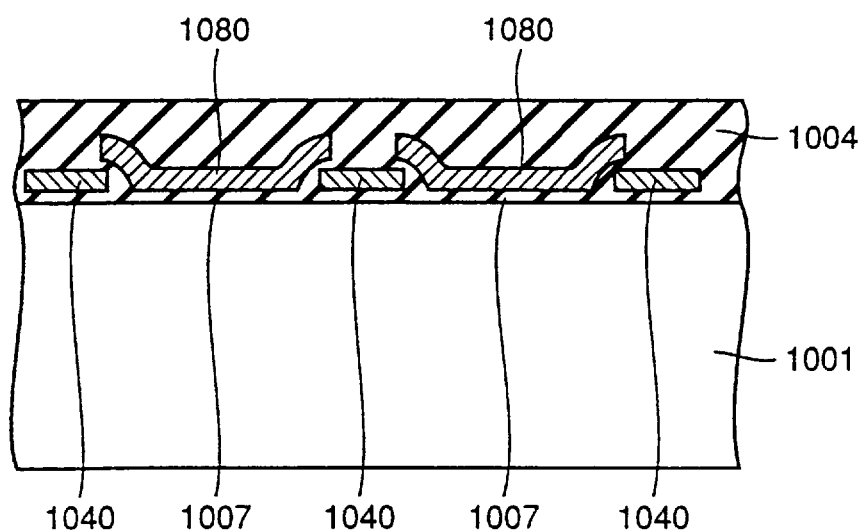
FIG. 72 is a cross section showing transistors separated by the conventional separation electrode.

Referring to FIG. 69, similar effects can be obtained when the plurality of semiconductor layers 300a are formed by LOCOS oxide films 302.

Effects of the invention are, in summary, as follows.

In the semiconductor device, the first separation electrode and the floating gate electrode have approximately the same thickness, and hence the first separation electrode and the floating gate electrode can be formed through the same steps. Accordingly, a semiconductor device having a plurality of field effect transistors separated by the first separation electrode and a non-volatile memory cell transistor can be obtained through simple process steps.

In the present invention, since the plurality of field effect transistors include a plurality of gate electrodes and the plurality of impurity regions, a gate array is provided. Accordingly, a semiconductor device including field effect transistors separated by the separation electrode and constituting a gate array, and a non-volatile memory cell transistor can be obtained through simple manufacturing steps.

In the present invention, since the second sidewall insulating film formed on the sidewall of the floating gate is narrow, when impurity ions are introduced to the semiconductor substrate using the second sidewall insulating film as a mask, an impurity region can be formed closed to the floating gate electrode. Therefore, the distance between the floating gate electrode and the impurity region can be made small. This means that an avalanche breakdown at an end portion of the impurity region is more likely. As a result, a semiconductor device including a field effect transistor and a non-volatile memory cell transistor in which writing and erasure of the non-volatile memory cell transistor is easy can be obtained through simple manufacturing steps.

Further, according to the present invention, a semiconductor device can be obtained in which the control gate electrode and the floating gate electrode have the same gate length.

In the present invention, the plurality of non-volatile memory cell transistors can be surely separated by the second separating portion. Since the second separation electrode has approximately the same thickness as the first separation electrode, the first separation electrode, the second separation electrode and the floating gate electrode come to have approximately the same thickness. Therefore, the first and second separation electrodes and the floating gate electrode can be formed through the same steps. Accordingly, a semiconductor device including a plurality of field effect transistors separated by the first separation electrode and a plurality of non-volatile memory cell transistors separated by the second separation electrode can be obtained through simple manufacturing steps.

Further, a semiconductor device can be obtained in which the floating gate electrode has a ring-shape.

In the present invention, since the third impurity concentration is higher than the first impurity concentration, the threshold voltage of the non-volatile memory cell transistor positioned on the third impurity region is higher than the threshold value of the field effect transistor positioned on the first impurity region. Further, since the second impurity concentration is not lower than the third impurity concentration, the threshold value of the separating portion positioned on the second impurity region is higher than the threshold value of the non-volatile memory cell transistor positioned on the third impurity region. Therefore, a semiconductor device can be obtained which includes a field effect transistor capable of high speed operation and surely separated from the non-volatile memory cell transistor by the separation electrode.

In the present invention, the fourth impurity region below the separating oxide film serves as a channel stopper, and hence separation by the separating oxide film is ensured. Further, since the second, third and fourth impurity concentrations are the same, the second, third and fourth impurity regions can be formed through the same steps and hence the semiconductor device can be provided through smaller number of manufacturing steps.

In the example structured as described above, the first insulating film is thicker than the second insulating film, and hence the threshold value of the non-volatile memory cell transistor positioned on the first insulating film is higher than that of the field effect transistor positioned on the second insulating film. In other words, the threshold value of the field effect transistor is lower than that of the non-volatile memory cell transistor. Further, since the third insulating film is not thinner than the first insulating film, the threshold value of the first separating portion positioned on the third insulating film is higher than the threshold value of the non-volatile memory cell transistor positioned on the first insulating film. Therefore, a semiconductor device can be obtained which includes a field effect transistor capable of high speed operation and surely separated at the separating portion, and a non-volatile memory cell transistor.

In the present invention, the potential for inverting the conductivity type of the portion of the semiconductor substrate opposing to the first separation electrode becomes higher. Therefore, the threshold value of the first separating portion becomes higher than that of the non-volatile memory cell transistor having the floating gate electrode. Therefore, a semiconductor device including field effect transistors surely separated electrically by the separation electrode and the non-volatile memory cell transistor can be manufactured through simple steps.

In the present invention, the third insulating film positioned between the first separating electrode and the gate electrode is thick, and hence capacitance between the gate electrode and the first separating electrode becomes smaller. This facilitates current flow to the gate electrode, enabling high speed operation of the field effect transistor. Further, since the second insulating film between the control gate electrode and the floating gate electrode is thick, charges stored in the floating gate electrode do not escape to the control gate electrode. As a result, malfunction of the non-volatile memory cell transistor can be suppressed. Further, since the first insulating film below the floating gate electrode is thin, field effect transistor can operate at a high speed.

In the present invention, since the first semiconductor layer on which the field effect transistor is formed is electrically separated from the second semiconductor layer on which the non-volatile memory cell transistor is formed, a semiconductor device can be provided in which the field effect transistor and the non-volatile memory cell transistor are surely separated electrically.

In the method of manufacturing a semiconductor device in accordance with the present invention, the separation electrode and the floating gate electrode are formed simultaneously. Then, field effect transistors separated by the separation electrode and a non-volatile memory cell transistor including a floating gate electrode are formed. Therefore, a semiconductor device including field effect transistors separated by the separation electrode and a non-volatile memory cell transistor can be manufactured through simple manufacturing steps.

In the present invention, the floating gate electrode is formed using the control gate electrode as a mask. Therefore, a semiconductor device in which the control gate electrode and the floating gate electrode have the same gate length can be manufactured through simple steps.

In the present invention, the second separation electrode for electrically separating the non-volatile memory cell transistors from each other is formed simultaneously with the first separation electrode and the floating gate electrode. Therefore, a semiconductor device including field effect transistors separated by the first separation electrode and the non-volatile memory cell transistors separated by the second separation electrode can be formed through simple manufacturing steps.

In the present invention, the impurity concentration of the second impurity region positioned below the floating gate is higher than the impurity concentration of the first impurity region positioned below the gate electrode. Therefore, the threshold value of the non-volatile memory cell transistor including the floating gate electrode is higher than that of the field effect transistor including a gate electrode. In other words, the threshold value of the field effect transistor is smaller than that of the non-volatile memory cell transistor. Further, the impurity concentration of the third impurity region positioned below the separation electrode is higher than the impurity concentration of the second impurity region positioned below the non-volatile memory cell transistor. Therefore, threshold value of the separation electrode is higher than that of the non-volatile memory cell transistor. Accordingly, a semiconductor device including field effect transistors capable of high speed operation and surely separated by the separation electrode and a non-volatile transistor can be manufactured.

In the present invention, the number of steps of manufacturing the semiconductor device can further be reduced.

In the present invention, the fourth impurity region below the separating oxide film serves as a channel stopper. Therefore, a semiconductor device which has separating oxide film with superior separating capability can be obtained. Further, since the fourth impurity region is formed simultaneously with the second and third impurity regions, the number of steps for manufacturing the semiconductor device is not increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate;
   a plurality of field effect transistors formed on said semiconductor substrate;
   a memory cell array portion comprising a non-volatile memory cell transistor formed on said semiconductor substrate; and
   a first separating portion including a first separation electrode formed insulated on said semiconductor substrate for electrically separating said plurality of field effect transistors from each other: wherein said non-volatile memory cell transistor includes a floating gate electrode formed insulated on said semiconductor substrate, and a control gate electrode formed insulated on said floating gate electrode; and said first separation electrode has approximately the same thickness as said floating gate electrode.

2. The semiconductor device according to claim 1, wherein said plurality of field effect transistors include a plurality of gate electrodes arranged spaced apart from each other and aligned along one direction, formed insulated on said semiconductor substrate, and a plurality of impurity regions formed in said semiconductor substrate between said plurality of gate electrodes, said plurality of gate electrodes formed insulated on said first separation electrode, and said first separation electrode extends adjacent to said impurity regions along a direction of arrangement of said plurality of gate electrodes.

3. the semiconductor device according to claim 1, wherein said plurality of field effect transistors include a gate electrode and a first sidewall insulating film formed on sidewalls of the gate electrode, said non-volatile memory cell transistor includes a second sidewall insulating film formed on sidewalls of said control gate electrode and said floating gate electrode, width of said second sidewall insulating film being smaller than that of said first sidewall insulating film.

4. The semiconductor device according to claim 1, wherein said control gate electrode and said floating gate electrode have the same gate length.

5. The semiconductor device according to claim 1, further comprising a plurality of said non-volatile memory cell transistors, and a second separating portion including a second separation electrode formed insulated on said semiconductor substrate for electrically separating said plurality of non-volatile memory cell transistors from each other, said second separation electrode having approximately the same thickness as said first separation electrode.

6. The semiconductor device according to claim 5, wherein said floating gate electrode has a ring shape.

7. The semiconductor device according to claim 1, further comprising:

a first impurity region having a first impurity concentration formed at a portion of said semiconductor substrate which opposes to said plurality of gate electrodes; a second impurity region having a second impurity concentration formed at a portion of said semiconductor substrate which opposes to said first separation electrode; and a third impurity region having a third impurity concentration formed at a portion of said semiconductor substrate opposing to said floating gate electrode; wherein said third impurity concentration is higher than said first impurity concentration and said second impurity concentration is not lower than said third impurity concentration.

8. The semiconductor device according to claim 7, further comprising a separation oxide film formed on said semiconductor substrate, a fourth impurity region having a fourth impurity concentration being formed below the separation oxide film, said second, third and fourth impurity concentration being the same.

9. The semiconductor device according to claim 1, wherein said floating gate electrode is formed on said semiconductor substrate with a first insulating film interposed; said field effect transistor includes a second insulating film and a gate electrode; said first separating portion includes a third insulating film; said gate electrode is formed on said semiconductor substrate with the second insulating film interposed; said first separation electrode is formed on said semiconductor substrate with the third insulating film interposed; and said first insulating film is thicker than said second insulating film and said third insulating film is not thinner than said first insulating film.

10. The semiconductor device according to claim 1, wherein said first separation electrode and a portion of said semiconductor substrate which opposes to the first separation electrode are of the same conductivity type, and said floating gate electrode and a portion of said semiconductor substrate which opposes to the floating gate are of opposite conductivity types.

11. The semiconductor device according to claim 1, wherein said non-volatile memory cell transistor includes first and second insulating films; said field effect transistor includes a gate electrode and a third insulating film formed on said first separation electrode; said floating gate electrode is formed on said semiconductor substrate with the first insulating film interposed, said control gate electrode is formed on said floating gate electrode with said second insulating film interposed; a portion of said gate electrode is formed on said separation electrode with said third insulating film interposed; said second insulating film is thicker than said first insulating film, and said third insulating film is thicker than said first insulating film.

12. The semiconductor device according to claim 1, further comprising first and second semiconductor layers formed insulated on said semiconductor substrate; wherein said field effect transistor is formed in said first semiconductor layer, said non-volatile memory cell transistor is formed in said second semiconductor layer, and said first and second semiconductor layers are electrically separated.

* * * * *

UNITED STATES PATENT AND TRADEMARK OFFICE
CERTIFICATE OF CORRECTION

PATENT NO.   : 5,861,650
DATED        : January 19, 1999
INVENTOR(S)  : Shigenobu Maeda et al.

It is certified that error appears in the above-identified patent and that said Letters Patent is hereby corrected as shown below:

<u>Title page,</u>
Item [30], Foreign Application Priority Data, change "Jul." to -- Feb. --.

Signed and Sealed this

Twenty-ninth Day of April, 2003

JAMES E. ROGAN
*Director of the United States Patent and Trademark Office*